United States Patent
Campbell et al.

(10) Patent No.: US 11,741,279 B2
(45) Date of Patent: Aug. 29, 2023

(54) TOFFOLI GATE DISTILLATION FROM TOFFOLI MAGIC STATES

(71) Applicant: Amazon Technologies, Inc., Seattle, WA (US)

(72) Inventors: Earl Campbell, Cambridge (GB); Christopher Chamberland, Pasadena, CA (US)

(73) Assignee: Amazon Technologies, Inc., Seattle, WA (US)

( * ) Notice: Subject to any disclaimer, the term of this patent is extended or adjusted under 35 U.S.C. 154(b) by 251 days.

(21) Appl. No.: 17/098,240

(22) Filed: Nov. 13, 2020

(65) Prior Publication Data

US 2022/0156441 A1    May 19, 2022

(51) Int. Cl.
    *G06F 30/33*    (2020.01)
    *H03K 19/195*    (2006.01)
    (Continued)

(52) U.S. Cl.
CPC ......... *G06F 30/33* (2020.01); *G01R 31/3177* (2013.01); *G06N 10/00* (2019.01); *H03K 19/195* (2013.01)

(58) Field of Classification Search
CPC .... G06F 30/33; G06F 30/3308; G06F 11/004; G06F 17/10; G06F 2117/02; G06N 10/00;
(Continued)

(56) References Cited

U.S. PATENT DOCUMENTS 9,512,545 B2    12/2016  Zhang et al.
10,133,984 B2 *  11/2018  Clarke .................. G06N 10/00
(Continued)

FOREIGN PATENT DOCUMENTS

WO    WO-2018024713 A1 *  2/2018  ............ G01G 3/165
WO    WO-2022103666 A1 *  5/2022  ......... G01R 31/3177
WO    WO-2022192568 A1 *  9/2022

OTHER PUBLICATIONS

Ding et al.; "Magic-State Functional Units: Mapping and Scheduling Multi-Level Distillation Circuits for Fault-Tolerant Quantum Architectures"; 2018 51st Annual IEEE/ACM International Symposium on Microarchitecture (MICRO); Conference Paper | Publisher: IEEE; Cited by: Papers (8) (Year: 2018).*

(Continued)

*Primary Examiner* — Suresh Memula
(74) *Attorney, Agent, or Firm* — Alexander A. Knapp; Kowert, Hood, Munyon, Rankin & Goetzel, P.C.

(57) ABSTRACT

A top-down distillation process for preparing low-error rate Toffoli gates utilizes Toffoli magic states as inputs to the distillation process. Multiple Toffoli magic states are used to distill a low-error rate Toffoli gate via one round of distillation. Lattice surgery operations are performed to distill the low-error rate Toffoli gate from the multiple Toffoli magic states. Each round of lattice surgery operations acts on a check qubit associated with the low error rate Toffoli gate being distilled. Errors introduced during the distillation (if non-trivial) will be manifest in the check qubit. Thus, the check qubit is measured subsequent to performing the lattice surgery operations to verify that the distilled Toffoli gate is very likely to be provide a correct result.

20 Claims, 36 Drawing Sheets

(51) Int. Cl.
*G01R 31/3177* (2006.01)
*G06N 10/00* (2022.01)

(58) Field of Classification Search
CPC ........ G06N 10/70; G06N 10/20; G06N 10/40; H03K 19/195; G01R 31/3177
USPC ......................................................... 716/136
See application file for complete search history.

(56) References Cited

U.S. PATENT DOCUMENTS

| | | | |
|---|---|---|---|
| 10,404,214 B2 | 9/2019 | Szocs et al. | |
| 10,540,603 B2* | 1/2020 | Naaman | G06N 10/00 |
| 10,972,133 B2* | 4/2021 | Chamberland | G06N 10/00 |
| 11,037,068 B2 | 6/2021 | Girvin et al. | |
| 11,307,242 B1* | 4/2022 | Zeng | G01R 31/2851 |
| 11,321,627 B1* | 5/2022 | Arriola | G06N 10/40 |
| 11,405,056 B2* | 8/2022 | Hastings | G06N 10/70 |
| 11,436,398 B2* | 9/2022 | Noh | G06F 30/3308 |
| 2014/0118024 A1* | 5/2014 | Eastin | G06N 10/00 977/933 |
| 2016/0116678 A1* | 4/2016 | Evans | H01S 5/0687 385/11 |
| 2018/0269906 A1* | 9/2018 | Haah | G06N 10/70 |
| 2019/0049495 A1 | 2/2019 | Ofek et al. | |
| 2019/0080254 A1* | 3/2019 | Haah | H04L 9/0858 |
| 2019/0214561 A1 | 7/2019 | Schrade et al. | |
| 2019/0385673 A1 | 12/2019 | Bosman et al. | |
| 2019/0392917 A1* | 12/2019 | Leipold | H01L 33/04 |
| 2020/0161446 A1 | 5/2020 | Anderson et al. | |
| 2020/0311593 A1* | 10/2020 | Gidney | H04B 10/70 |
| 2021/0042652 A1 | 2/2021 | Das et al. | |
| 2021/0216898 A1* | 7/2021 | Huffman | G06F 11/32 |
| 2021/0234086 A1 | 7/2021 | Lescanne et al. | |
| 2021/0279627 A1 | 9/2021 | Bauer et al. | |
| 2021/0295197 A1* | 9/2021 | Gidney | G11C 11/4063 |
| 2021/0350268 A1* | 11/2021 | Whittaker | H03B 15/00 |
| 2021/0351795 A1* | 11/2021 | Hastings | G06N 10/00 |
| 2022/0029625 A1* | 1/2022 | Gidney | G06N 10/00 |
| 2022/0156443 A1* | 5/2022 | Chamberland | G06F 30/3308 |
| 2022/0156444 A1* | 5/2022 | Noh | G06F 30/367 |
| 2022/0156621 A1* | 5/2022 | Arrangoiz Arriola | G06N 10/40 |
| 2022/0156622 A1* | 5/2022 | Putterman | G06N 10/00 |
| 2022/0164501 A1* | 5/2022 | Nosanow | G06N 10/20 |
| 2022/0178995 A1* | 6/2022 | Chamberland | H04B 10/70 |
| 2022/0180236 A1* | 6/2022 | Hann | H04B 10/00 |
| 2022/0231185 A1* | 7/2022 | Burchard | H01L 33/58 |
| 2022/0405626 A1* | 12/2022 | Naveh | G06N 10/00 |
| 2023/0044487 A1* | 2/2023 | Heo | G06N 10/60 |

OTHER PUBLICATIONS

Tannu et al.; "Taming the Instruction Bandwidth of Quantum Computers via Hardware-Managed Error Correction"; 2017 50th Annual IEEE/ACM International Symposium on Microarchitecture (MICRO); Conference Paper | Publisher: IEEE Cited by: Patents (3) (Year: 2017).*
Pechal et al., Superconducting circuit quantum computing with nanomechanical resonators as storage, 2018, Stanford University, All pages. (Year: 2018).*
International Search Report and Written Opinion dated Feb. 16, 2022 in International Application No. PCT/US2021/058293, Amazon Technologies, Inc., pp. 1-11.
W. Pfaff, C. Axline, L. Burkhart, et al., "Schrodinger's Catapult: Launching Multiphoton Quantum States from a Microwave Cavity Memory," Nature Physics 13, 882 (2017), arXiv preprint arXiv:1612.05238v1, pp. 1-18.
D. Gottesman, "An Introduction to Quantum Error Correction and Fault-Tolerant Quantum Computation," Proceedings of Symposia in Applied Mathematics 68, 13 (2010), arXiv preprint arXiv:0904.2557v1, pp. 1-46.

C. Chamberland and M. E. Beverland, "Flag Fault-Tolerant Error Correction with Arbitrary Distance Codes," Quantum 2, 53 (2018), arXiv preprint arXiv:1708.02246v3, pp. 1-29.
J. Edmonds, "Paths, Trees, and Flowers," Canadian Journal of mathematics 17, pp. 449-467, (1965).
N. Delfosse and N. H. Nickerson, "Almost-Linear Time Decoding Algorithm for Tological Codes," arXiv e-prints, arXiv:1709.06218 (2017), pp. 1-10.
E. T. Campbell and M. Howard, "A Unified Framework for Magic State Distillation and Multiquibit Gate-Synthesis with Reduced Resource Cost," Physical Review A 95, 022316 (2017), arXiv e-print arXiv:1606.01904v4, pp. 1-23.
P. Brooks and J. Preskill, "Fault-Tolerant Quantum Computation with Asymmetric Bacon-Shor Codes," Core, Physical Review A 87, 032310 (2013 American Physical Society), pp. 1-16.
J. T. Anderson, G. Duclos-Cianci, and D. Poulin, "Fault-Tolerant Convesion Between the Steane and Reed-Muller Quantum Codes," Physical Review Letters 113, 080501 (2014), arXiv e-print arXiv:1403.2734v1, pp. 1-6.
C. Vuillot, L. Lao, B. Criger, C. G. Almudever, K. Bertels, and B. M. Terhal, "Code Deformation and Lattice Surgery are Gauge Fixing," New Journal of Physics 21, 033028 (2019 IOP Publishing Ltd), pp. 1-21.
A. J. Landahi and C. Ryan-Anderson, "Quantum Computing by Color-Code Lattice Surgery," arXiv e-prints, arXiv:1407.5103 (2014), arXiv:1407.5103, pp. 1-13.
A. G. Fowler and C. Gidney, "Low Overhead Quantum Computation Using Lattice Surgery," arXiv:1808.06709 (2018), pp. 1-15.
D. Gottesman, Proceedings, "The Heisenberg Representation of Quantum Computers," XXII International Colloquium on Group Theoretical Methods in Physics, 32 (1999), arXiv e-print arXiv:quant-ph/9807006v1, pp. 1-20.
E. Dennis, A. Kitaev, A. Landahl, and J. Preskill, J. "Topological Quantum Memory," Core, Journal of Mathematical Physics, vol. 43, No. 9, pp. 4452-4505 (2002 American Institute of Physics).
A. A. Kovalev and L. P. Pryadko, "Fault-Tolerance of "Bad" Quantum Low-Density Parity Check Codes," arXiv preprint arXiv:1208.2317 (2012), pp. 1-5.
R. Raussendorf and J. Harrington, "Fault-Tolerant Quantum Computation with Threshold in Two Dimensions," Physical Review Letters 98, 190504 (2007 The American Physical Society), pp. 1-4.
D. S. Wang, A. G. Fowler, and L. C. L. Hollenberg, "Surface Code Quantum Computing with Error Rates over 1%," ReasearchGate, Phys. Rev. A 83, 020302 (2011), pp. 1-5.
A. G. Fowler, "Proof of Finite Surface Code Threshold for Matching," Phys. Rev. Letters 109, 180502 (2012), pp. 1-5.
C. Chamberland, A. Kubica, T. J. Yoder, and G. Zhu, "Triangular Color Codes on Trivalent Graphs with Flag Qubits," New Journal of Physics 22, 023019 (2020 IOP Publishing, Ltd), pp. 1-24.
P. W. Shor, "Fault-Tolerant Quantum Computation," in Proceedings of the 37th Annual Symposium on Foundations of Computer Science, FOCS '96 (IEEE Computer Society, USA, 1996) p. 56, arXiv e-print arXiv:quant-ph/9605011v2, pp. 1-11.
E. Dennis, "Toward Fault-Tolerant Quantum Computation without Concatenation," Phys. Rev. A 63, 052314 (2001), arXiv e-print arXiv:quant-ph/9905027v2, pp. 1-13.
C. Jones, "Multilevel Distillation of Magic States for Quantum Computing," Phys. Rev. A 87, 042305 (2013), arXiv e-print arXiv:1210.3388v2, pp. 1-10.
A. G. Fowler, "Optimal Complexity Correction of correlated Errors in the Surface Code," arXiv:1310.0863 (2013), pp. 1-6.
M. B. Hastings and J. Haah, "Distillation with Sublogarithmic Overhead," Physical review letters 120, 050504 (2018), arXiv e-print arXiv:1709.03543v2, pp. 1-2.
C. Jones, "Novel Constructions for the Fault-Tolerant Toffoli Gate," Phys. Rev. A. 87, 022328 (2013), arXiv e-print arXiv:1212.5069v1, pp. 1-5.
B. Eastin, "Distilling One-Qubit Magic States into Toffoli States," Phys. Rev. A. 87, 032321 (2013), arXiv e-print arXiv:1212.4872v2, pp. 1-8.
Chamberland, et al., "Building a fault-tolerant quantum computer using concatenated cat codes," arXiv:2012.04108v1 [quant-ph] Dec. 7, 2020, pp. 1-118.

(56) References Cited

OTHER PUBLICATIONS

U.S. Appl. No. 17/098,046, filed Nov. 13, 2020, Christopher Chamberland, et al.
U.S. Appl. No. 17/098,245, filed Nov. 13, 2020, Kyungjoo Noh, et al.
U.S. Appl. No. 17/098,248, filed Nov. 13, 2020, Harald Esko Jakob, et al.
U.S. Appl. No. 17/217,946, filed Mar. 30, 2021, Connor Hann, et al.
U.S. Appl. No. 17/098,232, filed Nov. 13, 2020, Patricio Arrangoiz Arriola, et al.
Sergey Bravyi, et al., "Quantum Codes on a Lattice with Boundary," ArXiv Preprint: arXiv:quant-ph/9811052, 1998 pp. 1-6.
J. O'Gorman and E. T. Campbell, "Quantum Computation with Realistic Magic State Factories," Physical Review A 95, 032338 (2017), arXiv:1605.07197, pp. 1-22.
M. Motta, E. Ye, J. R. McClean, Z. Li, A. J. Minnich, R. Babbush, and G. K.-L. Chan, "Low rank representations for quantum simulation of electronic structure," (2018), arXiv:1808.02625, pp. 1-8.
C. Gidney and M. Ekera, "How to factor 2048 bit RSA integers in 8 hours using 20 million noisy qubits" (2019), arXiv:1905.09749 [quant-ph], pp. 1-31.
E. Campbell, A. Khurana, and A. Montanaro, "Applying Quantum Algorithms to Constraint Satisfaction Problems," Quantum 3, 167 (2019), arXiv:1810.05582, pp. 1-30.
I. D. Kivlichan, C. Gidney, D. W. Berry, N. Wiebe, J. McClean, W. Sun, Z. Jiang, N. Rubin, A. Fowler, A. Aspuru-Guzik, and et al., "Improved Fault-Tolerant Quantum Simulation of Condensed-Phased Correlated Electrons via Trotterization," Quantum 4, 296 (2020), arXiv:1902.10673, pp. 1-45.
D. K. Tuckett, S. D. Bartlett, and S. T. Flammia, "Ultrahigh Error Threshold for Surface Codes with Biased Noise," Phys. Rev. Lett 120, 050505 (2018), arXiv:1708.08474, pp. 1-6.
D. K. Tuckett, A. S. Darmawan, C. T. Chubb, S. Bravyi, S. D. Bartlett, and S. T. Flammia, "Tailoring Surface Codes for Highly Biased Noise," Phys. Rev. X 9, 041031 (2019), arXiv:1812.08186, pp. 1-22.
D. K. Tuckett, S. D. Bartlett, S. T. Flammia, and B. J. Brown, "Fault-Tolerant Thresholds for the Surface Code in Excess of 5% Under Biased Noise," Phys. Rev. Lett. 124, 130501 (2020), arXiv:1907.02554, pp. 1-10.
J. P. Bonilla Ataides, D. K. Tuckett, S. D. Bartlett, S. T. Flammia, and B. J. Brown, "The XZZX surface code," (2020), arXiv:2009.07851 [quant-ph], pp. 1-16.
P. Aliferis and J. Preskill, "Fault-Tolerant Quantum Computation Against Biased Noise," Phys. Rev. A 78, 052331 (2008), arXiv:0710.1301, pp. 1-9.
S. Puri, L. St-Jean, J. A. Gross, A. Grimm, N. E. Frattini, P. S. Iyer, A. Krishna, S. Touzard, L. Jiang, A. Blais, and et al., "Bias-Preserving Gates with Stabilized CAT Qubits," Science Advances 6, eaay5901 (2020), arXiv:1905.00450, pp. 1-25.
J. Guillaud and M. Mirrahimi, "Repetition Cat Qubits for Fault-Tolerant Quantum Computation," Phys. Rev. X 9, 041053 (2019), arXiv:1904.09474, pp. 1-23.
J. Guillaud and M. Mirrahimi, "Error Rates and Resource Overheads of Repetition Cat Qubits," (2020), arXiv:2009.10756 [quant-ph], pp. 1-17.
M. Mirrahimi, Z. Leghtas, V. V. Albert, S. Touzard, R. J. Schoelkopf, L. Jiang, and M. H. Devoret, "Dynamically Protected Cat-Qubits: A New Paradigm for Universal Quantum Computation," New Journal of Physics 16, 045014 (2014), pp. 1-31.
S. Puri, S. Boutin, and A. Blais, "Engineering the Quantum States of Light in a Kerr-nonlinear Resonator by Two-Photon Driving," NPJ Quantum Inf. 3, 18 (2017), pp. 1-7.
J. Cohen, "Autonomous quantum error correction with superconducting qubits," Ph.D. thesis, Universite Paris sciences et lettres (2017), HAL archives-ouvertes.fr, pp. 1-164.
V. V. Albert, K. Noh, K. Duivenvoorden, D. J. Young, R. T. Brierley, P. Reinhold, C. Vuillot, L. Li, C. Shen, S. M. Girvin, B. M. Terhal, and L. Jiang, "Performance and Structure of Single-Mode Bosonic Codes," Phys. Rev. A 97, 032346 (2018), pp. 1-30.

A. Joshi, K. Noh, and Y. Y. Gao, "Quantum Information Processing with Bosonic Qubits in Circuit QED," arXiv e-prints, arXiv:2008.13471 (2020), arXiv:2008.13471 [quant-ph], pp. 1-26.
W. Cai, Y. Ma, W. Wang, C. L. Zou, and L. Sun, "Bosonic Quantum Error Correction Codes in Superconducting Quantum Circuits," arXiv e-prints, arXiv:2010.08699 (2020), arXiv:2010.08699 [quant-ph], pp. 1-23.
Z. Leghtas, S. Touzard, I. M. Pop, A. Kou, B. Vlastakis, A. Petrenko, K. M. Sliwa, A. Narla, S. Shankar, M. J. Hatridge, M. Reagor, L. Frunzio, R. J. Schoelkopf, M. Mirrahimi, and M. H. Devoret, "Confining the State of Light to a Quantum Manifold by Engineered Two-Photon Loss," Science 347, 853 (2015), 1412.4633, pp. 853-857.
S. Touzard, A. Grimm, Z. Leghtas, S. Mundhada, P. Reinhold, C. Axline, M. Reagor, K. Chou, J. Blumo, K. Sliwa, and et al., "Coherent Oscillations inside a Quantum Manifold Stabilized by Dissipation," Physical Review X 8, 021005 (2018), arXiv:1705.02401, pp. 1-7.
S. Puri, A. Grimm, P. Campagne-Ibarcq, A. Eickbusch, K. Noh, G. Roberts, L. Jiang, M. Mirrahimi, M. H. Devoret, and S. M. Girvin, Stabilized Cat in a Driven Nonlinear Cavity: A Fault-Tolerant Error Syndrome Detector, Phys. Rev. X 9, 041009 (2019), pp. 1-29.
A. Grimm, N. E. Frattini, S. Puri, S. O. Mundhada, S. Touzard, M. Mirrahimi, S. M. Girvin, S. Shankar, and M. H. Devoret, "Stabilization and Operation of a Kerr-cat qubit," Nature 584, 205 (2020), arXiv:1907.12131, pp. 1-7.
R. Lescanne, M. Villiers, T. Peronnin, A. Sarlette, M. Delbecq, B. Huard, T. Kontos, M. Mirrahimi, and Z. Leghtas, "Exponential Suppression of bit-flips in a Qubit Encoded in an Oscillator," Nature Physics 16, 509 (2020), pp. 1-18.
F. Mac Williams and N. Sloane, "The Theory of Error-Correcting Codes," Book, (North Holland, 1988), pp. 1-770.
G. S. MacCabe, H. Ren, J. Luo, J. D. Cohen, H. Zhou, A. Sipahigil, M. Mirhosseini, and O. Painter, "Phononic Bandgap Nano-acoustic Cavity with Ultralong Phonon Lifetime," Science 370, 840 (2020), pp. 1-43.
P. Arrangoiz-Arriola, E. A. Wollack, Z. Wang, M. Pechal, W. Jiang, T. P. McKenna, J. D. Witmer, R. Van Laer, and A. H. Safavi-Naeini, "Resolving the energy levels of nanomechanical oscillator," Nature vol. 571, 537 (2019), pp. 1-11.
E. A. Wollack, A. Y. Cleland, P. Arrangoiz-Arriola, T. P. McKenna, R. G. Gruenke, R. N. Patel, W. Jiang, C. J. Sarabalis, and A. H. Safavi-Naeini, "Loss channels affecting lithium niobate phononic crystal resonators at cryogenic temperature," (2020), arXiv:2010.01025 [physics.appph], pp. 1-15.
S. Bravyi and J. Haah, "Magic-state distillation with low overhead," Core, Phys. Rev. A 86, 052329 (2012 American Physical Society), pp. 1-10.
A. M. Meier, B. Eastin, and E. Knill, "Magic-State Distillation with the Four-Qubit Code," Quant. Inf. and Comp. 13, 195 (2013), pp. 1-10.
E. T. Campbell and M. Howard, "Magic state parity-checker with pre-distilled components," Quantum 2, 56 (2018), pp. 1-19.
S. Bravyi and A. Kitaev, "Universal Quantum Computation with Ideal Clifford Gates and Noisy Ancillas," Core, Phys. Rev. A 71, 022316 (2005 American Physical Society), pp. 1-14.
J. P. Paz and W. H. Zurek, "Continuous Error Correction," Proceedings of the Royal Society of London. Series A: Mathematical, Physical and Engineering Sciences 454, pp. 355-364 (1998).
C. Ahn, A. C. Doherty, and A. J. Landahl, "Continuous Quantum Error Correction via Quantum Feedback Control," Phys. Rev. A 65, 042301 (2002), pp. 1-10.
M. Sarovar and G. J. Milburn, "Continuos Quantum Error Correction by Cooling," Phys. Rev. A 72, 012306 (2005), pp. 1-7.
P. T. Cochrane, G. J. Milburn, and W. J. Munro, "Macroscopically Distinct Quantum Superposition States as a Bosonic Code for Amplitude Damping," Phys. Rev. A 59, 2631 (1999), pp. 1-5.
H. Jeong and M. S. Kim, Phys. "Efficient Quantum Computation Using Coherent States," Rev. A 65, 042305 (2002 The American Physical Society), pp. 1-6.
F. Reiter and A. S. Srensen, "Effective Operator Formalism for Open Quantum Systems," Phys. Rev. A 85, 032111 (2012), pp. 1-11.

(56) References Cited

OTHER PUBLICATIONS

N. E. Frattini, U. Vool, S. Shankar, A. Narla, K. M. Sliwa, and M. H. Devoret, "3-Wave Mixing Josephson Dipole Element," Applied Physics Letters 110, 222603 (2017), https://doi.org/10.1063/1.4984142, pp. 1-5.

M. Mirhosseini, A. Sipahigil, M. Kalaee, and O. Painter, "Quantum transduction of optical photons from a superconducting qubit," (2020), arXiv:2004.04838 [quant-ph], pp. 1-17.

R. Lescanne, L. Verney, Q. Ficheux, M. H. Devoret, B. Huard, M. Mirrahimi, and Z. Leghtas, "Escape of a Driven Quantum Josephson Circuit into Unconfined States," Phys. Rev. Applied 11, 014030 (2019), pp. 1-12.

D. Sank, Z. Chen, M. Khezri, J. Kelly, R. Barends, B. Campbell, Y. Chen, B. Chiara, A. Dunsworth, A. Fowler, E. Jerey, E. Lucero, A. Megrant, J. Mutus, M. Neeley, C. Neill, P. J. J. O'Malley, C. Quintana, P. Roushan, A. Vainsencher, T. White, J. Wenner, A. N. Korotkov, and J. M. Martinis, "Measurement-Induced State Transitions in a Superconducting Qubit: Beyond the Rotating Wave Approximation," Phys. Rev. Lett. 117, 190503 (2016), pp. 1-10.

Y. Zhang, B. J. Lester, Y. Y. Gao, L. Jiang, R. J. Schoelkopf, and S. M. Girvin, "Engineering Bilinear Mode Coupling in Circuit QED: Theory and Experiment," Phys. Rev. A 99, 012314 (2019 American Physical Society), pp. 1-39.

L. Verney, R. Lescanne, M. H. Devoret, Z. Leghtas, and M. Mirrahimi, "Structural Instability of Driven Josephson Circuits Prevented by an Inductive Shunt," Phys. Rev. Applied 11, 024003 (2019 American Physical Society), pp. 1-12.

D. F. V. James and J. Jerke, Can. J. "Effective Hamiltonian Theory and Its Applications in Quantum Information," Phys 85, 625 (2007), pp. 1-5.

O. Gamel and D. F. V. James, "Time Averaged Quantum Dynamics and The Validity of the Effective Hamiltonian Model," Phys. Rev. A 82, 052106 (2010), pp. 1-8.

R. K. Naik, N. Leung, S. Chakram, P. Groszkowski, Y. Lu, N. Earnest, D. C. McKay, J. Koch, and D. I. Schuster, "Random Access Quantum Information Processors Using Multimode Circuit Quantum Electrodynamics," Nature Communications 8, 1904 (2017), pp. 1-7.

M. Pechal, P. Arrangoiz-Arriola, and A. H. Safavi-Naeini, "Superconducting Circuit Quantum Computing with Nanomechanical Resonators as Storage," Quantum Science and Technology. 4, 015006 (2018), pp. 1-10.

C. T. Hann, C.-L. Zou, Y. Zhang, Y. Chu, R. J. Schoelkopf, S. M. Girvin, and L. Jiang, "Hardware-Efficient Quantum Random Access Memory with Hybrid Quantum Acoustic Systems," Phys. Rev. Letters 123, 250501 (2019 American Physical Society), pp. 1-7.

P. Mundada, G. Zhang, T. Hazard, and A. Houck, "Suppression of Qubit Crosstalk ina Tunable Coupling Superconducting Circuit," Phys Rev Appl 12, 10.1103/PhysRevApplied.12.054023, pp. 1-11, (2019).

Y. Chen, C. Neill, P. Roushan, N. Leung, M. Fang, R. Barends, J. Kelly, B. Campbell, Z. Chen, B. Chiaro, A. Dunsworth, E. Je rey, A. Megrant, J. Y. Mutus, P. J. J. O'Malley, C. M. Quintana, D. Sank, A. Vainsencher, J. Wenner, T. C. White, M. R. Geller, A. N. Cleland, and J. M. Martinis, "Qubit Architecture with High Coherence and Fast Tunable Coupling," Phys. Rev. Letters 113, 220502 (2014 American Physical Society), pp. 1-5.

L. Sun, A. Petrenko, Z. Leghtas, B. Vlastakis, G. Kirchmair, K. Sliwa, A. Narla, M. Hatridge, S. Shankar, J. Blumo, et al., "Tracking Photon Jumps ith Repeated Quantum Non-Demolition Parity Measurements," Nature 511, 444 (2014), pp. 1-20.

C. T. Hann, S. S. Elder, C. S. Wang, K. Chou, R. J. Schoelkopf, and L. Jiang, "Robust Readout of Bosonic Qubits in the Dispersive Coupling Regime," Phys. Rev. A 98, 022305 (2018 American Physical Society), pp. 1-13.

S. S. Elder, C. S. Wang, P. Reinhold, C. T. Hann, K. S. Chou, B. J. Lester, S. Rosenblum, L. Frunzio, L. Jiang, and R. J. Schoelkopf, "High-Fidelity Measurement of Qubits Encoded in Multilevel Superconducting Circuits," Phys. Rev. X 10, 011001 (2020 American Physical Society), pp. 1-10.

N. Didier, J. Bourassa, and A. Blais, Fast Quantum Nondemolition Readout by Parametric Modulation of Longitudinal Qubit-Oscillator Interaction, Phys. Rev. Letters, 115, 203601 (2015 American Physical Society), pp. 1-5.

A. A. Clerk, M. H. Devoret, S. M. Girvin, F. Marquardt, and R. J. Schoelkopf, "Introduction to Quantum Noise, Measurement and Amplification," Rev. Mod. Phys. 82, 1155 (2010), pp. 1-96.

P. Krantz, M. Kjaergaard, F. Yan, T. P. Orlando, S. Gustavsson, and W. D. Oliver, "A Quantum Engineer's Guide to Superconduction Qubits," Applied Physics Reviews 6, 021318 (2019), pp. 1-58.

Y. Tomita and K. M. Svore, "Low-Distance Surface Codes under Realistic Quantum Noise," Physical Review A 90, 062320 (2014), arXiv preprint: arXiv:1404.3747v1, pp. 1-14.

D. P. DiVincenzo and P. Aliferis, Effective Fault-Tolerant Quantum Computation with Slow Measurements, Core, Phys. Rev. Letters 98, 020501 (2007), pp. 1-10.

C. Chamberland, P. Iyer, and D. Poulin, "Fault-tolerant Quantum Computing int he Pauli or Clifford Frame with Slow Error Diagnostics," Quantum 2, 43 (2018), pp. 1-11.

J. Kelly, R. Barends, A. G. Fowler, A. Megrant, E. Jeffrey, T. C. White, D. Sank, J. Y. Mutus, B. Campbell, Y. Chen, et al., "State Preservation by Repetitive Error Detection in a Superconducting Quantum Circuit," Nature 519, 66 (2015), pp. 1-30.

C. Horsman, A. G. Fowler, S. Devitt, and R. V. Meter, "Surface Code Quantum Computing by Lattice Surgery," IOP Institute of Physics, New Journal of Physics 14, 123011 (2012), pp. 1-28.

A. J. Landahl and C. Ryan-Anderson, "Quantum Computing by Color-Code Lattice Surgery," arXiv preprint arXiv:1407.5103 (2014), pp. 1-13.

D. Litinski and F. v. Oppen, "Lattice Surgery with a Twist: Simplifying Clifford Gates of Surface Codes," Quantum 2, 62 (2018), arXiv Preprint arXiv:1709.02318v2, pp. 1-16.

D. Litinski, "A Game of Surface Codes: Large-Scale Quantum Computing with Lattice Surgery," Quantum 3, 128 (2019), arXiv Preprint arXiv:1808.02892v3, pp. 1-37.

A. Kubica, B. Yoshida, and F. Pastawski, "Unfolding the Color Code," IOP Institute of Physics, New Journal of Physics 17, 083026 (2015), pp. 1-27.

S. Bravyi, G. Smith, and J. A. Smolin, "Trading Classical and Quantum Computational Resources," Physical Review X 6, 021043 (2016), arXiv Preprint arXiv:1506.01396v1, pp. 1-14.

A. Paler and A. G. Fowler, "OpenSurgery for Topical Assemblies," arXiv preprint arXiv:1906.07994 (2019), pp. 1-4.

A. G. Fowler, M. Mariantoni, J. M. Martinis, and A. N. Cleland, "Surface Codes: Towrads Practical Large-Scale Quantum Computation," Phys. Rev. A 86, 032324 (2012 American Physical Society), pp. 1-48.

A. G. Fowler, "Time-Optimal Quantum Computation," arXiv preprint arXiv:1210.4626 (2012), pp. 1-5.

C. Chamberland and A. W. Cross, "Fault-Tolerant Magic State Preparation with Flag Qubits," Quantum 3, 143 (2019), arXiv preprint arXiv:1811.00566v2, pp. 1-26.

C. Chamberland and K. Noh, "Very Low Overhead Fault-Tolerant Magic State Preparation Using Redundant Ancilla Encoding and Flag Qubits," NPJ Quantum Information 6, 91 (2020), arXiv preprint arXiv:2003.03049v1, pp. 1-27.

J. Haah, M. B. Hastings, D. Poulin, and D. Wecker, Magic State Distillation with Low Space Overhead and Optimal Asymptotic Input Count, Quantum 1, 31 (2017), arXiv preprint arXiv:1703.07847v3), pp. 1-42.

A. Paetznick and B. W. Reichardt, "Universal Fault-Tolerant Quantum Computation with only Transversal Gates and Error Correction," Physical Review Letters 111, 090505 (2013), arXiv preprint arXiv:1304.3709v2, pp. 1-5.

M. Vasmer and D. E. Browne, "Three-Dimensional Surface Codes: Transversal Gates and Fault-Tolerant Architectures," Physical Review A 100, 012312 (2019 American Physical Society), arXiv preprint arXiv:1801.04255, 2018, pp. 1-20.

J. Haah and M. B. Hastings, "Codes and Protocols for Distilling T, Controlled-S, and Toffoli Gates," Quantum 2, 71 (2018), arXiv preprint arXiv:1709.02832v3, pp. 1-29.

(56) References Cited

OTHER PUBLICATIONS

D. Litinski, "Magic State Distillation: Not as Costly as You Think," Quantum 3, 205 (2019), arXiv preprint arXiv:1905.06903v3, pp. 1-22.
E. T. Campbell and M. Howard, "Unifying Gate-Synthesis and Magic State Distillation," Physical review letters 118, 060501 (2017), arXiv preprint arXiv:1606.0190v2, pp. 1-5.
N. Wiebe and C. Granade, "Efficient Bayesian Phase Estimation," Phys. Rev. Letters. 117, 010503 (2016), arXiv preprint arXiv:1508.00869v1, pp. 1-12.
C. Gidney, "Halving the Cost of Quantum Addition," Quantum 2, 74 (2018), arXiv preprint arXiv:1709.06648v3, pp. 1-6.
C. Gidney and A. G. Fowler, "Efficient Magic State Factories with Catalyzed |CCZ>-2|T> Transformation," Quantum 3, 135 (2019), arXiv preprint arXiv:1812.01238v3, pp. 1-24.
S. Bravyi, D. Browne, P. Calpin, E. Campbell, D. Gosset, and M. Howard, "Simulation of Quantum Circuits by Low-Rank Stabilizer Decompositions," Quantum 3, 181 (2019), arXiv preprint arXiv:1808.00128v2, pp. 1-48.
B.-X. Zheng, C.-M. Chung, P. Corboz, G. Ehlers, M.-P. Qin, R. M. Noack, H. Shi, S. R. White, S. Zhang, and G. K.-L. Chan, "Strip Order in the Underdoped Region of the Two-Dimensional Hubbard Model," Science 358, 1155 (2017), arXiv preprint arXiv:1701.00054v2, pp. 1-78.
M. Li, D. Miller, M. Newman, Y. Wu, and K. R. Brown, "2D Compass Codes," Phys. Rev. X 9, 021041 (2019 American Physical Society), pp. 1-11.
C. Chamberland, G. Zhu, T. J. Yoder, J. B. Hertzberg, and A. W. Cross, "Topological and Subsystem Codes on Low-Degree Graphs with Flag Quibits," Phys. Rev. X 10, 011022 (2020), arXiv preprint arXiv:1907.09528v2, pp. 1-21.
D. M. Debroy, M. Li, S. Huang, and K. R. Brown, "Logical Performance of 9 Quibit Compass COdes in Ion Traps with Crosstalk Errors," Quantum Science and Technology 5, 034002 (2020), arXiv preprint arXiv:1910.08495v2, pp. 1-12.
S. Huang and K. R. Brown, "Fault-Tolerant Compass Codes," Phys. Rev. A 101, 042312 (2020 American Physical Society), pp. 1-6.
P. Aliferis, D. Gottesman, and J. Preskill, "Quantum Accuracy Threshold for Concatenated Distance-3 Codes," Quantum Info. Comput 6, 97 (2006), arXiv preprint arXiv:quant-ph/0504218v2, pp. 1-58.

S. E. Nigg, H. Paik, B. Vlastakis, G. Kirchmair, S. Shankar, L. Frunzio, M. H. Devoret, R. J. Schoelkopf, and S. M. Girvin, "Black-Box Superconducting Circuit Quantization," Phys. Rev. Letters 108, 240502 (2012 American Physical Society), pp. 1-5.
M. Pechal and A. H. Safavi-Naeini, "Millimeter-wave Interconnects for Microwave-Frequency Quantum Machines," Phys. Rev. A 96, 042305 (2017), arXiv preprint arXiv:1706.05368v1, pp. 1-14.
J. M. Kreikebaum, K. P. O'Brien, A. Morvan, and I. Siddiqi, "Improving Wafer-Scale Josephson Junction Resistance Variation in Superconducting Quantum Coherent Circuits," Superconductor Science and Technology 33, 06LT02 (2020), IOP Publishing, pp. 1-7.
V. S. Ferreira, J. Banker, A. Sipahigil, M. H. Matheny, A. J. Keller, E. Kim, M. Mirhosseini, and O. Painter, Collapse and Revival of an Artificial Atom Coupled to a Structured Photonic Reservoir (2020), arXiv:2001.03240 [quant-ph], pp. 1-19.
R. Azouit, A. Sarlette, and P. Rouchon, Adiabatic elimination for open quantum systems with effective Lindblad master equations (2016), arXiv:1603.04630 [quant-ph], pp. 1-9.
R. Azouit, F. Chittaro, A. Sariette, and P. Rouchon, "Towards Generic Adiabatic Elimination for Bipartite Open Quantum Systems," Quantum Science Technology 2, 044011 (2017 IOP Publishing Ltd.), pp. 1-16.
E. A. Sete, J. M. Martinis, and A. N. Korotkov, "Quantum Theory of a Bandpass Purcell Filter for Qubit Readout," Phys. Rev. A 92, 012325 (2015 American Physical Society), pp. 1-13.
D. F. James and J. Jerke, "Effective Hamiltonian Theory and Its Applications in Quantum Information," Canadian Journal of Physics 85, 625 (2007), https://doi.org/10.1139/p07-060, pp. 1-5.
J. Heinsoo, C. K. Andersen, A. Remm, S. Krinner, T. Walter, Y. Salathe, S. Gasparinetti, J.-C. Besse, A. Potocnik, A. Wallra, and C. Eichler, "Rapid High-Fidelity Multiplexed Readout of Superconducting Qubits," Phys. Rev. Applied 10, 034040 (2018), arXiv prepint: arXiv:1801.07904v1, pp. 1-13.
E. Jeffrey, D. Sank, J. Y. Mutus, T. C. White, J. Kelly, R. Barends, Y. Chen, Z. Chen, B. Chiaro, A. Dunsworth, A. Megrant, P. J. J. O'Malley, C. Neill, P. Roushan, A. Vainsencher, J. Wenner, A. N. Cleland, and J. M. Martinis, "Fast Accurate State Measurement with Superconducting Qubits," Phys. Rev. Letters 112, 190504 (2014 American Physical Society), pp. 1-5.

\* cited by examiner

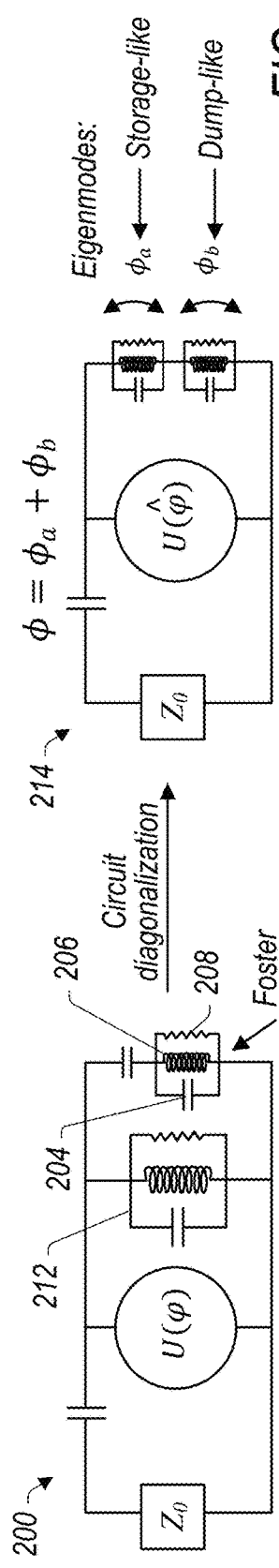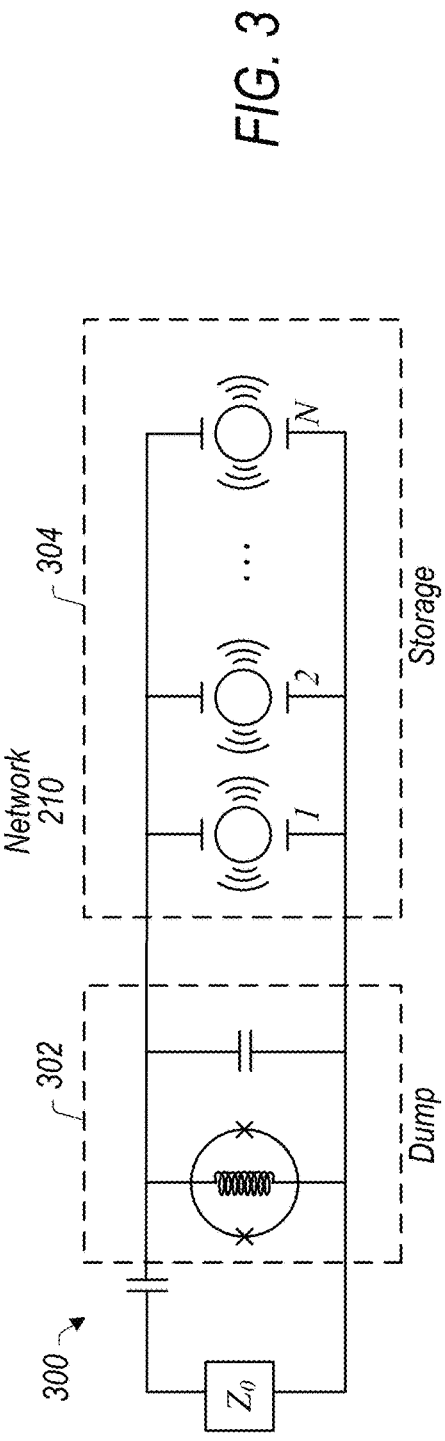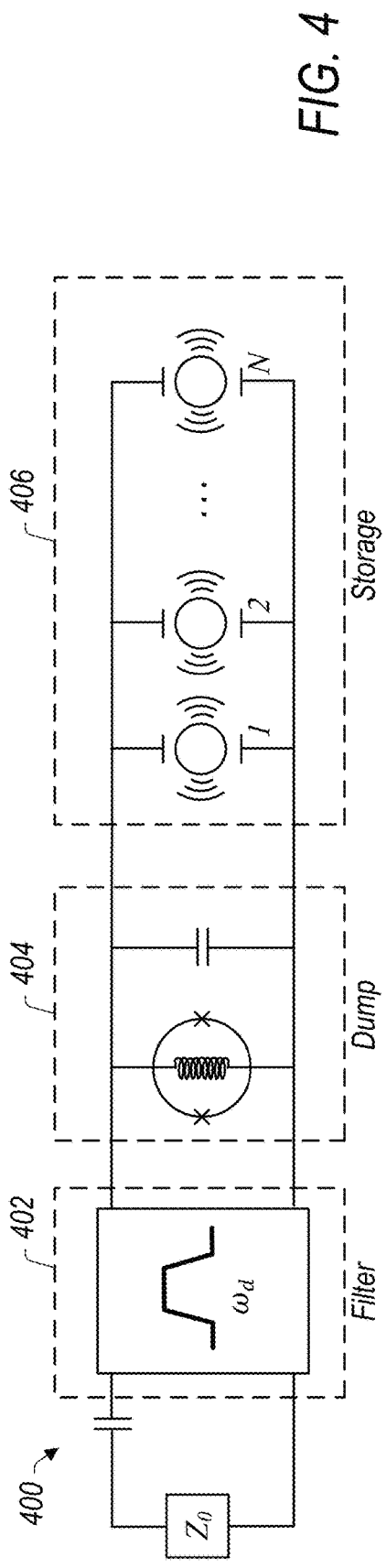

Circuit for preparing the state $|\psi_1\rangle$

Perform multi-qubit Pauli operator measurements during lattice surgery used to distill a low-error rate logical Toffoli gate from noisy Toffoli magic states/ Toffoli gates, wherein for each $J_k$ with k= 1, 2, 3, ...the following steps are performed
3002

For each k= 1, 2, 3, ... measure $Z_k \otimes Z[J_k]$, where $Z_k$ denotes Pauli Z acting on the $k^{th}$ qubit of the magic state and $Z[J_k]$ is a string of Pauli operators acting on the algorithmic qubits indexed by the binary vector $J_k$
3004

For each k= 1, 2, 3, ... measure X on the $k^{th}$ qubit of the magic state
3006

For each "-1" outcome measured in step 3006, update the Clifford correction frame by $Z[J_k]$
3008

Using the measurement outcome from step 3004, update the Clifford correction frame by the correction given by:

$(J_1x+m_1)(J_2x+m_2)(J_3x+m_3)=$ $(J_1x)(J_2x)(J_3x)$ $+[(J_1x)(J_2x)m_3+(J_1x)(J_3x)m_2+(J_2x)(J_3x)m_1]$ $+[(J_1x)m_2m_3+(J_2x)m_1m_3+(J_3x)m_1m_2]$ $+m_1m_2m_3$

3010

Measure the last m qubits in the X basis (e.g. check qubits) and accept if +1 outcome is measured (e.g. no errors or acceptable level of errors)
3012

FIG. 30

TOFFOLI GATE DISTILLATION FROM TOFFOLI MAGIC STATES

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects like photons, molecules, atoms, and electrons.

A quantum computer is a device that utilizes quantum mechanics to allow one to write, store, process and read out information encoded in quantum states, e.g. the states of quantum objects. A quantum object is a physical object that behaves according to the laws of quantum physics. The state of a physical object is a description of the object at a given time.

In quantum mechanics, the state of a two-level quantum system, or simply, a qubit, is a list of two complex numbers whose squares sum up to one. Each of the two numbers is called an amplitude, or quasi-probability. The square of an amplitude gives a potentially negative probability. Hence, each of the two numbers correspond to the square root that event zero and event one will happen, respectively. A fundamental and counterintuitive difference between a probabilistic bit (e.g. a traditional zero or one bit) and the qubit is that a probabilistic bit represents a lack of information about a two-level classical system, while a qubit contains maximal information about a two-level quantum system.

Quantum computers are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

A quantum algorithm is a reversible transformation acting on qubits in a desired and controlled way, followed by a measurement on one or multiple qubits. For example, if a system has two qubits, a transformation may modify four numbers; with three qubits this becomes eight numbers, and so on. As such, a quantum algorithm acts on a list of numbers exponentially large as dictated by the number of qubits. To implement a transform, the transform may be decomposed into small operations acting on a single qubit, or a set of qubits, as an example. Such small operations may be called quantum gates and the arrangement of the gates to implement a transformation may form a quantum circuit.

There are different types of qubits that may be used in quantum computers, each having different advantages and disadvantages. For example, some quantum computers may include qubits built from superconductors, trapped ions, semiconductors, photonics, etc. Each may experience different levels of interference, errors and decoherence. Also, some may be more useful for generating particular types of quantum circuits or quantum algorithms, while others may be more useful for generating other types of quantum circuits or quantum algorithms. Also, costs, run-times, error rates, error rates, availability, etc. may vary across quantum computing technologies.

For some types of quantum computations, such as fault tolerant computation of large scale quantum algorithms, overhead costs for performing such quantum computations may be high. For example for types of quantum gates that are not naturally fault tolerant, the quantum gates may be encoded in error correcting code. However this may add to the overhead number of qubits required to implement the large scale quantum algorithms. Also, performing successive quantum gates, measurement of quantum circuits, etc. may introduce probabilities of errors in the quantum circuits and/or measured results of the quantum circuits.

BRIEF DESCRIPTION OF THE DRAWINGS

FIG. 2 illustrates a Foster network representing a one dimensional phononic-crystal-defect resonator (PCDR), according to some embodiments.

FIG. 3 illustrates a system comprising a plurality of nano-mechanical linear resonators and an asymmetrically-threaded superconducting quantum interference device (ATS) that is configured to provide multi-mode stabilization to hybrid acoustic-electrical qubits implemented via the plurality of nano-mechanical linear resonators, according to some embodiments.

FIG. 4 illustrates a system comprising a plurality of nano-mechanical linear resonators and an asymmetrically-threaded superconducting quantum interference device (ATS) that is configured to provide multi-mode stabilization to hybrid acoustic-electrical qubits implemented via the plurality of nano-mechanical linear resonators, wherein a microwave filter suppresses correlated decay processes, according to some embodiments.

FIG. 30 illustrates an example method of performing lattice surgery to distill a low-error rate logical Toffoli gate from a plurality of noisy Toffoli magic states, according to some embodiments.

Figure 1A:
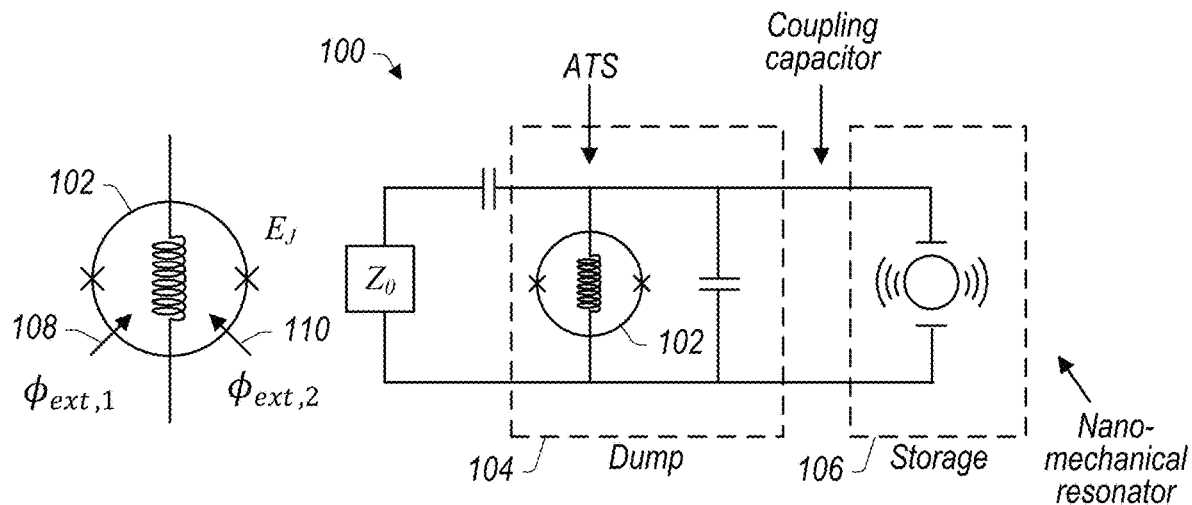
FIG. 1A illustrates a system comprising a nano-mechanical linear resonator and an asymmetrically-threaded superconducting quantum interference device (ATS) that is configured to implement hybrid acoustic-electrical qubits, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

The present disclosure relates to methods and apparatus for implementing a universal gate set for quantum algorithms that are fault-tolerant and that efficiently use resources.

In many circumstances, the overhead cost of performing universal fault-tolerant quantum computation for quantum algorithms may be high. To perform such fault-tolerant quantum computations, magic state distillation is often used. For example, magic state distillation may be used for simulating non-Clifford gates in a fault tolerant way. However, since magic state distillation circuits are not fault-tolerant, the Clifford operations must be encoded in a large distance code in order to have comparable failure rates with the magic states being distilled.

In order to perform quantum computations, universal fault-tolerant quantum computers may be required to be built with the capability of implementing all gates from a universal gate set with low logical error rates. Further, the overhead cost for achieving such low error rates may need to be low. Transversal gates are a natural way to implement such fault-tolerant gates. However, as is known from the Eastin-Knill theorem, given any stabilizer code, there will always be at least one gate in a universal gate set that cannot be implemented using transversal operations at the logical level.

In order to deal with this issue, several fault-tolerant methods for implementing gates in a universal gate set have been explored. However, magic state distillation remains a leading candidate in the implementation of a universal fault-tolerant quantum computer. However, the costs of performing magic state distillation remains high. One of the reasons for the high costs of magic state distillation is that the Clifford circuits used to distill the magic states are often not fault-tolerant. Consequently, the Clifford gates are encoded in some error correcting code (often the surface code) to ensure that these gates have negligible error rates compared to the magic states being injected.

In some embodiments, efficiently implementing a universal gate set may involve multiple layers of a quantum computer/quantum algorithm. For example at a lowest layer, building blocks of a quantum computer may include nano-mechanical resonators that are controlled using an asymmetrically-threaded superconducting quantum interference device (asymmetrically-threaded SQUID or ATS). The nano-mechanical resonators may be configured to resonate at one or more frequencies and may be coupled to the ATS, wherein the ATS controls the phononic modes. Also the ATS may be coupled to a bandpass filter and then an open transmission line that enables photons from the ATS to be adsorbed by the environment. At a next level, error correction may be implemented for the quantum computer comprising nano-mechanical resonators and an ATS. For example error corrected codes may be built that utilize the ATS and phononic modes of the nano-mechanical resonators to detect and/or correct errors. At yet another level, gates may be implemented for the quantum computer using the error corrected codes as inputs or outputs to the gates. Also, qubits of the gates may be error corrected. At yet a higher level logical gates may be built that utilize one or more of the physical gates. Note that while several of the protocols described herein, such as the STOP algorithm, bottom-up approach to preparing Toffoli gates, the top-down distillation of Toffoli gates, measurement techniques, and/or shifted Fock basis simulations are described in terms of a system that utilizes nano-mechanical resonators that implement hybrid acoustic-electrical qubits, in some embodiments other hardware types may be used, such as those that implement electromagnetic qubits.

Asymmetrically Threaded Superconducting Quantum Interference Device (ATS)-Phononic Hybrid System In some embodiments, a circuit for use in a quantum computer may comprise nano-mechanical linear resonators and an asymmetrically threaded superconducting quantum interference device (SQUID, ATS). The nano-mechanical resonators and ATS may implement qubits that are hybrid acoustic-electrical qubits, for example as opposed to electromagnetic qubits. In some embodiments, both the nano-mechanical resonators and ATS may be situated on a same component and may provide for easily extending a system to include additional components with additional nano-mechanical resonators that implement additional hybrid acoustic-electrical qubits. This may also enable scaling of a number of qubits needed for a quantum computer by including more or fewer components. Such an approach may allow for simpler extension and scaling than a system wherein components that implement qubits are integrated into a single chip, and newly designed chips are required to extend or scale the system to have more or fewer qubits. As used herein, the terms "mechanical", "acoustic", "phononic", etc. may be used to describe mechanical circuits as opposed to electromagnetic circuits.

In some embodiments, more phononic resonators (e.g. nano-mechanical resonators) may be connected to a same control circuit, such as an ATS, than is possible for electromagnetic resonators. This is due, at least in part, to the smaller size of the phononic resonators as compared to electromagnetic resonators. However, in such systems cross-talk between the phononic resonators coupled to the same control circuit must be addressed in order to avoid errors. Multiplexed control of phononic resonators using a common control circuit, such as an ATS, is further discussed in detail below.

In some embodiments, a structure of a chip comprising phononic resonators may take the form of a planar circuit with metal components that form superconducting circuits, such as the ATS. The ATS may be physically connected via wire leads to very small (e.g. micron-sized or nano-sized) suspended mechanical devices, such a linear nano-mechanical resonator. The suspended mechanical devices may be located on a same chip with the ATS circuit or may by located on a separate chip that has been heterogeneously integrated via a flip chip, or similar component, with a bottom chip comprising the ATS and/or additional suspended mechanical devices, e.g. other mechanical resonators.

In some embodiments, electrical connections to the ATS may be laid on top of a piezoelectric material that has been etched into a pattern to form the nano-mechanical resonators. In some embodiments, different variables, such as piezoelectric coefficient, density, etc. may affect how strongly coupled the ATS is to the mechanical resonators. This coupling may be expressed in terms of a phonon coupling rate in the Hamiltonian for the system.

When coupling a nano-structure, such as a nano-mechanical resonator, to an electrical circuit, very small capacitors are required since the nano-structure components, e.g. nano-mechanical resonators, are also very small. Typically in an electrical circuit, such as an ATS circuit, there are other capacitances. Since the capacitor for the nano-structure is very small, these other capacitances in the circuit may lower the signal voltage and thus dilute a signal directed to one of the nano-components, such as a nano-mechanical resonator. However, to deal with this issue, a high-impedance inductor may be coupled in the control circuit between the ATS and the nano-mechanical resonator. The high-impedance inductor may have a very low parasitic capacitance, thus electrical fields directed at the nano-mechanical resonators may act on the nano-mechanical resonators with only minimal dilution due to capacitance of the inductor (e.g. parasitic capacitance). Also, the high impedance inductor may suppress loss mechanisms.

In some embodiments, the non-linear coupling of the nano-mechanical resonators may be given by $g_2 \hat{a}_2 \hat{b}^2 \hat{b}^\dagger$+h.c., where $g_2$ is a coupling rate between a storage mode (a) and a dump mode (b). In some embodiments, the non-linearity may be implemented using an asymmetrically threaded SQUID (superconducting quantum interference device), also referred to herein as an "ATS." The ATS may comprise a superconducting quantum interference device (SQUID) that has been split approximately in the middle by a linear inductor. In its most general form, the ATS potential is given by the following equation:

$$U(\hat{\phi}) = \tfrac{1}{2}E_{L,b}\hat{\phi}^2 - 2E_j \cos(\phi_\Sigma)\cos(\hat{\phi}+\phi_\Delta) + 2\Delta E_j \sin(\phi_\Sigma)\sin(\hat{\phi}+\phi_\Delta)$$

In the above equation, $\hat{\phi}$ is the phase difference across the ATS, $\phi_\Sigma := (\phi_{ext,1}+\phi_{ext,2})/2$, $\phi_\Delta := (\phi_{ext,1}-\phi_{ext,2})/2$, and $\phi_{ext,1}$ ($\phi_{ext,2}$) is the magnetic flux threading the left (right) loop, in units of the reduced magnetic flux quantum $\Phi_0^2 = h/2E$. Here $E_{L,b} = \Phi_0^2/L_b$; $E_j = (E_{j,1}+E_{j,2})/2$; and $$\Delta E_j = \frac{(E_{j,1} - E_{j,2})}{2}$$

is the junction asymmetry. This ATS potential can be further simplified by tuning $\phi_\Sigma$ and $\phi_\Delta$ with two separate flux lines. For example, FIG. 1A illustrates ATS 102 included in control circuit 100, wherein ATS 102 includes separate flux lines 108 and 110. Note that FIG. 1A includes ATS 102 in control circuit 100 and also an enlarged depiction of ATS 102 adjacent to control circuit 102 that shows ATS 102 in more detail. The flux lines may be set such that:

$$\phi_\Sigma = \frac{\pi}{2} + \epsilon_p(t) \text{ and } \phi_\Delta = \frac{\pi}{2}$$

In the above equations, $\epsilon_p(t) = \epsilon_{p,0}\cos(\omega_p t)$ is a small alternating current (AC) component added on top of the direct current (DC) basis. At this bias point, and assuming that $|\epsilon_p(t)| \ll 1$ then the equation above for $U(\hat{\phi})$ can be reduced to:

$$U(\hat{\phi}) = \tfrac{1}{2}E_{L,b}\hat{\phi}^2 - 2E_j\epsilon_p(t)\sin(\hat{\phi}) + 2\Delta E_j \cos(\hat{\phi}).$$

Figure 1B:
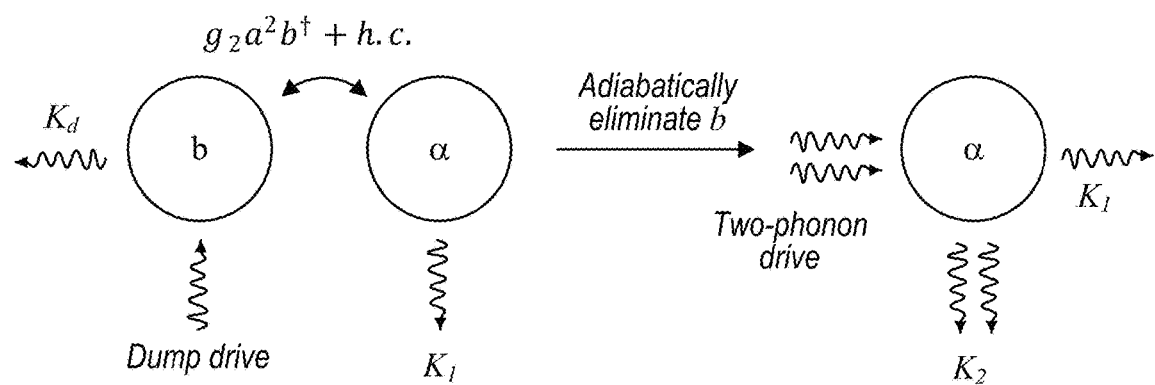
FIG. 1B illustrates a modelling of a storage mode (a) and a dump mode (b) of a hybrid acoustic-electrical qubit, wherein for large energy decay rates ($K_b$) that are significantly larger than a two-phonon coupling rate ($g_2$) the dump mode can be adiabatically eliminated, such that the hybrid acoustic-electrical qubit can be modeled as having a single phonon decay rate ($K_1$) and being driven by a two phonon drive having a two-phonon decay rate ($K_2$), according to some embodiments.

Using the control circuit 100 shown in FIG. 1A, quantum information may be stored in a state of a linear mechanical resonator. For example quantum information may be stored in storage mode 106. The stored quantum information may also be autonomously error corrected by way of artificially induced two-phonon driving and two-phonon decay controlled by the ATS. These two phonon processes are induced through the non-linear interaction $g_2 \hat{a}^2\hat{b}^\dagger$+h.c. between the storage mode a and an ancillary mode b, called the dump, such as dump mode 104 shown in FIG. 1A. The dump mode is designed to have a large energy decay rate $K_d$ so that it rapidly and irreversibly "dumps" the photons it contains into the environment. If $K_d$ is much larger (e.g. ~10× or more) than the coupling rate $g_2$, then the dump mode can be adiabatically eliminated from the Hamiltonian, for example as shown in FIG. 1B. For example, as shown on the right side of FIG. 1B, the emission of phonon pairs via $g_2 \hat{a}^2\hat{b}^\dagger$ can be accurately modeled as a dissipative process described by a dissipator $\sim D[a^2]$. Additionally, if the dump mode is linearly driven as $\epsilon^* b e^{-\omega_d t}$+h.c. this provides the required energy to stimulate the reverse process $g^*_2(a^{+2})b$, which in the adiabatic elimination, as shown in FIG. 1B, can be modeled as an effective two-phonon drive. Altogether, the dynamics can be accurately modeled through the equation:

$$\frac{d\rho}{dt} = K_2 D[a^2 - \alpha^2], \text{ where } \alpha = \epsilon/g_2 \text{ and } k_2 = 4g_2^2/K_d$$

The steady states of the dynamics of the system shown in FIG. 1B are the coherent states $|\alpha\rangle$, $|-\alpha\rangle$, or any arbitrary superposition of the two. This protected subspace can be used to encode a qubit through the following definition of a logical basis: $|0_L\rangle = |\alpha\rangle$, $|1_L\rangle = |-\alpha\rangle$. Qubits encoded in this way are effectively protected from X errors (e.g. bit flips) because the bit-flip rate decays exponentially with the code distance $|\alpha^2|$, as long as $K_2|\alpha|^2 \gg K_1$, wherein $K_1$ is the ordinary (e.g. single-photon) decay rate of the storage mode. Since $|\alpha|^2 \sim 1$, this condition is generally equivalent to $K_2/K_1 \gg 1$. However, Z errors (e.g. phase flips) may not be protected by this code.

As discussed above, an ATS is formed by splitting a SQUID with a linear inductor. The magnetic flux threading of each of the two resulting loops of the ATS can be controlled via two nearby on-chip flux lines, such as flux lines 108 and 110 shown in FIG. 1A. These flux lines can be tuned to appropriate values and can send radio frequency (rf) signals at appropriate frequencies for a desired non-linear interaction to be resonantly activated in the nano-mechanical resonator. The dump mode 104, may further be strongly coupled to a dump line of characteristic impedance $Z_0$, which induces a large energy decay rate as required.

In some embodiments, the nano-mechanical storage resonator (e.g. storage 106) may be a piezoelectric nano-mechanical resonator that supports resonances in the GHz range. These resonances may be coupled to superconducting circuits of the control circuit 100 via small superconducting electrodes (e.g. terminals) that either directly touch or closely approach the vibrating piezoelectric region of the nano-mechanical resonators. The values of the nonlinear coupling rate $g_2$, the two-phonon dissipation rate $k_2$, and the ratio $K_2/K_1$ can be calculated as follows:

First, compute the admittance $Y_m(\Omega)$ seen at the terminals of the nano-mechanical resonator using a finite element model solver. Next, find an equivalent circuit using a Foster synthesis algorithm (further discussed below). Then, diagonalize the combined circuit and compute the zero-point phase fluctuations $\phi_{a,zp}$ and $\phi_{b,zp}$. Furthermore, compute the dissipation rates $k_b$ and $k_1$ of the eigenmodes. Next compute $$g_2 = \left(\frac{E_j}{h}\right)\epsilon_0 \phi_{a,zp}^2 \phi_{b,zp}^2 /2. \text{ Also, compute } k_2 = 4g_2^2/k_d.$$

In some embodiments, a nano-mechanical element, such as the nano-mechanical resonator that implements storage mode 106 and dump mode 104 may be represented as an equivalent circuit that accurately captures its linear response. This can be done using Foster synthesis if the admittance $Y_m(\omega)$ seen from the terminals of the mechanical resonator is known. For example, the admittance may be computed using finite element modeling. In some embodiments, a Foster network may be used to accurately represent a one-dimensional (e.g. linear) phononic-crystal-defect resonator (PCDR), which may be a type of nano-mechanical resonator used in some embodiments. In some embodiments, the dump resonator may be modeled as having a fixed impedance, such as 1 kilo ohms.

For example FIG. 2 illustrates a version of control circuit 100 that has been represented using a Foster network (e.g. equivalent circuit 200). In its simplest form, equivalent circuit 200 may be represented as 'a DC capacitance' in series with an LC block (e.g. L represents and inductor and C represents a capacitor for the LC block), wherein an additional resistor is inserted to include the effects of the loss in the resonator. For example, Foster network 210 is modeled to include capacitor 204, inductor 206, and resistor 208. The linear part of the dump resonator (including the inductor that splits the ATS) can also be represented as an LC block, such as LC block 212. In this representation the dump resonator (e.g. 212) and the storage resonator (e.g. 210) are represented as two linear circuits with a linear coupling and can therefore be diagnolized by a simple transformation of coordinates. For example, FIG. 2 illustrates a diagnolized circuit representation 214. The resulting "storage-like" ($\hat{a}$) and "dump-like" ($\hat{b}$) eigenmodes both contribute to the total phase drop across the ATS. For example, $\hat{\phi}=\varphi_a(\hat{a}+\hat{a}^\dagger)+\varphi_b(\hat{b}+\hat{b}^\dagger)$. These modes therefore mix the via the ATS potential, which may be redefined as $U(\hat{\phi}) \to U(\hat{\phi})-E_{L,b}\hat{\phi}^2/2$ because the inductor has already been absorbed into the linear network. The zero-point phase fluctuations of each mode are given by:

$$\varphi_{k,j} = \sqrt{\frac{h}{2\omega_k}}(C^{-1/2}U)_{jk}$$

In the above equation C is the Maxwell capacitance matrix of the circuit. U is the orthogonal matrix that diagnolizes $C^{-1/2}L^{-1}C^{-1/2}$, where $L^{-1}$ is the inverse inductance matrix. The index $k \in \{a, b\}$ labels the mode and j labels the node in question. Note that in some instances as described herein the notation of j may be omitted because it is clear from context, e.g. the node of interest is the one right above the ATS.

The way in which the ATS mixes the modes is explicit given the third-order term in the Taylor series expansion of the $\sin(\hat{\phi})$ contains terms of the form $\hat{a}^2\hat{b}^\dagger$+h.c., which is the required coupling. This is a reason for using the ATS as opposed to an ordinary junction, which has a potential $\sim \cos(\hat{\phi})$.

For analysis the pump and drive frequencies may be set to $\omega_p=2\omega_a-\omega_b$ and $\omega_d=\omega_b$. This brings the terms $g_2\hat{a}^2\hat{b}^\dagger$+h.c. into resonance allows the other terms in the rotating wave approximation (RWA) to be dropped. The coupling is given by $g_2=\epsilon_0 E_j \varphi_a^2 \varphi_b/2h$. Additionally, a linear drive $\epsilon^*_d \hat{b}$+h.c. at frequency $\omega_d=\omega_b$ is added to supply the required energy for the two-photon drive.

Multi-Mode Stabilization ATS Multiplexing

In some embodiments, the scheme as described above may be extended to be used in a multi-mode setting, in which N>1 storage resonators are simultaneously coupled to a single dump+ATS. This may allow for the cat subspaces of each of the storage modes to be stabilized individually. For example, a dissipator of the form $\Sigma_n D[a_n^2-\alpha^2]$. However, in order to avoid simultaneous or coherent loss of phonons from different modes (which fails to stabilize the desired subspaces), an incoherent dissipator is required. This can be achieved if the stabilization pumps and the drives for the different modes are purposefully detuned as follows:

$$H = \Sigma_m(\epsilon^{*(d)}_m(t)b^\dagger + h.c.) + \Sigma^{m,i,j}(g^{*(m)}_{ij}(t)a_i a_j b^\dagger + h.c.),$$

where $$\epsilon^{*(d)}_m(t) = \epsilon^{*(d)}_m e^{i\Delta_m t} e^{i\Delta_m t} \text{ and } g^{*(m)}_{ij}(t) = g^*_2 e^{i(2\omega_m - \omega_i + \Delta_m)t}$$

In the above equation $\omega_m^{(p)}=2\omega_m-\Omega_b+\Delta_m$ and $\omega_m^{(d)}=\omega_b-\Delta_m$ are the pump and drive frequencies for mode m. By detuning the pumps, the pump operators of different modes can rotate with respect to each other. If the rotation rate is larger than $k_2$ then the coherences of the form $a_i^2\rho(a_j^\dagger)^2$ in the Lindbladian vanish in a time averaged sense. The drive de-tunings allow the pumps and drives to remain synchronized even though the pumps have been detuned relative to one another.

In some embodiments, the modes $a_1$ and $a_2$ may be simultaneously stabilized using a multiplexed ATS, wherein the pumps have been detuned. Simulations may be performed to determine the detuning parameters using the simulated master equation, as an example:

$$\dot{\rho} = -i\left[\frac{\Delta}{2}a_1^\dagger a_1 + \left(\epsilon_2 e^{i\Delta t}a_1^{\dagger 2} + \epsilon_2 a_2^{\dagger 2} + h.c.\right), \rho\right] + k_2 D[a_1^2 + a_2^2](\rho)$$

Bandwidth Limits

The above described tuning works best when the detuning $\Delta$ is relatively small as compared to $k_b$. This is due to the fact that, unlike the single-mode case, where $k_2=4g_2^2/k_b$, the two-phonon decay of the multi-mode system is given by:

$$k_{2,n} = \frac{4|g|^2}{k_b} \frac{1}{1+4(\Delta_n/k_b)^2}$$

The Lorentzian suppression factor can be understood by the fact that photons/phonons emitted by the dump mode as a result of stabilizing mode n are emitted at a frequency $\omega_b + \Delta n$ and are therefore "filtered" by the Lorentzian lineshape of the dump mode which has linewidth $k_b$. This sets an upper bound on the size of the frequency region that the de-tunings are allowed to occupy. Furthermore, in some embodiments, the de-tunings $\Delta_n$ may all be different from each other by amount greater than $k_2$ in order for the dissipation to be incoherent. In a frequency domain picture, the spectral lines associated with emission of photons/phonons out of the dump must all be resolved. This, also sets a lower bound on the proximity of different tunings. As such, since an upper bound and lower bound are set, bandwidth limits for the de-tunings may be determined. Also, taking into account these limitations, an upper bound on the number of modes that can be simultaneously stabilized by a single dump can also be determined. For example, if de-tunings are selected to be $\Delta_n = n\Delta$, with $\Delta \sim k_2$, then the maximum number of modes that may be simultaneously stabilized may be limited as $N_{max} \sim k_b / \Delta \sim k_b / k_2$. As a further example, for typical parameters, such as $k_b / 2\pi \sim 10$ MHz and $k_2 / 2\pi \sim 1$ MHz, this results in bandwidth limits that allow for approximately 10 modes to be simultaneously stabilized.

For example, FIG. 3 illustrates a control circuit 300 that includes a single dump resonator 302 that stabilizes multiple storage resonators 304.

Use of a High-Impedance Inductor to Enhance Coupling Between a Dump Resonator and One or More Storage Resonators In some embodiments, the coupling rate $g_2$ may be increased by using a high impedance inductor. This is because $g_2$ depends strongly on the effective impedance $Z_d$ of the dump resonator. For example, $g_2 \sim Z_d^{5/2}$. Thus, in some embodiments, using a large inductor in the ATS may result in a large effective impedance $Z_d$. In some embodiments, the inductor chosen to be included in the ATS circuit may be sufficiently linear to ensure stability of the dump circuit when driven strongly during stabilization. For example, a high impedance inductor used may comprise a planar meander or double-spiral inductor, a spiral inductor with air bridges, an array with a large number of (e.g. greater than 50) highly transparent Josephson junction, or other suitable high impedance inductor.

Filtering in Multi-Mode Stabilization/Multiplexed ATS

In some embodiments, microwave filters (e.g. metamaterial waveguides) may be used to alleviate the limitations with regard to bandwidth limits as discussed above. Such filters may also be used to eliminate correlated errors in multiplexed stabilization embodiments. For example, FIG. 4 illustrates control circuit 400 that includes a single dump resonator 404, multiple storage resonators 406, and a filter 402.

More specifically, when stabilizing multiple storage modes with the same dump resonator and ATS device a number of cross-terms appear in the Hamiltonian that would otherwise not be there in the single-mode case. For example, these terms take the form of $g_2 a_j a_k b^+ e^{-i\nu t}$. After adiabatic elimination of the b mode (for example as discussed in regard to FIG. 1), these terms effectively become jump operators of the form $k_{2,eff} a_j a_k e^{-i\nu t}$. Unlike the desired jump processes $k_2, a_j^2$, which result in the individual stabilization of the cat subspace of each resonator, the correlated decay terms result in simultaneous phase flips of the resonators j and k. For example, these correlated errors can be damaging to the next layer of error correction, such as in a repetition or striped surface code.

In some embodiments, in order to filter out the unwanted terms in the physical Hamiltonian that give rise to effective dissipators that cause correlated phase flips, the de-tunings of the unwanted terms may be larger than half the filter bandwidth. This may result in an exponential suppression of the unwanted terms. Said another way, the de-tunings and filter may be selected such that detuning of the effective Hamiltonian is larger than half the filter bandwidth. Moreover, the filter mode (along with the dump mode) may be adiabatically eliminated from the model in a similar manner as discussed in FIG. 1B for the adiabatic elimination of the dump mode. This may be used to determine an effective dissipator for a circuit such as control circuit 400 that includes both dump resonator 404 and filter 402.

As discussed above, correlated phase errors may be suppressed by a filter if the corresponding emitted photons have frequencies outside of the filter bandwidth. In some embodiments, all correlated phase errors may be simultaneously suppressed by carefully choosing the frequencies of the storage modes. For example cost functions may be used taking into account a filter bandwidth to determine optimized storage frequencies. For example, in some embodiments a single ATS/dump may be used to suppress decoherence associated with all effective Hamiltonians for 5 storage modes. In such embodiments, all dominant sources of stochastic, correlated phase errors in the cat qubits may be suppressed.

Multi-Terminal Mechanical Resonators

In some embodiments, nano-mechanical resonators, such as those shown in FIGS. 1-4 may be designed with multiple terminals that allow a given nano-mechanical resonator to be coupled with more than one ATS/control circuit. For example a single connection ATS may include a ground terminal and a signal terminal, wherein the signal terminal couples with a control circuit comprising an ATS. In some embodiments, a multi-terminal nano-mechanical resonator may include more than one signal terminal that allows the nano-mechanical resonator to be coupled with more than one control circuit/more than one ATS. For example, in some embodiments, a nano-mechanical resonator may include three or more terminals that enable the nano-mechanical resonator to be coupled with three or more ATSs. If not needed an extra terminal could be coupled to ground, such that the multi-terminal nano-mechanical resonator functions like a single (or fewer) connection nano-mechanical resonator. In some embodiments, different signal terminals of a same nano-mechanical resonator may be coupled with different ATSs, wherein the ATSs may be used to implement gates between mechanical resonators, such as a CNOT gate. For example, this may allow for implementation of gates on the stabilizer function.

Example Physical Gate Implementations

Recall the Hamiltonian of a system comprising of multiple phononic modes $\hat{a}_k$ coupled to a shared ATS mode $\hat{b}$:

$$\hat{H} = \sum_{k=1}^{N} \omega_k \hat{a}_k^\dagger \hat{a}_k + \omega_b \hat{b}^\dagger \hat{b} - 2E_J \epsilon_p(t) \sin\left(\sum_{k=1}^{N} \hat{\phi}_k + \hat{\phi}_b\right)$$

wherein $\hat{\phi}_k \equiv \varphi_k(\hat{a}_k + \hat{a}_k^\dagger)$ and $\hat{\phi}_b \equiv \varphi_b(\hat{b} + \hat{b}^\dagger)$. Also, $\varphi_k$ and $\varphi_b$ quantify zero-point fluctuations of the modes $\hat{a}_k$ and $\hat{b}$. To simplify the discussion, neglect small frequency shifts due to the pump $\epsilon_p(t)$ for the moment and assume that the frequency of a mode is given by its bare frequency (in practice, however, the frequency shifts need to be taken into account; see below for the frequency shift due to pump).

Then, in the rotating frame where every mode rotates with its own frequency, the following is obtained:

$$\hat{H}_{rot} = -2E_j\epsilon_p(t)\sin\left(\sum_{k=1}^{N}\varphi_k \hat{a}_k e^{-\omega_k t} + h.c. + \varphi_b \hat{b} e^{-\omega_b t} + h.c.\right)$$

where $\varphi_k$ and $\varphi_b$ quantify zero-point fluctuations of the modes $\hat{a}_k$ and $\hat{b}$. Note that the rotating frame has been used where each mode rotates with its own frequency.

First, a linear drive on a phononic mode, say $\hat{a}_k$, can be readily realized by using a pump $\epsilon_p(t)=\epsilon_p \cos(\omega_p t)$ and choosing the pump frequency $\omega_p$ to be the frequency of the mode that is to be driven, that is, $\omega_p=\omega_k$. Then, by taking only the leading order linear term in the sine potential (e.g., $\sin(\hat{x})\approx\hat{x}$) we get the desired linear drive:

$$\hat{H}_{rot}=-2E_j\epsilon_p\varphi_k(\hat{a}_k+\hat{a}_k^\dagger)+H'$$

where H' comprises fast-oscillating terms such as $-E_j\epsilon_p(\varphi_l \hat{a}_l e^{-i(\omega_l-\omega_k)t}+h.c.)$ with $l\neq k$ and $E_j\epsilon_p(\varphi_b \hat{b} e^{-i(\omega_b-\omega_k)t}+h.c.)$ as well as other terms that rotate even faster. Since the frequency differences between different modes are on the order of 100 MHz but $|\epsilon_z|/(2\pi)$ is typically much smaller than 100 MHz, the faster oscillating terms can be ignored using a rotating wave approximation (RWA).

To avoid driving unwanted higher order terms, one may alternatively drive the phononic mode directly, at the expense of increased hardware complexity, instead of using the pump $\epsilon_p(t)$ at the ATS node.

Now moving on to the implementation of the compensating Hamiltonian for a CNOT gate. For example a compensating Hamiltonian for a CNOT gate may have the form:

$$\hat{H}_{CNOT}=\frac{\pi}{4\alpha T}(\hat{a}_1+\hat{a}_1^\dagger-2\alpha)(\hat{a}_2^\dagger \hat{a}_2 - \alpha^2)$$

Without loss of generality, consider the CNOT gate between the modes $\hat{a}_1$ (control) and $\hat{a}_2$ (target), Note that $\hat{H}_{CNOT}$ comprises an optomechanical coupling $$\frac{\pi}{4\alpha T}(\hat{a}_1+\hat{a}_1^\dagger)\hat{a}_2^\dagger \hat{a}_2$$

between two phononic modes, a linear drive on the control mode $$-\left(\frac{\pi\alpha}{4T}\right)(\hat{a}_1+\hat{a}_1^\dagger),$$

and a selective frequency shift of the target mode $$-\left(\frac{\pi}{2T}\right)\hat{a}_2^\dagger \hat{a}_2.$$

To realize the optomechanical coupling, one might be tempted to directly drive the cubic term $\hat{a}_1 \hat{a}_2^\dagger \hat{a}_2$+h.c., in the sine potential via a pump $\epsilon_p(t)=\epsilon_p \cos(\omega_p t)$. However, the direct driving scheme is not suitable for a couple of reasons: since the term $\hat{a}_1 \hat{a}_2^\dagger \hat{a}_2$ rotates with frequency $\omega_1$, the required pump frequency is given by $\omega_p=\omega_1$ which is the same pump frequency reserved to engineer a linear drive on the $\hat{a}_1$ mode. Moreover, the term $\hat{a}_1 \hat{a}_2^\dagger \hat{a}_2$ rotates at the same frequency as those of undesired cubic terms. Hence, even if the linear drive is realized by directly driving the phononic mode $\hat{a}_1$, one cannot selectively drive the desired optomechanical coupling by using the pump frequency $\omega_p=\omega_1$ due to the frequency collision with the other cubic terms.

In some embodiments, to overcome these frequency collision issues, the optomechanical coupling is realized by off-resonantly driving the term $(\hat{a}_1+\lambda)\hat{a}_2 \hat{b}^\dagger$. For example, the fact that a time-dependent Hamiltonian $\hat{H}=\lambda \hat{A}\hat{b}^\dagger e^{i\Delta t}$ yields an effective Hamiltonian $\hat{H}_{eff}=(x^2/\Delta)\hat{A}^\dagger\hat{A}$ upon time-averaging is used assuming that the population of the $\hat{b}$ mode is small (e.g. $\hat{b}^\dagger\hat{b}\ll 1$) and the detuning $\Delta$ is sufficiently large. Hence given a Hamiltonian $\hat{H}=x(\hat{a}_1+\lambda)\hat{a}_2\hat{b}^\dagger e^{-\Delta t}$=h.c., this gives $$\hat{H}_{eff}=\frac{x^2\lambda}{\Delta}\left(\hat{a}_1+\hat{a}_1^\dagger+\lambda+\frac{1}{\lambda}\hat{a}_1^\dagger\hat{a}_1\right)\hat{a}_2^\dagger\hat{a}_2$$

In particular, by choosing $\Delta=-2\alpha$, the optomechanical coupling can be realized as well as the selective frequency shift of the $\hat{a}_2$ mode, e.g. $\hat{H}_{eff}\propto(\hat{a}_1+\hat{a}_1^\dagger-2\alpha)\hat{a}_2^\dagger\hat{a}_2$ up to an undesired cross-Ker term $-\hat{a}_1^\dagger\hat{a}_1\hat{a}_2^\dagger\hat{a}_2/(2\alpha)$. In this scheme, the desired selectivity is achieved because the term $(\hat{a}_1+\lambda)\hat{a}_2\hat{b}^\dagger$ is detuned from other undesired terms such as $(\hat{a}_1+\lambda)\hat{a}_k\hat{b}^\dagger$ with $k\geq 3$ by a frequency difference $\omega_2-\omega_k$. Thus, the unwanted optomechanical coupling $(\hat{a}_1+\hat{a}_1^\dagger)\hat{a}_k^\dagger\hat{a}_2$ can be suppressed by a suitable choice of the detuning $\Delta$. It is remarked that the unwanted cross-Kerr term $\hat{a}_1^\dagger\hat{a}_1\hat{a}_2^\dagger\hat{a}_2$ can in principle be compensated by off-resonantly driving another cubic term $\hat{a}_1\hat{a}_2\hat{b}^\dagger$ with a different detuning $\Delta'\neq\Delta$.

Lastly, similar approaches as used in the compensating Hamiltonian for the CNOT gate can also be used for a compensating Hamiltonian for a Toffoli gate.

Example Processes for Implementing an ATS-Phononic Hybrid System

Figure 5:
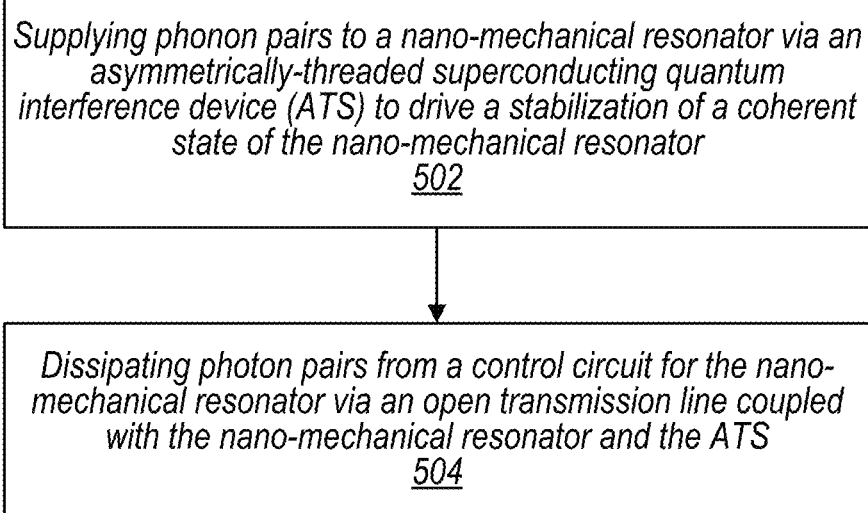
FIG. 5 illustrates a process of stabilizing a nano-mechanical resonator using an asymmetrically-threaded superconducting quantum interference device (ATS), according to some embodiments.

FIG. 5 illustrates a process of stabilizing a nano-mechanical resonator using an asymmetrically-threaded superconducting quantum interference device (ATS), according to some embodiments.

At block 502, a control circuit of a system comprising one or more nano-mechanical resonators causes phonon pairs to be supplied to the nano-mechanical resonator via an ATS to drive a stabilization of a storage mode of the nano-mechanical resonator such that the storage mode is maintained in a coherent state. Also, at block 504, the control circuit dissipates phonon/photon pairs from the nano-mechanical resonator via an open transmission line of the control circuit that is coupled with the nano-mechanical resonator and the ATS.

Figure 6:
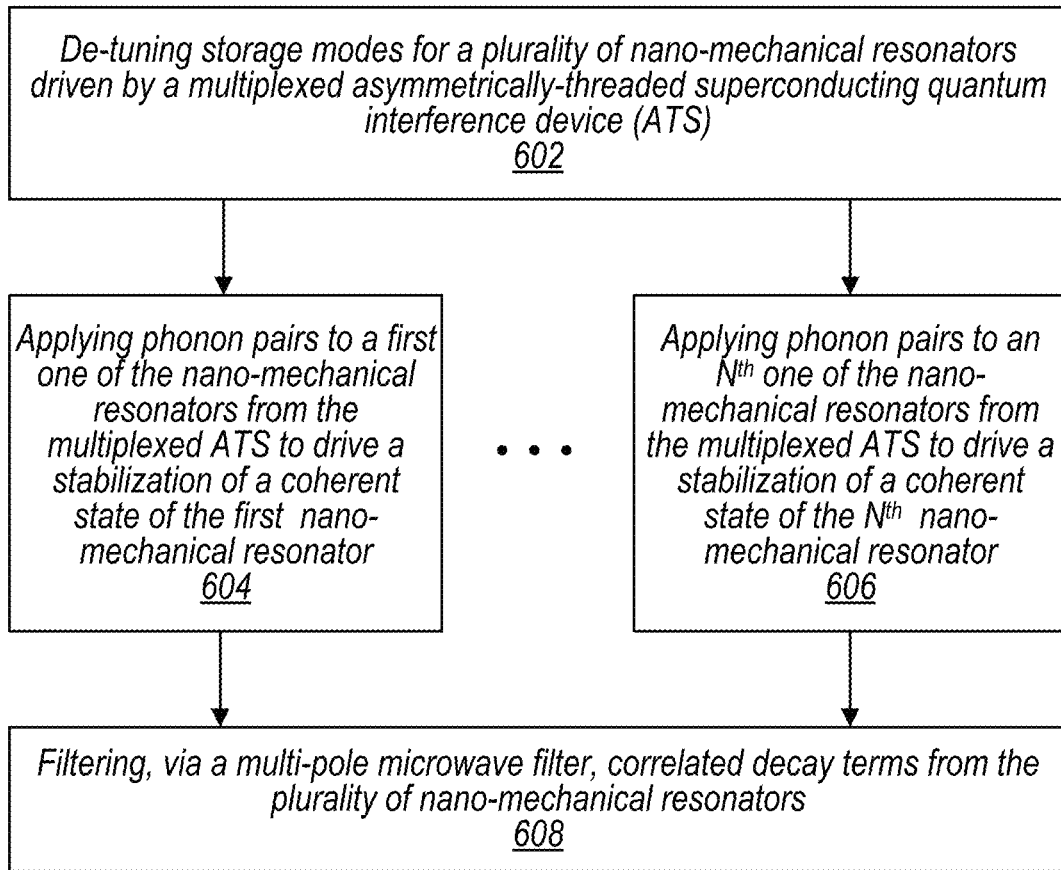
FIG. 6 illustrates a process of stabilizing multiple nano-mechanical resonators using a multiplexed ATS, according to some embodiments.

FIG. 6 illustrates a process of stabilizing multiple nano-mechanical resonators using a multiplexed ATS, according to some embodiments.

At block 602, storage modes for a plurality of nano-mechanical resonators that are driven by a multiplexed ATS are chosen such that the storage modes are de-tuned. For example, block 602 may include detuning storage modes supported by a plurality of nano-mechanical resonators from a dump resonator containing an asymmetrically-threaded superconducting quantum interference device At block 604 phonon pairs are supplied to a first one of the nano-mechanical resonators at a first frequency and at 606 phonon pairs are supplied to other ones of the nano-mechanical resonators at other frequencies such that the frequencies for the respective storage modes of the nano-mechanical resonators are detuned. For example, blocks 604 and 606 may include applying a pump and drive to an ATS to activate two-phonon driven-dissipative stabilization to a first one of the nano-mechanical resonators and suppressing, via a microwave bandpass filter, correlated decay processes from the plurality of nano-mechanical resonators.

Additionally, the storage mode frequencies and a bandwidth for a filter of the control circuit may be selected such that de-tunings of unwanted terms are larger than half the filter bandwidth. Then, at block 608 a microwave filter with the determined filter bandwidth properties may be used to filter correlated decay terms from the plurality of nano-mechanical resonators.

STOP Algorithm and Preparation of a Fault-Tolerant Universal Gate Set Including Bottom-Up Preparation of Toffoli Gates In some embodiments, the systems described above that implement hybrid acoustic-electrical qubits may be used to implement a universal gate set. In some embodiments, error correction may be used to correct for errors and/or noise in such systems. In some embodiments, a STOP algorithm, as described herein, may provide an efficient protocol for providing error detection and/or correction. In some embodiments, systems, as described above, that implement hybrid acoustic-electrical qubits may introduce noise that is biased towards phase flip errors. With such knowledge about error bias, error correction protocols, such as a STOP algorithm, may be used to efficiently correct for errors. Additionally, as further discussed below, error correction may be used to correct for errors when preparing Toffoli gates using a bottom-up approach (and/or when using a top-down approach which is further discussed in the next section).

In some embodiments, a STOP algorithm may be used to determine when it is acceptable to STOP measuring stabilizer measurements as part of an error detection/error correction operation while guaranteeing a low probability of logical errors. For example, a STOP algorithm may be used to measure stabilizer measurements prior to performing a Toffoli gate wherein measured errors are corrected prior to applying the Toffoli gate.

An alternative to using a STOP decoder may be to use graph based error correction techniques. However, these techniques are typically predicated on the use of Clifford gates and are not as useful when applying Toffoli gates. For example, these techniques involve measuring data qubits at the end of performing an operation to determine errors. However, for non-Clifford gates, a single qubit error of the initial input qubits can cause a logical failure that may not be detected using a standard graph based error correction technique.

In contrast, a STOP algorithm measures stabilizers for input data qubits such that error detection and/or correction can be performed prior to performing an operation, such as a non-Clifford gate. In addition, instead of measuring the stabilizers for the data qubits a fixed number of times, which may be insufficient to detect/correct logical errors in some situations, or which may be unnecessary in other situations, a STOP algorithm may be used to determine when stabilizer measurements can be stopped while still guaranteeing a low probability of logical errors. For example, in some embodiments, a STOP algorithm may guarantee that a total number of failures is less than a code distance of repeatedly encoded data qubits (e.g. a repetition code) divided by two. Thus the majority of the repeated data qubits are known to not be erroneous and a logical error will not occur because the majority of the encoded data qubits are correct. For example, errors can be tolerated as long as the total number of errors is less than the code distance divided by two. In such situations, the errors will not result in a logical error, because the majority of the encoded qubits are not erroneous. Note that a physical error is distinct from a logical error. A physical error acts on an individual qubit, whereas a logical error is an erroneous logical output determined based on physical qubits. A logical error cannot be directly detected, and if not detected, cannot be corrected. For example, an uncorrected physical error may result in a logical error, but if the physical error was undetected, there is no way to subsequently measure the logical error caused by the physical error, without knowing about the physical error.

In some embodiments, a STOP algorithm may also be applied to qubits used for performing non-Clifford gates, such as a Toffoli gate. Also, in some embodiments, a STOP algorithm may be used when growing a repetition code from a first code distance to a second code distance, wherein stabilizers at a boundary between code blocks that are being joined to grow the repetition code are measured. The STOP algorithm may be used to determine when repeated measurements of the stabilizers at the boundary can be stopped without introducing logical errors into the expanded repetition code.

In some embodiments, when preparing a Toffoli gate, a STOP algorithm may be used to detect and/or correct errors in the initial computational basis states used to prepare the Toffoli gate. The STOP algorithm may also be used in preparing Clifford gates that are applied in a sequence to implement the Toffoli gate, wherein the STOP algorithm is used to detect/correct errors in the Clifford gates. Additionally, the STOP algorithm may be used to perform error detection/correction between measurements of $g_A$ which is repeatedly measured as part of preparing the Toffoli gates using a bottom up approach, as further discussed below. In some embodiments, a round of error detection may be performed between each round of measuring $g_A$.

In some embodiments, a STOP algorithm may follow an algorithm similar to the algorithm shown below:

```
Set: t = (d − 1)/2 ; n_diff = 0 ;countSyn = 1; SynRep = 1
n_diffIncrease = 0 ; test = 0
while test = 0 {
if n_diff = t {
test = 1;
}
Measure the error syndrome. Store the error syndrome from the previous
round in synPreviousRound and the current syndrome in
synCurrentRound.
if (countSyn > 1) {
if (synPreviousRound = synCurrentRound) {
SynRep = SynRep + 1;
n_diff Increase = 0;
} else {
SynRep = 0;
if (n_diffIncrease = 0) {
n_diff = n!"## + 1;
n_diffIncrease = 1;
} else
n_diffIncrease = 0
}
}
if (SynRep = t − n_diff+ 1) {
test = 1;
}
countSyn = countSyn + 1;
}
```

Figure 7:
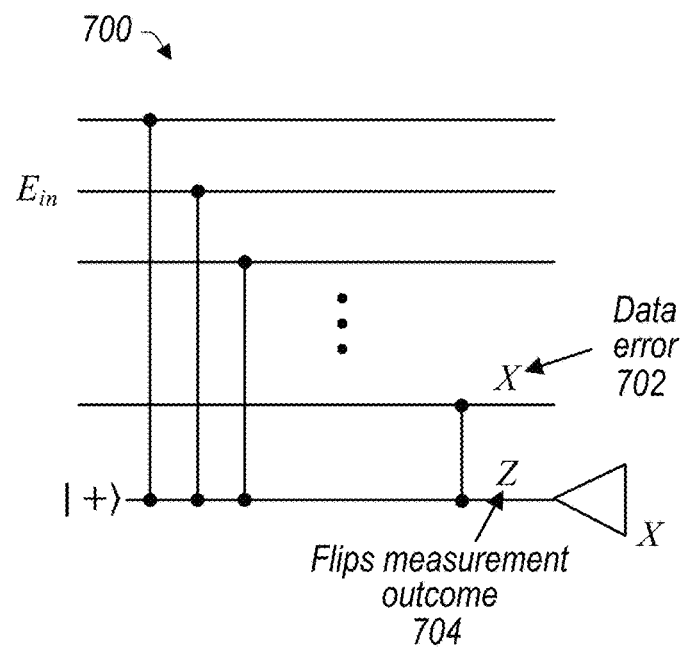
FIG. 7 illustrates a data error occurring when measuring input errors for a set of qubits, wherein the data error causes multiple distinct syndromes, according to some embodiments.

Said another way, let $S_j$ be the error syndrome of the $j^{th}$ round of syndrome measurements. The goal of the STOP algorithm is to compute the minimum number of faults that can cause changes between two consecutive syndromes. The worst case scenario is where a single two-qubit gate failure results in three different syndrome outcomes. To see this, let $S_{k-1}$ be the syndrome from round k−1. Now suppose the operator $X^{\otimes n}$ is measured using the circuit 700 shown in FIG. 7 with the input error $E_{in}$ such that $s(E_{in})=S_{k-1}$. Further, suppose the last two-qubit gate fails resulting in the error $X\otimes$. The X error results in the data error $XE_{in}$ (e.g. data error 702) which may have syndrome $s_{k-1}$, while the Z error flips the syndrome outcome (e.g. measurement outcome 704), resulting in the syndrome $s_k$ which can be different from $s_{k-1}$ and $s_{k+1}$. Hence without any other failure, this example shows that a single fault can cause three distinct syndromes $s_{k-1}$, $s_k$ and $s_{k+1}$.

The STOP decoder tracks consecutive syndrome measurement outcomes $s_1, s_2, \ldots, s_r'$, where r is the total number of syndrome measurements (r is not fixed), between two syndrome measurement rounds k and k+1 (with corresponding syndromes $s_k$ and $s_{k+1}$), wherein the minimum number of faults causing a change in syndrome outcome (represented by the variable $n_{diff}$) is only incremented if $n_{diff}$ did not increase in round k.

Now assuming there were no more than t=(d−1)/2 faults for a distance d error correcting code, if the same syndrome $s_1$ was repeated $t-n_{diff}+1$ times in a row, then the syndrome must have been correct (i.e. there were no measurement errors). As such, in this situation one could use the syndrome $s_1$ to correct the errors and terminate the protocol.

Similarly, if $n_{diff}=t$, then there must have been at least t faults. As such, by repeating the syndrome measurement one more time (resulting in the syndrome $s_r$) and using that syndrome to decode, there would need to be more than t faults for $s_r$ to produce the wrong correction. Hence the STOP decoder terminates if one of the following two conditions are satisfied:

1) The syndrome $s_1$ is obtained $t-n_{diff}+1$ times in a row. In which case the $s_j$ syndrome is used to decode. OR
2) The variable $n_{diff}$ gets incremented to $n_{diff}=t$. In which case, the syndrome measurement is repeated one more time and the repeated syndrome measurement is used to decode.

Stabilizer Operations with the Repetition Code

In some embodiments, logical computational basis states may be prepared using a repetition code. In some embodiments, stabilizer measurements of a repetition code may be performed using a STOP algorithm, as described above. Also, in some embodiments, the methods described herein may be applied to any family of Calderbank-Shor-Steane (CSS) codes.

Figure 8:
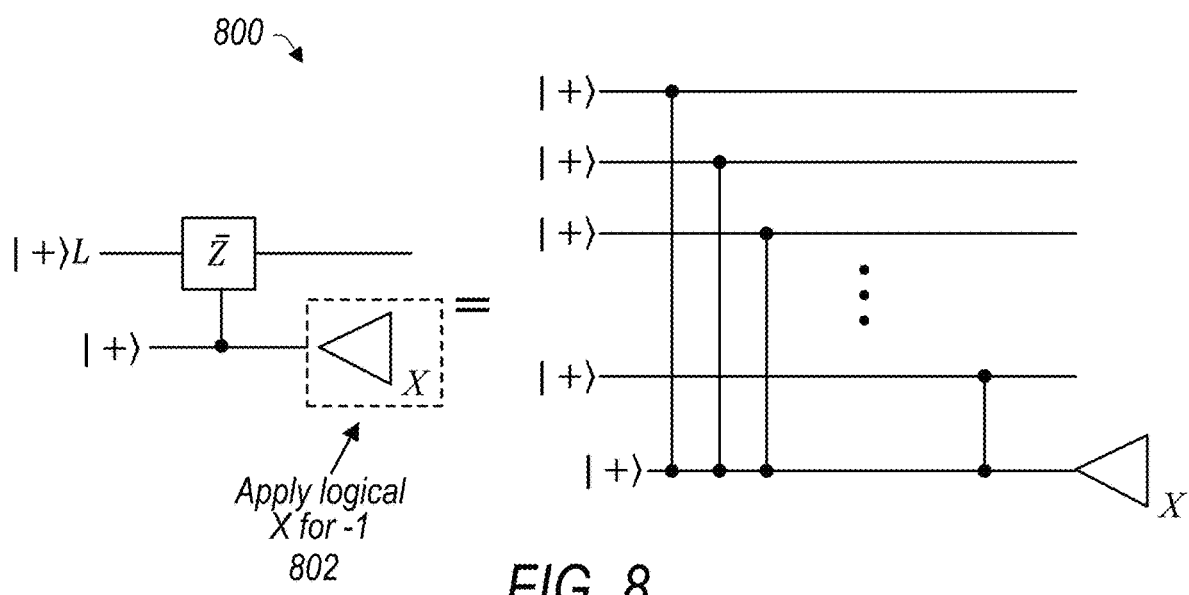
FIG. 8 illustrates a measurement of logical $\overline{Z}$ for a repetition code and a corresponding circuit for measuring the logical $\overline{Z}$ for the repetition code, according to some embodiments.

In some embodiments, using the fact that for an n-qubit repetition code $|+\rangle_L=|+\rangle^{\otimes n}$, preparing $|+\rangle^{\otimes n}$ followed by a logical $Z_L=Z^{\otimes n}$ measurement (see FIG. 8) projects the state to $|0\rangle_L$ given a +1 outcome and $|1\rangle_L$ given a −1 outcome. Since a measurement error on the ancilla results in a logical $X_L=X_1$ error applied to the data, fault tolerance can be achieved by repeating the measurement of $Z_L$ using the STOP algorithm (where the syndrome corresponds to the ancilla measurement outcome), and applying the appropriate $X_L$ correction given the final measurement outcome. For instance, if $|0\rangle_L$ is the desired state and the final measurement outcome at the termination of the STOP algorithm is −1, $X_1$ would be applied to the data. Lastly, note that only X errors can propagate from the ancilla to the data but are exponentially suppressed by the cat-qubits.

In some embodiments, computational basis states may be prepared using an approach that only involves stabilizer measurements. For example, starting with the state $|\psi\rangle_1 = |0\rangle^{\otimes n}$ which is a +1 eigenstate of $Z_L$, measure all stabilizers of the repetition code (each having a random ±1 outcome) resulting in the state:

$$|\psi\rangle_2 = \prod_{i=1}^{n-1}\left(\frac{I \pm X_i X_{i+1}}{2}\right)|0\rangle^{\otimes n}$$

If the measurement outcome of $X_k X_{k+1}$ is −1, the correction $\Pi_{j=1}^{k} Z_j$ can be applied to the data to flip the sign back to +1. However given the possibility of measurement errors, the measurement of all stabilizers $\langle X_1 X_2, X_2 X_3, \ldots, X_{n-1} X_n \rangle$ must be repeated. If physical non-Clifford gates are applied prior to measuring the data, then the STOP algorithm can be used to determine when to stop measuring the syndrome outcomes. Subsequently, minimum-weight perfect matching (MWPM) may be applied to the full syndrome history to correct errors and apply the appropriate Z corrections to fix the code-space given the initial stabilizer measurements. When Clifford gates are applied to the data qubits in order to prepare a $|TOF\rangle$ magic state, this second scheme for preparing the computational basis states may be used along with the STOP algorithm.

Additionally, it is pointed out that although the logical component of an uncorrectable error $E^{(z)}Z_L$ (where $E^{(z)}$ is correctable) can always be absorbed by $|0\rangle_L$ resulting in an output state $|\psi_{out}E^{(z)}|0\rangle_L$, it is still important to have a fault-tolerant preparation scheme for $|0\rangle_L$ (and thus to repeat the measurement of all stabilizers enough times). For instance, if a single fault results in a weight-two correctable Z error (assuming n≥5), a second failure during a subsequent part of the computation can combine with the weight-two error resulting in an uncorrectable data qubit error. Hence, such a preparation protocol would not be fault-tolerant up to the full code distance.

Implementation of Logical Clifford Gates

Since the CNOT gate is transversal for the repetition code, focus can be placed on implementing a set of single qubit Clifford operations. Recall that the Clifford group is generated by:

$$P_n^{(2)} = \langle H_i, S_i, CNOT_{ij}\rangle, \text{ where } H = \frac{1}{\sqrt{2}}\begin{pmatrix} 1 & 1 \\ 1 & -1 \end{pmatrix}, S = \begin{pmatrix} 1 & 0 \\ 0 & i \end{pmatrix}g$$

Note that H and S given above are the Hadamard and phase gate operators. In some embodiments, S and Q=SHS may form a generating set for single-qubit Clifford operations. In implementing such states, injection of the state $$||i\rangle = \frac{1}{\sqrt{2}}(|0\rangle + i|1\rangle),$$

which is a +1 eigenstate of the Pauli operator, may be performed.

Figure 10:
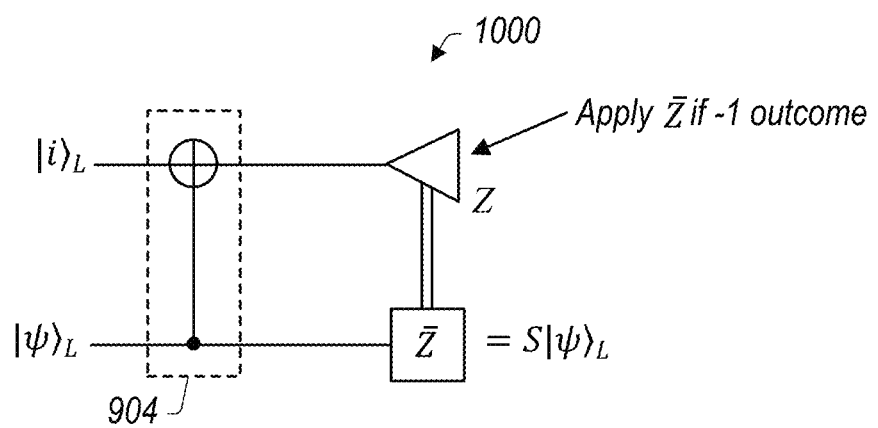
FIG. 10 illustrates a circuit for preparing S, wherein the CNOT gate is a single physical CNOT and $\overline{Z}$ is applied if the measurement outcome is −1, according to some embodiments.

In FIG. 10 a circuit 1000 for implementing $S_L$ is given, wherein the circuit takes $|i\rangle_L$ as an input state and includes a transversal CNOT gate and a logical Z-basis measurement. If a −1 measurement outcome is obtained, a $Z_L$ correction is applied to the data. Note however that a measurement error can result in a logical $Z_L$ being applied incorrectly to the data. As such, to guarantee fault-tolerance, one can repeat the circuit of FIG. 10 and use the STOP algorithm to decide when to terminate. The final measurement outcome may then be used to determine if $Z_L$ correction is necessary. The implementation of S can thus be summarized as follows:

1.) Implement the circuit shown in FIG. 10 and let the measurement outcome be $S_1$;
2.) Repeat the circuit of FIG. 10 and use the STOP algorithm to decide when to terminate; and
3.) If the final measurement outcome $S_f=+1$, do nothing, otherwise apply $Z_L$
$Z_1 Z_2 \ldots Z_n$ to the data.

Figure 9:
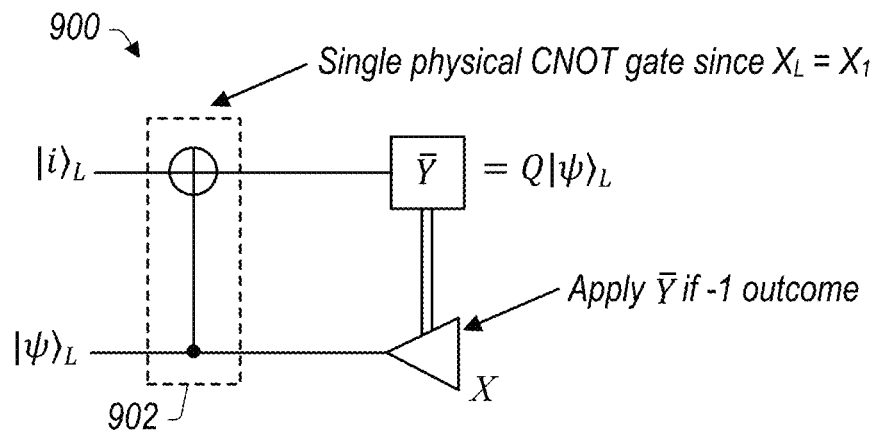
FIG. 9 illustrates a circuit for preparing Q=SHS, wherein the CNOT gate is a single physical CNOT and $\overline{Y}$ is applied if the measurement outcome is −1, according to some embodiments.

The circuit 900 for implementing the logical Q=SHS gate is given in FIG. 9. The circuit consists of an injected $|i\rangle_L$ state, a transversal CNOT gate, and a logical X-basis measurement is applied to the input data qubits. If the measurement outcome is −1, $Y_L$ is applied to the data. As with the S gate, the application of the circuit in FIG. 9 is repeated according to the STOP algorithm to protect against measurement errors. The full implementation of $Q_L$ is given as follows:

1.) Implement the circuit in FIG. 9 and let the measurement outcome be $S_1$;
2.) Repeat the circuit in FIG. 9 and use the STOP algorithm to decide when to terminate; and
3.) If the final measurement outcome $S_f=+1$, do nothing, otherwise apply $Y_L$ $Y_1 Z_2 \ldots Z_n$ to the data.

Figure 12:
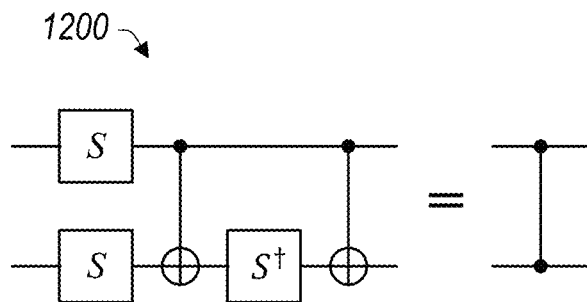
FIG. 12 illustrates a circuit for implementing a logical CZ gate using transversal CNOT gates and S gates, according to some embodiments.

Note that the logical Hadamard gate can be obtained from the SL and $Q_L$ protocols using the identity $H=S^\dagger SHSS^\dagger=S^\dagger QS^\dagger$. Hence ignoring repetitions of the circuits in FIGS. 9 and 10, the implementation of HL requires three logical CNOT gates, two $|-i\rangle_L$ and one $|i\rangle_L$ state, two logical Z basis measurements and one logical X basis measurement. Instead of using two logical Hadamard gates and one CNOT gate to obtain a CZ gate, a more efficient circuit is shown in FIG. 12. Lastly, since the circuits in FIGS. 9 and 10 contain only stabilizer operations and injected $|i\rangle_L$ states, using the STOP algorithm to repeat the measurements is not strictly necessary. For instance, one could repeat the measurement a fixed number of times and majority vote instead of using the STOP algorithm. However in low noise rate regimes, the STOP algorithm can potentially be much more efficient since the average number of repetitions for the measurements can approach t+1 where t=(d−1)/2.

Growing Encoded Data Qubits to Larger Code Distances with the Repetition Code

In some embodiments, a state $|\overline{\psi}\rangle_{d1}=\alpha|0\rangle_{d1}+\beta|1\rangle_{d1}$ encoded in a distance $d_1$ repetition code is grown to a state $|\overline{\psi}\rangle_{d2}=\alpha|0\rangle_{d2}+\beta|1\rangle_{d2}$ encoded in a distance $d_2$ repetition code. Such a protocol may be used to grow $|TOF\rangle$ magic states as further described below.

Let $S_{d1}=\langle X_1 X_2, X_2 X_3, \ldots X_{d_1-1} X_{d_1}\rangle$ be the stabilizer group for a distance $d_1$ repetition code with cardinality $|S_{d1}|=d_1-1$. Similarly $S_{d'_1}$ is defined as $S_{d'_1}=\langle X_{d_1+1} X_{d_1+2}, \ldots X_{d_2-1} X_{d_2}\rangle$ with $|S_{d'_1}|=d_2-d_1-1$. Furthermore the stabilizer group for a distance $d_2$ repetition code is given by $S_{d2}=\langle X_1 X_2, X_2 X_3, \ldots X_{d_2-1} X_{d_2}\rangle$.

Also $g_i^{(d1)}$ is defined as the i'th stabilizer in $S_{d1}$ and $g_i^{(d'1)}$ to be the i'th stabilizer in $S_{d'_1}$, so that $g_i^{(d1)}=X_i X_{i+1}$ and $g_i^{(d'1)}=X_{d_1+i} X_{d_1+i+1}$. The protocol for growing $|\overline{\psi}\rangle_{d1}$ to $|\overline{\psi}\rangle_{d2}$ is given as follows:

1.) Prepare the state $|\psi_1\rangle=|0\rangle^{\otimes(d_2-d_1)}$.
2.) Measure all stabilizers in $S_{d'_1}$ resulting in the state $$|\psi_2\rangle = \prod_{i=1}^{d_2-d_1-1}\left(\frac{I \pm g_i^{(d'_1)}}{2}\right)|0\rangle^{\otimes(d_2-d_1)}.$$

3.) Repeat the measurement of stabilizers in $S_{d'_1}$ using the STOP algorithm and apply MWPM to the syndrome history to correct errors and project to the code-space. If $g_i^{(d'1)}$ is measured as −1 in the first round, apply the correction $\prod_{k=d_1+d}^{d_1} Z_k$ to the data.
4.) Prepare the state $|\psi_3\rangle=|\psi_{d1}\rangle \otimes |\psi_2\rangle$ and measure $X_{d_1} X_{d_1+1}$.
5. Repeat the measurement of all stabilizers of $S_{d2}$ using the STOP algorithm and use MWPM over the syndrome history to correct errors. If in the first round the stabilizer $X_{d_1} X_{d_1+1}$ is measured as −1, apply the correction $\prod_{i=1}^{d_1} Z_i$.

The growing scheme involves two blocks, the first being the state $|\overline{\psi}\rangle_{d1}$ which is grown to $|\psi\rangle_{d2}$. The second block involves the set of qubits which are prepared in the state $|\psi_2\rangle_{d'_1}$ and stabilized by $S_{d'_1}$ (steps 1-3). The key is to measure the boundary operator $X_{d_1} X_{d_1+1}$ between the two blocks which effectively merges both blocks into the encoded state $|\overline{\psi}\rangle_2$, which is a simple implementation of lattice surgery. To see this, consider the state prior to step 4:

$$|\psi\rangle_3 = |\overline{\psi}\rangle_{d1} \otimes |\psi_2\rangle_{d'_1} = \alpha|0\rangle_{d1} \otimes |\psi_2\rangle_{d'_1} + \beta|1\rangle_{d1} \otimes |\psi_2\rangle_{d'_1} =$$

$$\alpha \prod_{i=d_1+1}^{d_2-1}\left(\frac{I+g_i^{(d'_1)}}{2}\right)|0\rangle_{d1} \otimes |0\rangle^{\otimes(d_2-d_1)} + \beta X_1 \prod_{i=d_1+1}^{d_2-1}\left(\frac{I+g_i^{(d'_1)}}{2}\right)|0\rangle_{d1} \otimes$$

$$|0\rangle^{\otimes(d_2-d_1)}$$

In the above equation $|1\rangle_{d1}=X_1|0\rangle_{d1}$. Also, when measuring $X_{d_1} X_{d_1+1}$ and performing the correction $\prod_{i=1}^{d_1} Z_i$ if the measurement outcome is −1, $|\psi\rangle_3$ is projected to:

$$|\psi_f\rangle = \prod_{i=d_1+1}^{d_2-1}\left(\frac{I+g_i^{(d'_1)}}{2}\right)\left(\frac{I+X_{d_1} X_{d_1+1}}{2}\right)\prod_{j=1}^{d_1-1}\left(\frac{I+g_i^{(d'_1)}}{2}\right)|0\rangle^{\otimes d_2} +$$

$$\beta X_1 \prod_{i=d_1+1}^{d_2-1}\left(\frac{I+g_i^{(d'_1)}}{2}\right)\left(\frac{I+X_{d_1} X_{d_1+1}}{2}\right)\prod_{j=1}^{d_1-1}\left(\frac{I+g_i^{(d'_1)}}{2}\right)|0\rangle^{\otimes d_2} =$$

$$\alpha \prod_{i=1}^{d_2-1}\left(\frac{I+g_i^{(d'_1)}}{2}\right)|0\rangle^{\otimes d_2} +$$

$$\beta X_1 \prod_{i=1}^{d_2-1}\left(\frac{I+X_i X_{i+1}}{2}\right)|0\rangle^{\otimes d_2} = \alpha|0\rangle_{d_2} + \beta X_1|0\rangle_{d_2} = |\psi\rangle_{d_2}$$

Figure 16:
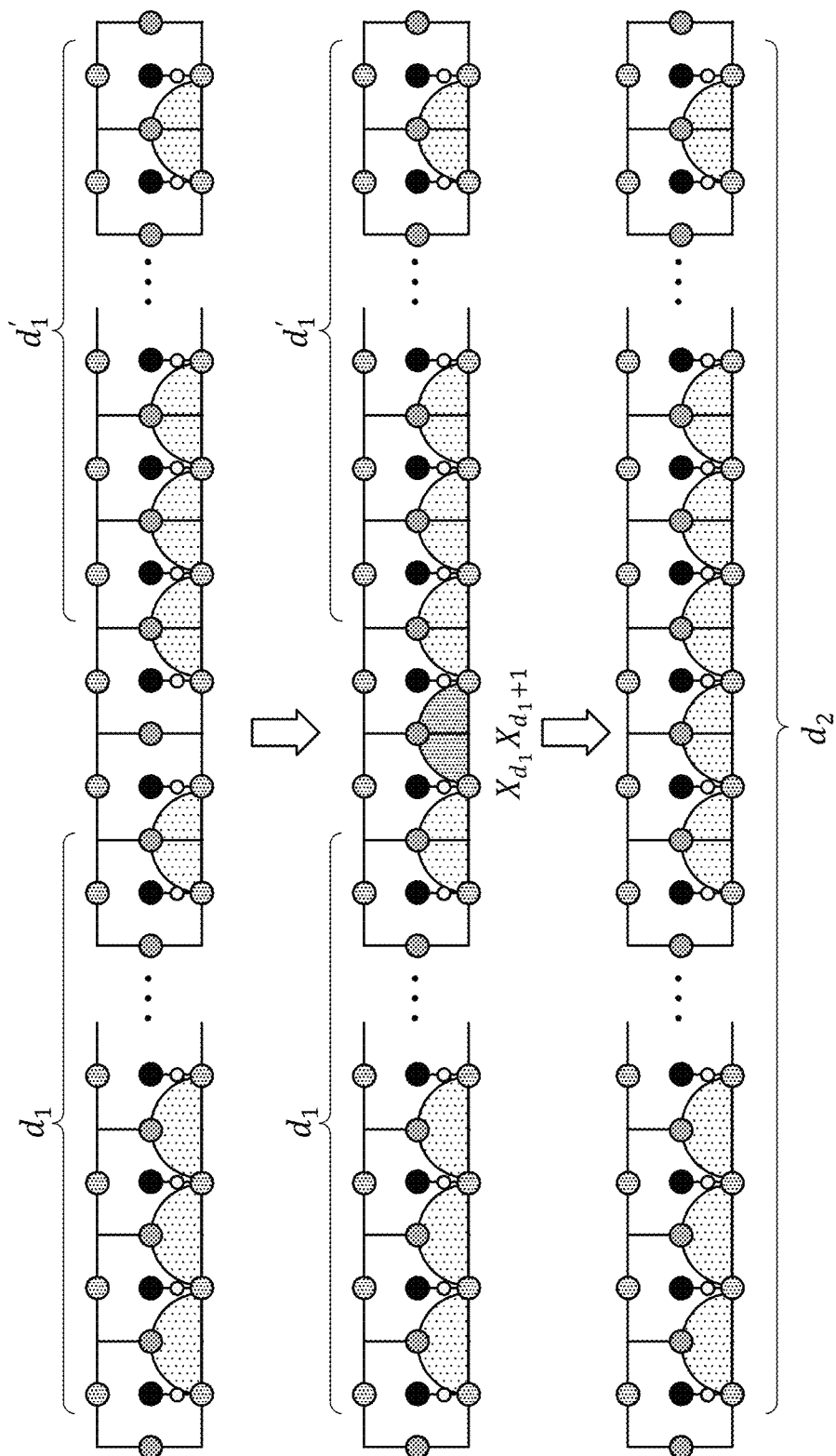
FIG. 16 illustrates growing the computational basis state of $|\psi_1\rangle$, from a first code distance ($d_1$) to a second code distance ($d_2$), according to some embodiments.

The rounds of repeated stabilizer measurements in steps 3 and 5 (above) may be required due to the random outcomes and measurement errors which can occur when performing the appropriate projections. A pictorial representation for the growing scheme is shown in FIG. 16.

Bottom-Up Fault Tolerant Preparation of the $|TOF\rangle$ Magic State

In some embodiments, a $|TOF\rangle$ magic state can be prepared using the repetition code, wherein the $|TOF\rangle$ magic state is used in simulating a Toffoli gate.

The |TOF⟩ magic state is given by:

|TOF⟩=½Σ$_{x_1,x_2}$|X$_1$⟩|X$_2$⟩|X$_1$∧X$_2$⟩, which is stabilized by the Abelian group $S_{TOF}$=⟨$g_A,g_B,g_C$⟩ where
$g_A$=X$_1$CNOT$_{2,3}$
$g_B$=X$_2$CNOT$_{1,3}$
$g_C$=Z$_3$CZ$_{1,2}$

Figures 11A, 11B:
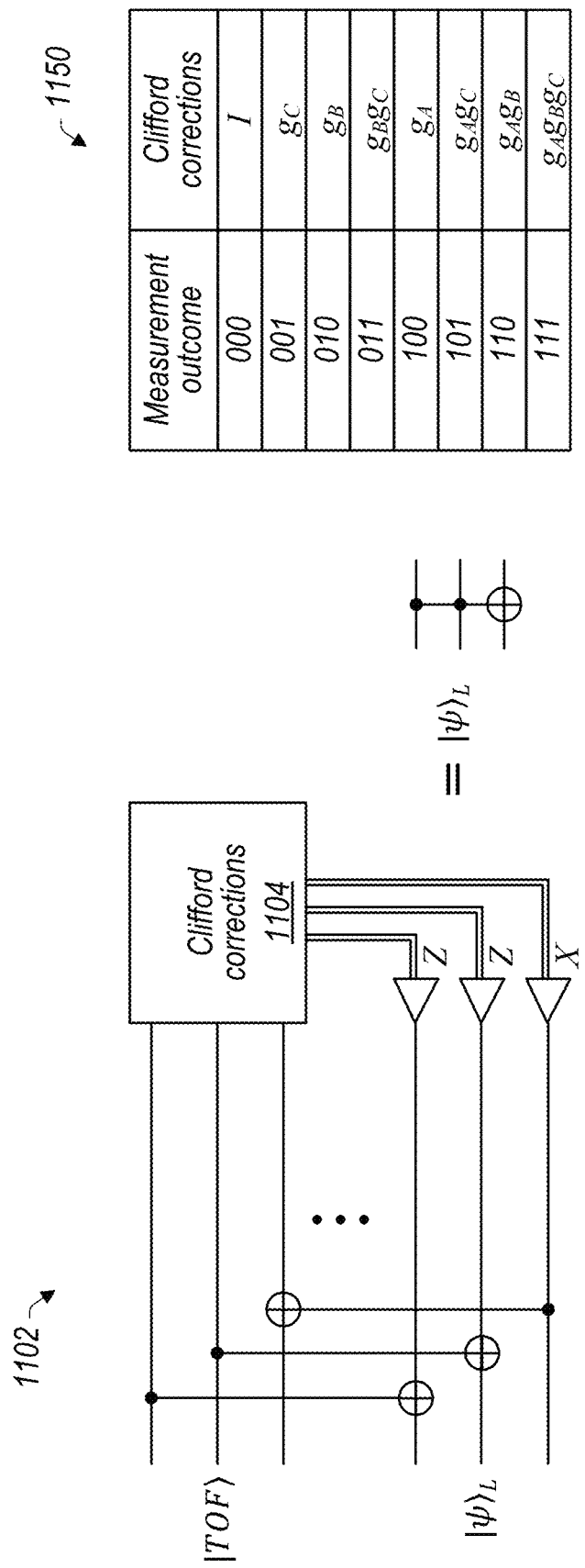
FIG. 11A illustrates a circuit for implementing a logical Toffoli gate using Toffoli magic state injection, wherein X and Z basis are measured, according to some embodiments.
FIG. 11B illustrates a table of Clifford error corrections to be applied based on the Z and X measurement basis of the circuit shown in FIG. 11A, according to some embodiments.

Given one copy of a |TOF⟩ magic state, a Toffoli gate can be simulated using the circuit 1102 in FIG. 11A, and the required Clifford corrections are given in FIG. 11B. Note that if a correction involves the stabilizer $g_C$, the CZ gate can be implemented using the circuit 1200 in FIG. 12. Also, note that for the Clifford corrections a 0 indicates a +1 measurement outcome whereas a 1 indicates a −1 measurement outcome (in either the X or Z basis). The stabilizers $g_A$, $g_B$ and $g_C$ are given in the equations above.

Figure 13:
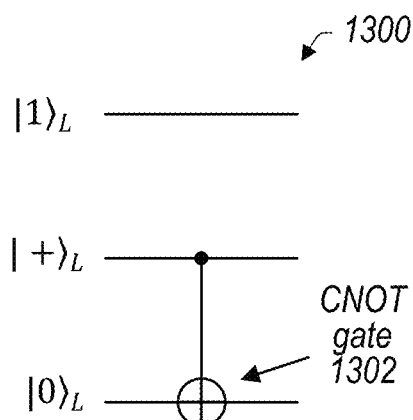
FIG. 13 illustrates a circuit for preparing the computational basis state $|\psi_1\rangle$, according to some embodiments.

Next, how to fault-tolerantly prepare the |TOF⟩ magic state is discussed. First, note that the state $$|\psi_1\rangle = \frac{1}{\sqrt{2}}(|010\rangle + |111\rangle)$$

is stabilized by $g_A$ and $g_C$. Such a state can straightforwardly be prepared using the circuit 1300 in FIG. 13. In what follows, physical Toffoli gates will need to be applied between ancilla qubits and |ψ$_1$⟩ prior to measuring the data. As such, it is important that the states |0⟩$_L$ and |1⟩$_L$ in the circuit 1300 of FIG. 13 be prepared using the STOP algorithm since otherwise measurement errors in the last ancilla measurement round could lead to logical failures. Once |+⟩$_L$, |1⟩$_L$ and |0⟩$_L$ have been prepared, the CNOT gate 1302 in FIG. 13 is applied transversally.

Figure 14:
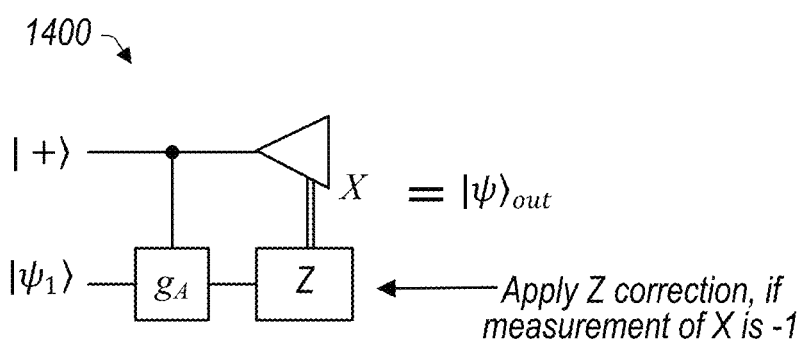
FIG. 14 illustrates a circuit for implementing a first step of a Toffoli magic state preparation using a controlled $g_A$ gate, wherein error correction (EC) is performed for one or more rounds using a STOP algorithm, according to some embodiments.
Figure 17:
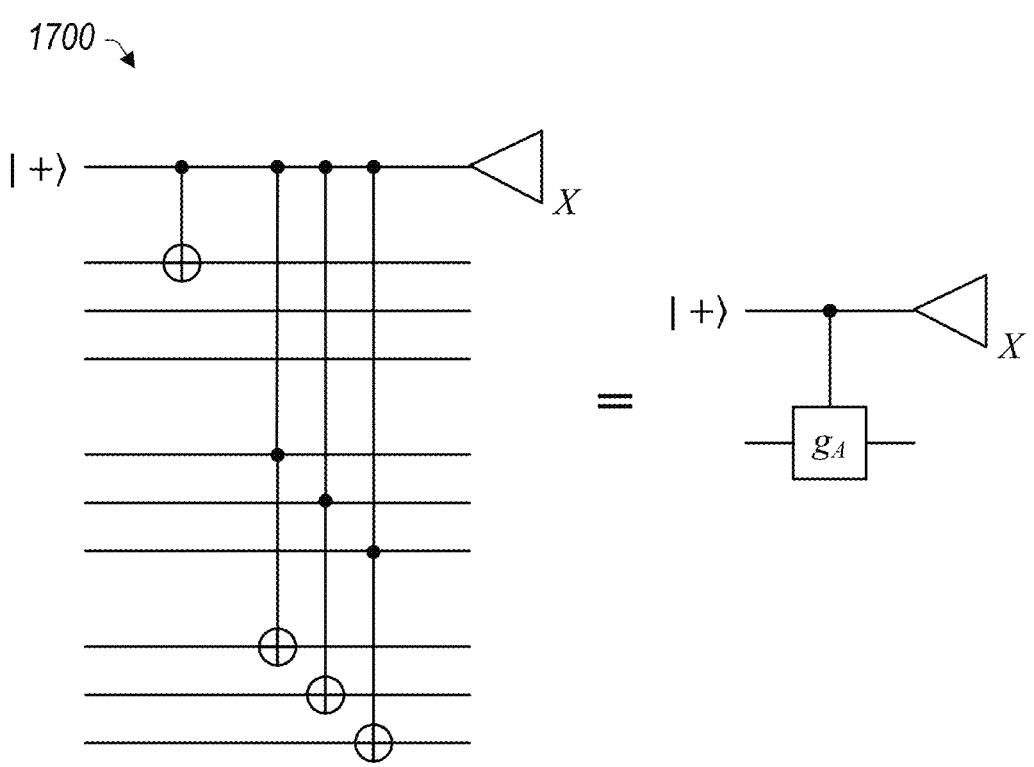
FIG. 17 illustrates a circuit for measuring $g_A$ for a computational basis state $|\psi_1\rangle$ with a code distance of three, according to some embodiments.

Now, given a copy of |ψ$_1$⟩, the |TOF⟩ magic state can be prepared by measuring $g_A$ using the circuit 1400 of FIG. 14 resulting in the state |ψ$_{out}$⟩. If the measurement outcome is +1, |ψ⟩$_{out}$=|TOF⟩. Otherwise, if the measurement is −1, |ψ$_{out}$⟩=Z$_2$|TOF⟩. Hence given a −1 measurement outcome, a logical Z$_L$ correction is applied to the second code block. A more detailed implementation 1700 of the controlled-$g_A$ gate 1400 is shown in FIG. 17. For example, the circuit 1700 is shown for measuring a code with code distance d=3. In general, d Toffoli gates are required. Note that for the repetition code, a single CNOT gate is required since X$_L$=X$_1$. Further, due to the transversal CNOT gates, physical Toffoli gates are applied sequentially as shown in the figure. Note that such a circuit can be used for any Calderbank-Shor-Steane (CSS) code. The sequence of Toffoli gates would remain unchanged. Generally more two-qubit gates would be required depending on the minimal weight representation of X$_L$.

Figure 18:
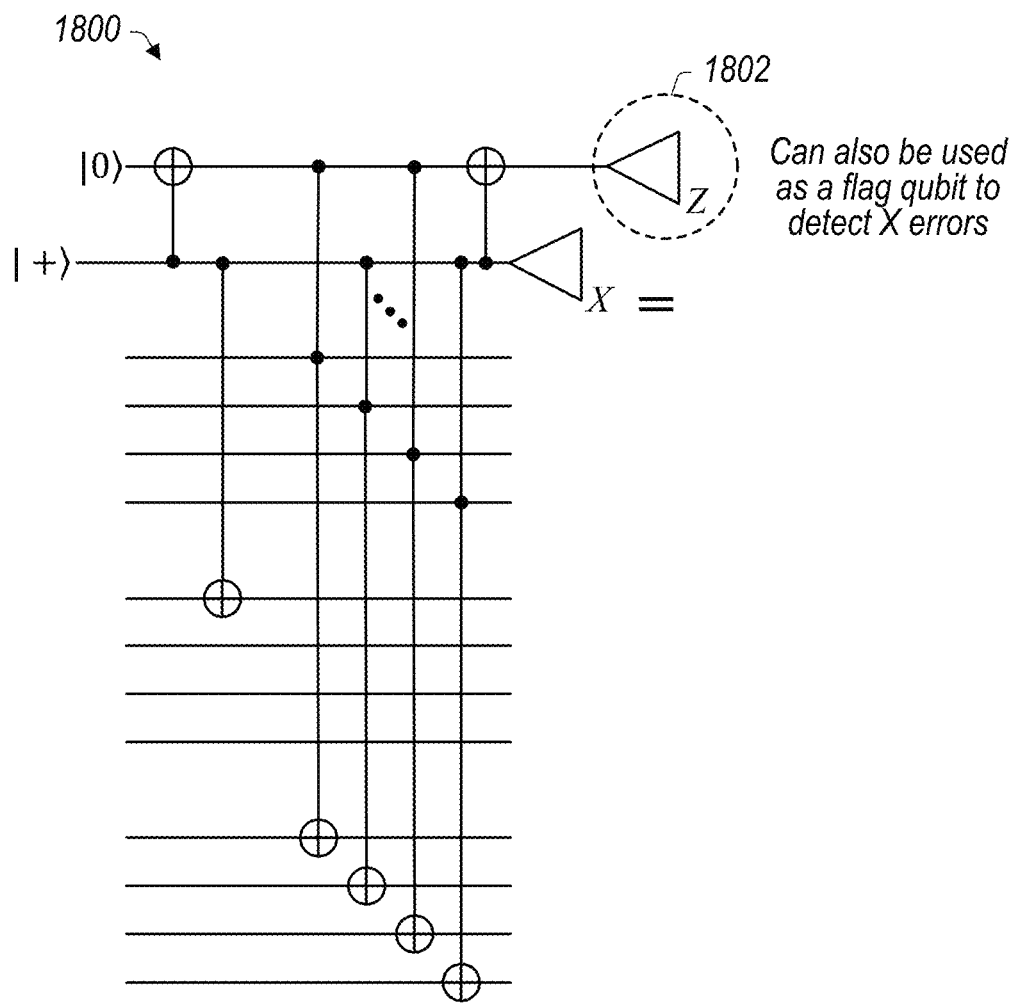
FIG. 18 illustrates an alternative circuit for measuring $g_A$ for a computational basis state $|\psi_1\rangle$ using a flag qubit, according to some embodiments.

Note that since the CNOT$_{1,3}$ gate can be done transversally for the repetition code, and that X$_L$ on the second code block is given by a physical X gate on the first qubit of that block, the controlled-$g_A$ circuit can be highly parallelized thus greatly simplifying its implementation. For example, FIG. 18 illustrates a more parallelized circuit for measuring $g_A$ which requires one flag qubit 1802. Such a circuit reduces the depth of Toffoli gates in half at the cost of adding to time-steps due to the extra CNOT gates. The flag qubit can also be used for detecting X errors arising on the control qubits of the CNOT and Toffoli gates. If an X error occurs, the flag qubit measurement outcome will be −1 instead of +1. As in FIGS. 14, 15, and 17, if either the X or Z basis measurement outcomes are −1 instead of +1, the entire |TOF⟩ magic state preparation protocol is aborted and begins anew.

Figure 15:
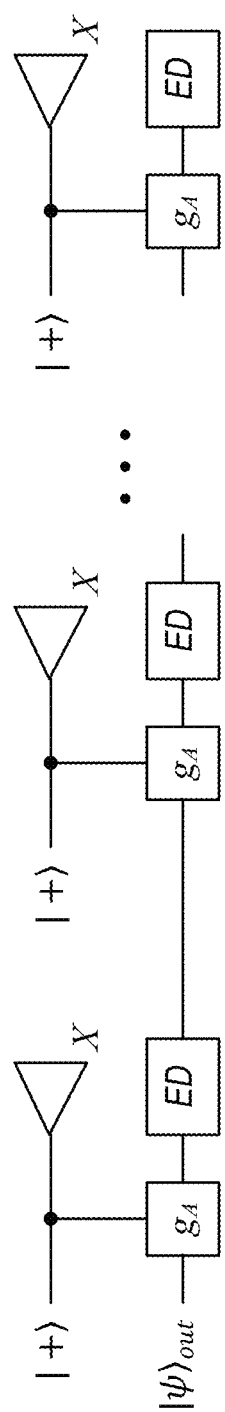
FIG. 15 illustrates circuits for implementing a second step of the Toffoli magic state preparation, wherein the measurement of $g_A$ is repeated a number of times corresponding to a code distance (d) minus one divided by two, wherein a round of repetition code stabilizer measurements are performed between rounds of measuring $g_A$, and wherein the protocol is aborted and started anew if any of the error detection measurements or $g_A$ measurements are non-trivial, according to some embodiments.
Figure 19A:
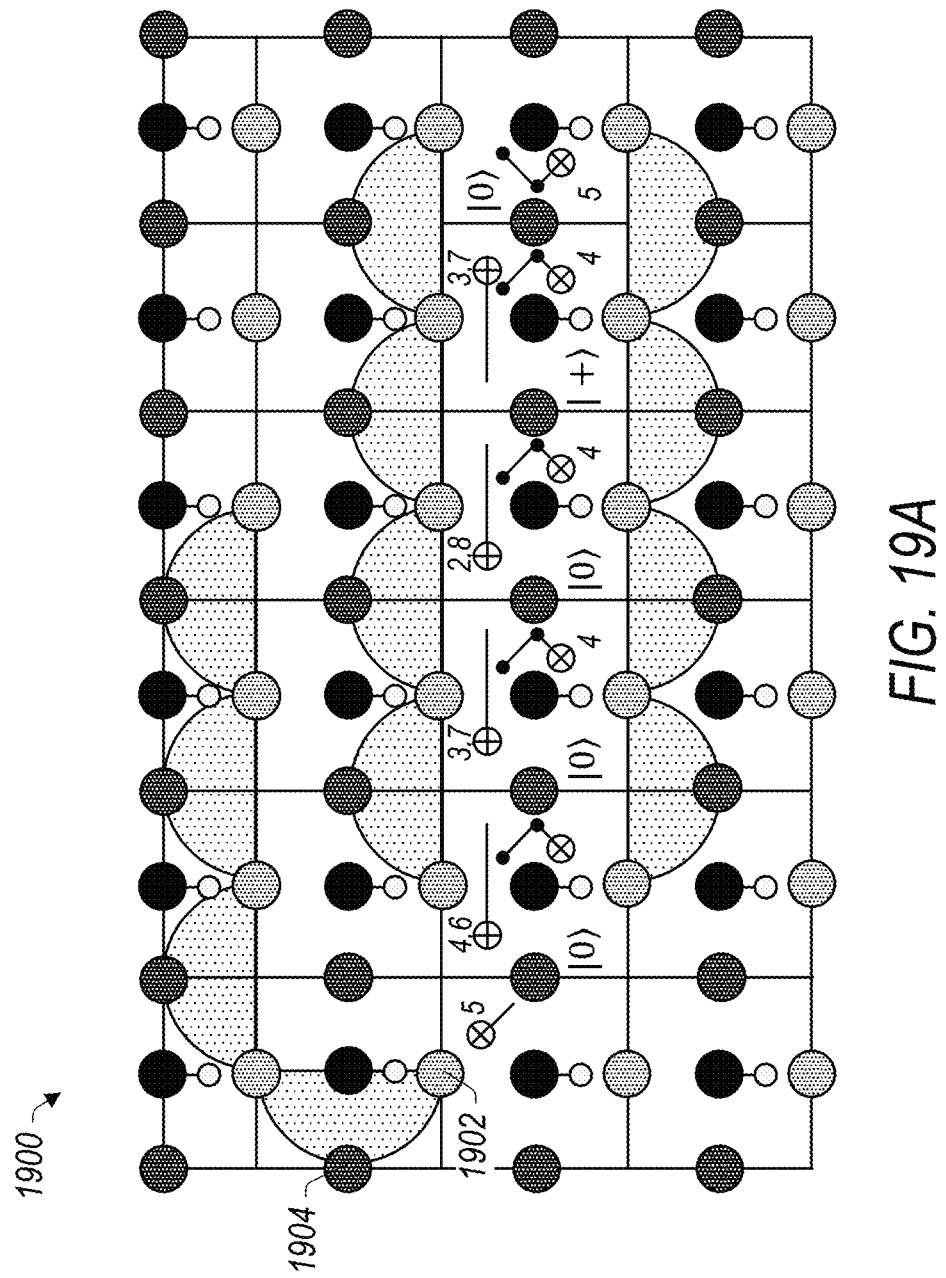
FIG. 19A illustrates an implementation of the $g_A$ measurement for a distance 5 repetition code prepared using a GHZ state, according to some embodiments.

As was also the case as discussed above with regard to the repetition code, a measurement error on the ancilla results in a logical Z$_2$ failure and thus the measurement of $g_A$ needs to be repeated. This can be done deterministically using the STOP algorithm. However due to the increasing circuit depth with increasing repetition code distance in addition to the high cost of the controlled-$g_A$ gate, such a scheme does not have a threshold and results in relatively high logical failure rates. An alternative approach is to use an error detection scheme by repeating the measurement of $g_A$ exactly (d−1)/2 times for a distance d repetition code. In between each measurement of $g_A$, one round of error detection is applied to the data qubits by measuring the stabilizers of the repetition code. This is shown in FIG. 15. If any of the measurement outcomes are non-trivial, the protocol for preparing the |TOF⟩ magic state is aborted and reinitialized. In FIG. 19A, an example 1900 is provided of a two-dimensional layout of qubits and sequence of operations for measuring $g_A$, which is compatible with the above described ATS architecture for a distance 5 repetition code. Such a layout uses a minimum number of ancilla qubits and can be straightforwardly generalized to arbitrary repetition code distances. The ancilla qubits are used to first prepare a GHZ state. Subsequently the required Toffoli and CNOT gates are applied, followed by a disentangling of the GHZ states and measurement of the |+⟩ state ancilla. The equivalent circuit 1950 implementing the $g_A$ measurement for a d=5 repetition code is shown in FIG. 19B.

Notice that to respect the connectivity constraints of the ATS's, the lighter grey vertices 1902 need to be swapped with the darker grey vertices 1904 on the second block (shown in the upper left corner of the lattice of FIG. 19A). Such a role reversal between the ancilla and data qubits does not lead to additional cross-talk errors for the reasons discussed above with regard to a multiplexed ATS with filtering and thus can be tolerated. As such, all controlled $g_A$ measurements in FIG. 15 may be implemented using the circuit 1950 in FIG. 19B with the qubit layout given in FIG. 19A.

Figure 19B:
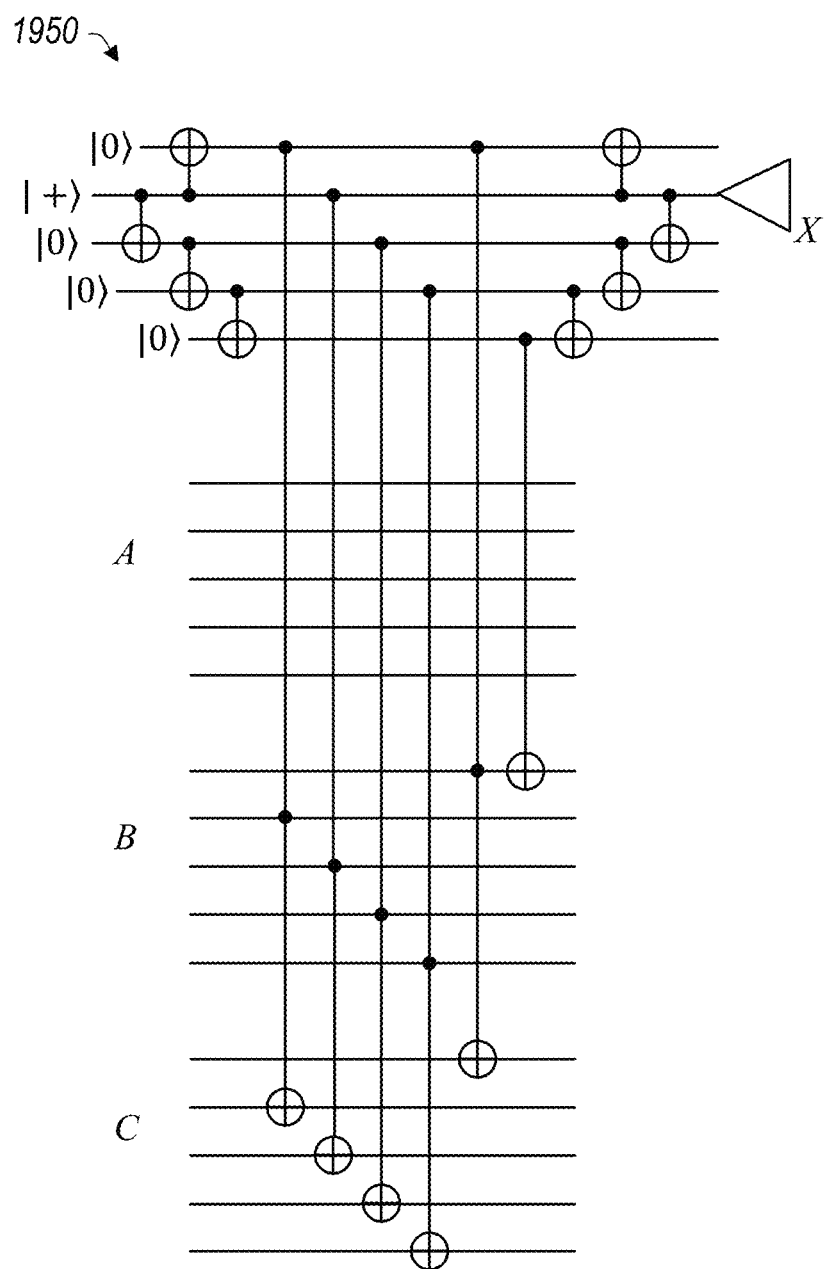
FIG. 19B illustrates a circuit equivalent for implementing the $g_A$ measurement shown in FIG. 19A, according to some embodiments.

Lastly, note that circuit 1950 in FIG. 19B used to measure $g_A$ is not fault-tolerant to X or Y errors. However, since it is assumed that X and Y errors are exponentially suppressed, flag qubits for detecting X-type error propagation are unnecessary as long as X or Y error rates multiplied by the total number of fault locations are below the target levels for algorithms of interest.

Figure 20A:
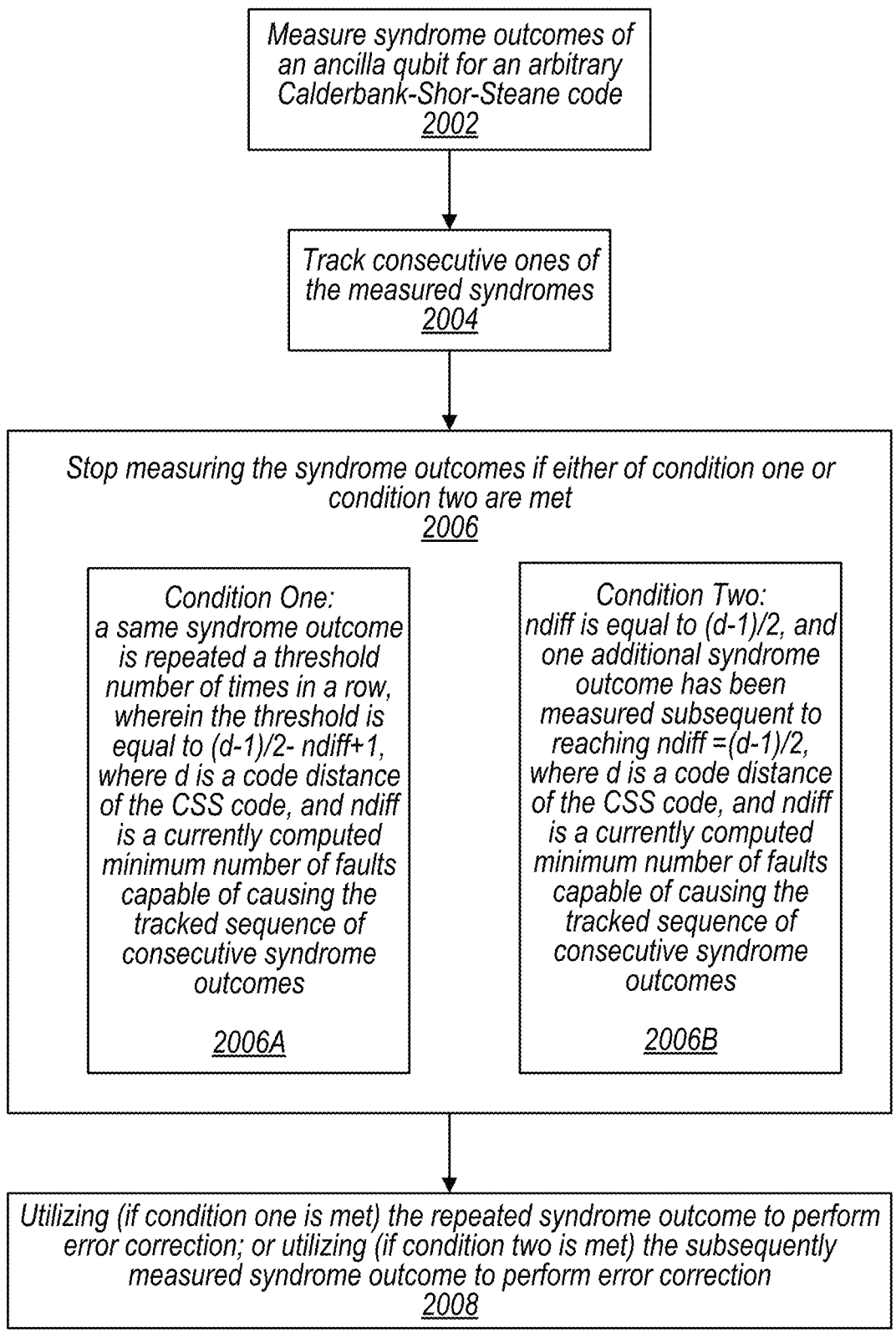
FIG. 20A illustrates high-level steps of a protocol for implementing a STOP algorithm, according to some embodiments.

FIG. 20A illustrates high-level steps of a protocol for implementing a STOP algorithm, according to some embodiments.

At block 2002 syndrome outcome measurements are performed for an arbitrary Calderbank-Shor-Steane code. At block 2004 consecutive ones of the syndrome outcomes are tracked to generate a syndrome history. At block 2006 syndrome measurements are stopped if condition 1 (shown in block 2006A) or condition 2 (shown in block 2006B) are met. Condition one is that a same syndrome outcome is repeated a threshold number of times in a row, wherein the threshold is equal to ((d−1)/2)−n$_{diff}$−1 Condition two is that n$_{diff}$ is equal to (d−1)/2, and one additional syndrome outcome has been measured subsequent to reaching n$_{diff}$=(d−

1)/2. If either of these conditions are met, then the measurements of the syndrome outcomes can be stopped. At block 2008 if condition one is met, the repeated syndrome outcome is used to perform error correction. Also, at block 2008 if condition two is met, the subsequently measured syndrome outcome is used to perform error correction.

Figure 20B:
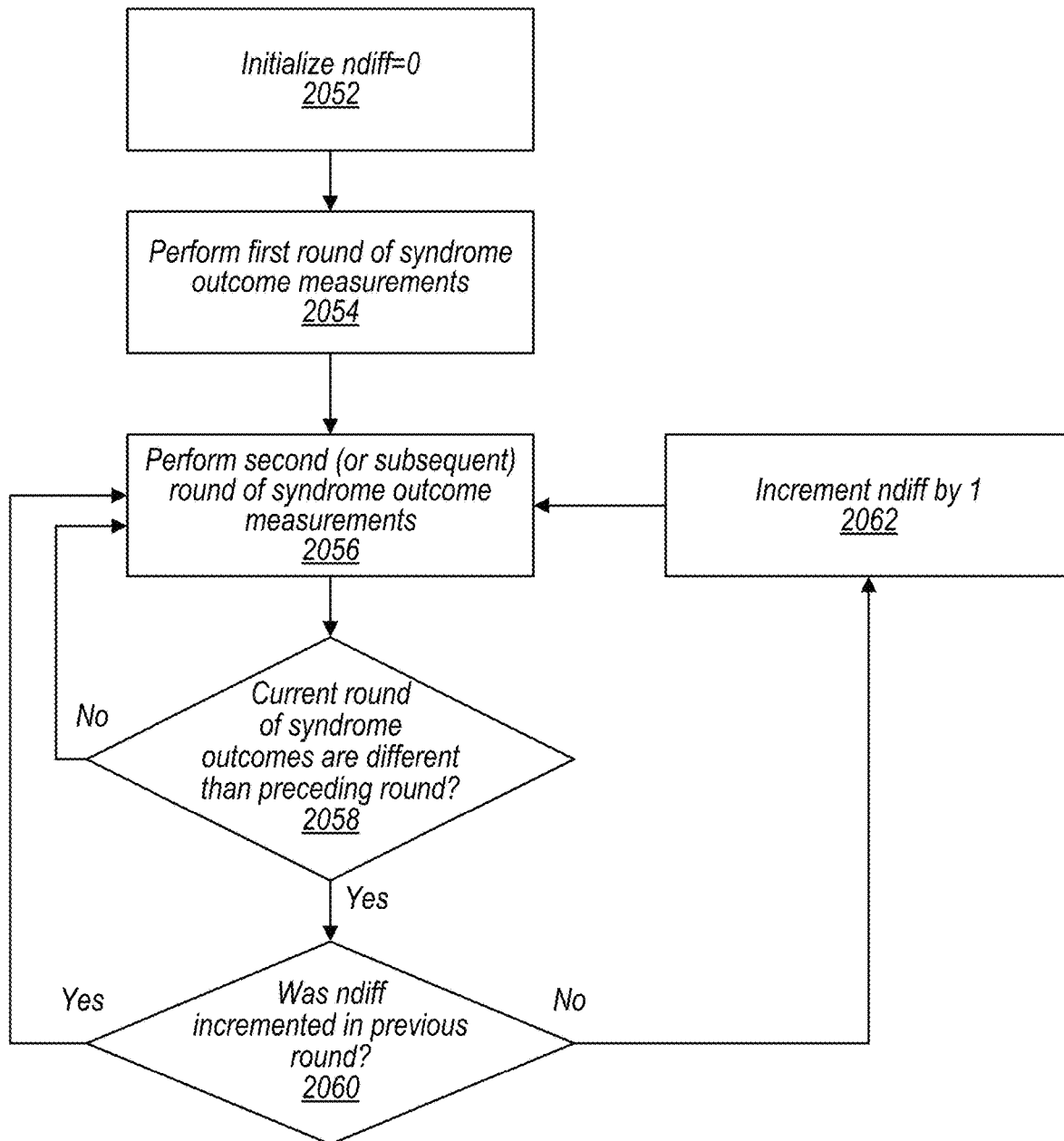
FIG. 20B illustrates high-level steps for determining a parameter ($n_{diff}$) used in the STOP algorithm, according to some embodiments.

FIG. 20B illustrates high-level steps for determining a parameter ($n_{diff}$) used in the STOP algorithm, according to some embodiments.

At block 2052 $n_{diff}$ is initialized with an initial value equal to zero. At block 2054 a first round of syndrome outcome measurements is performed. Also, at block 2056, a second round of syndrome outcome measurements is performed. At block 2058 it is determined if the syndrome outcomes measured in the round performed at block 2056 (e.g. the current round of syndrome outcomes) differ from the syndrome outcomes measured for the preceding round. If so, at block 2060 it is determined if $n_{diff}$ was incremented in the previous round, if not $n_{diff}$ is incremented by one at block 2062 and the process repeats for a subsequent round of syndrome outcome measurements. However, note that when condition one or condition two (as shown in blocks 2006A and 2006B) are met, the syndrome measurements are stopped. If the syndrome outcomes measured in the round performed at block 2056 (e.g. the current round of syndrome outcomes) are the same as the syndrome outcomes measured for the preceding round or it is determined at block 2060 if $n_{diff}$ was incremented for the preceding round, the process reverts to block 2056 and another round of syndrome outcomes are measured without incrementing $n_{diff}$.

Figure 21:
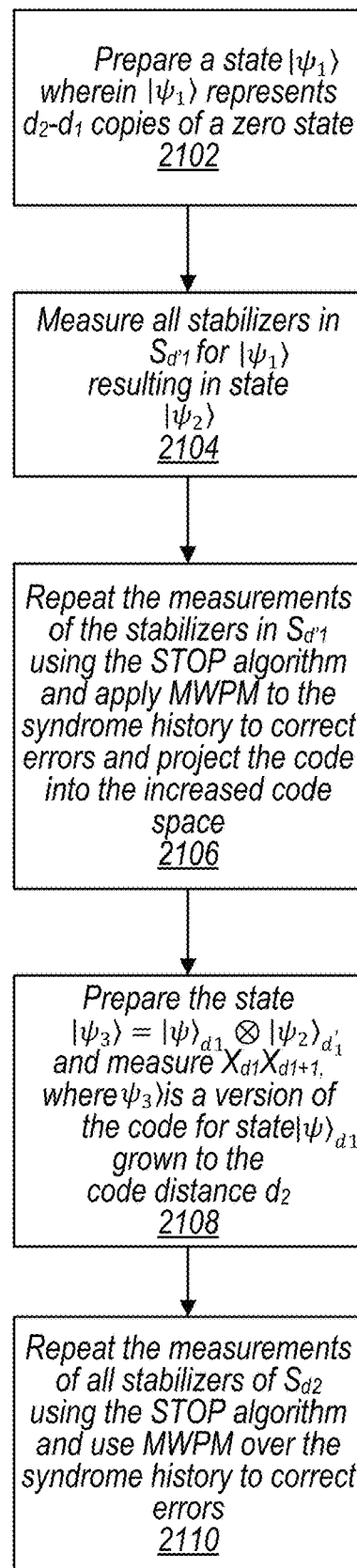
FIG. 21 illustrates high-level steps of a protocol for growing a repetition code from a first code distance to a second code distance using a STOP algorithm, according to some embodiments.

FIG. 21 illustrates high-level steps of a protocol for growing a repetition code from a first code distance to a second code distance using a STOP algorithm, according to some embodiments.

At block 2102 a $|\psi_1\rangle$ state is prepared as described above, for example using the circuit shown in FIG. 13. At block 2104, all stabilizers $S_{d'1}$ are measured resulting in a state $|\psi_2\rangle$. This may be done as described above with regard to stabilizer operations for the repetition code. At block 2106, the measurements of the stabilizers in $S_{d'1}$ are repeated using the STOP algorithm and MWPM is applied to the syndrome history to correct errors and project the code into the increased code space. At block 2108 a 103) state is prepared and $X_{d1}X_{d1+1}$ are measured. At block 2110 the measurements of all the stabilizers of $S_{d2}$ are repeated using the STOP algorithm and MWPM is applied over the syndrome history to correct errors.

Figure 22:
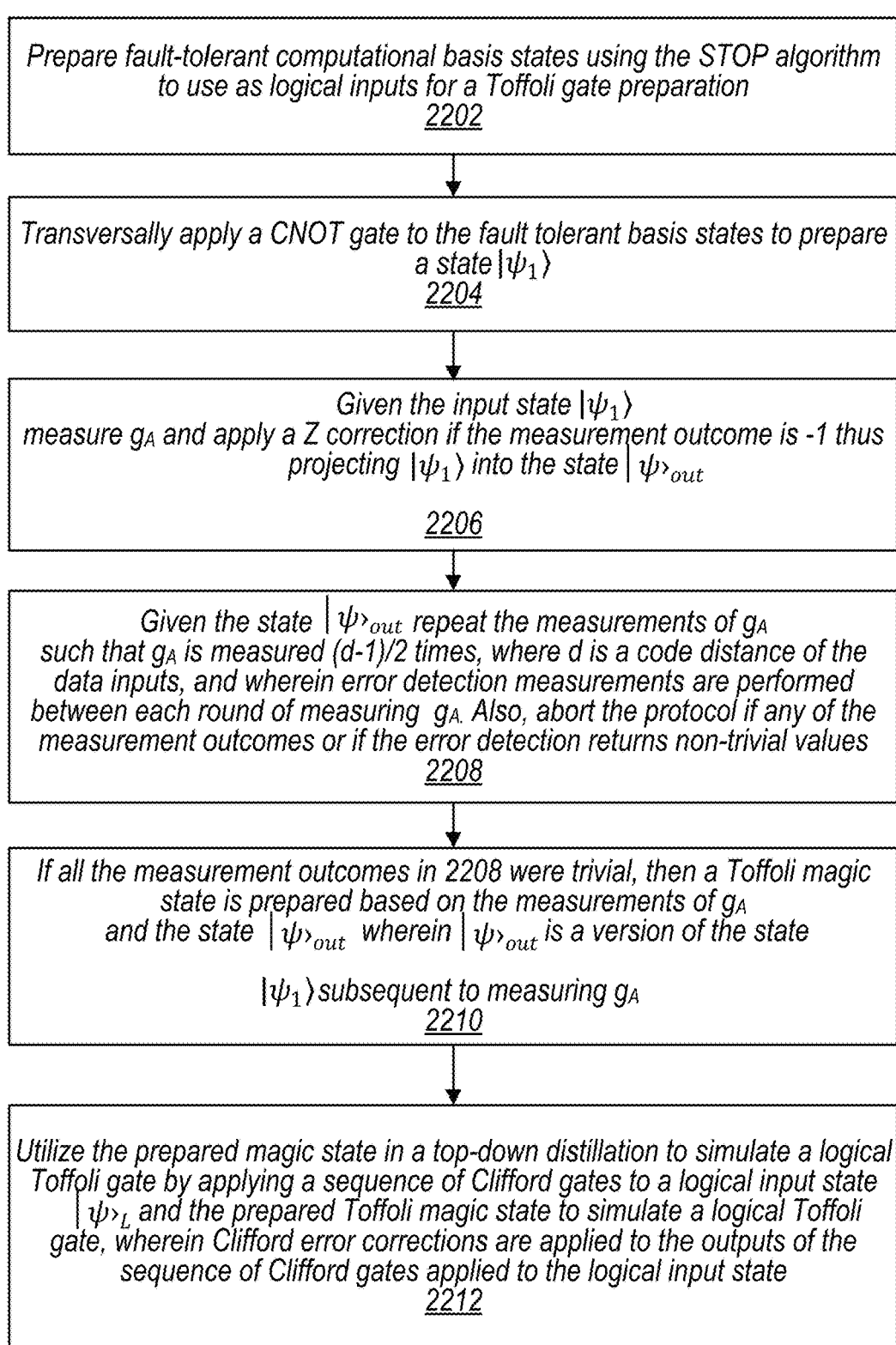
FIG. 22 illustrates high-level steps of a protocol for implementing a logical Toffoli gate using a bottom-up approach with Toffoli magic state injection, according to some embodiments.

FIG. 22 illustrates high-level steps of a protocol for implementing a logical Toffoli gate using a bottom-up approach with Toffoli magic state injection, according to some embodiments.

At block 2202, fault-tolerant computational basis states are prepared using the STOP algorithm, wherein the fault-tolerant computational basis states are to be used as inputs for a Toffoli gate preparation. At block, 2204, a CNOT gate is transversally applied to the fault-tolerant computational basis states to prepare a $|\psi_1\rangle$ state. At block 2206 $g_A$ is measured for the $|\psi_1\rangle$ state, which yields a state $|\psi_{out}\rangle$. If the measurement of $g_A$ has a measurement outcome of −1 then a Z correction is applied. This projects the $|\psi_1\rangle$ state into a $|TOFF\rangle$ state. At block 2208 the measurements of $g_A$ are repeated such that $g_A$ is measured (d−1)/2 times. Between rounds of measurement of $g_A$, error detection is performed. If non-trivial values are measured for either $g_A$ or the error detection, the protocol is aborted and re-initiated anew. At block 2210, if all the measurement outcomes of $g_A$ and the error detection performed at 2208 are trivial, a Toffoli magic state (e.g. $|TOFF\rangle$ state) is prepared based on the measurement of $g_A$ and the state $|\psi_{out}\rangle$. For example, if all the measurement outcomes of $g_A$ and the error detection performed at 2208 are trivial, then $|\psi_{out}\rangle=|ToFF\rangle$. At block 2212 a sequence of Clifford gates as shown in circuit 1102 of FIG. 11A are applied. Also the Clifford error corrections shown in FIG. 11B are applied. This may be done as part of a top down distillation of a logical Toffoli gate (as described in more detail below) that utilizes the prepared Toffoli magic state as an input to the distillation process.

Top-Down Distillation Process to Yield Low-Error Rate Toffoli Gates

As discussed above, the Toffoli gate when combined with the Clifford group forms a universal gate set for quantum computation. Alternatively, universality can be achieved by complementing the Clifford group with a supply of high-fidelity Toffoli magic states encoded in a suitable quantum error correction code. For many high threshold error correction codes, such as repetition (for very biased noise) or surface codes, high fidelity Toffoli magic states are difficult to prepare. The paradigm of magic state distillation uses encoded Clifford operations to distill higher fidelity magic states from lower fidelity magic states. For example, the Toffoli magic states prepared using the bottom-up approach described above may be used as in a magic state distillation process to yield even lower fault-rate Toffoli magic states.

The conventional approach to magic state distillation uses a supply of low fidelity T magic states as inputs to protocols that output other types of magic state, including TOFF states. However, in some architectures the supply of noisy TOFF states can be prepared at better fidelity than the noisy T states. This is because all Calderbank-Shor-Steane (CSS) codes, such as surface and repetition codes, have a transversal CNOT and this property can be used to robustly prepare the TOFF state (as described above for bottom-up approach). However, the success probability of such "bottom-up preparation" protocols drops as the target fidelity is increased and so it is desirable to design magic distillation protocols that can further purify noisy TOFF states at low overhead. If the bottom-up TOFF protocol is used to prepare TOFF states with $10^{-5}$-$10^{-6}$ error rates, then for several quantum algorithms only a single round of magic state distillation would be need to achieve $10^{-9}$-$10^{-10}$ logical error rates. In contrast, for T states prepared at $10^{-3}$-$10^{-4}$ error rates, to achieve comparable logical error rates would require two rounds of magic state distillation with quadratic error suppression, or alternatively a single round of the 15T→1T protocol with low (1/15) rate.

In some embodiments, to address these uses a top-down distillation process is performed that uses TOFF or CCZ states without using any T states, either as raw distillation material or as catalysts. Also triorthgonal codes are not used in the usual sense, but instead provide a new technique for protocol design by describing CCZ circuits in terms of cubic polynomials. It is noted that CCZ states are Clifford equivalent to TOFF states, and when using cubic polynomial formalism, it will be beneficial to work in the language of CCZ states. As an example of these techniques, it is shown that it is possible to achieve 8CCZ→2CCZ distillation, equivalently 8TOFF→2TOFF detecting a fault on any single TOFF state. In cases where noise on the CCZ state is very biased towards certain types of faults, more compact and efficient protocols are possible, which are also described.

In some embodiments, various architectures may be used to implement the distillation processes described herein, such as a 2D architecture using the repetition code, asymmetric surface codes (for biased noise) or conventional square surface codes. The 2D implementation performs the required Clifford operations using lattice surgery to realize a suitable sequence of multi-qubit Pauli observables (also called multi-patch measurements).

Figure 23:
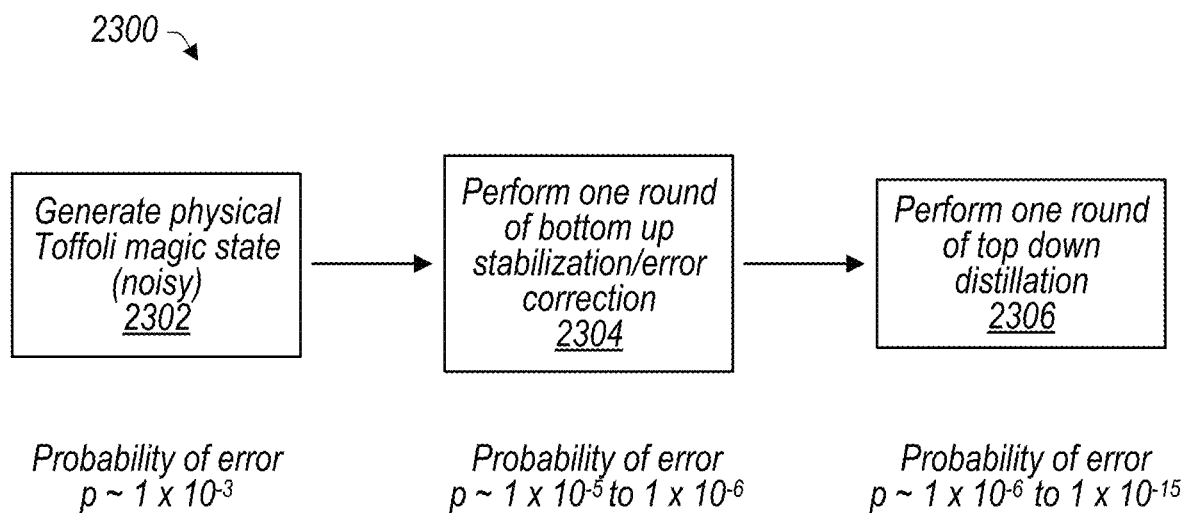
FIG. 23 illustrates high-level steps for distilling a low-error rate logical Toffoli gate using multiple ones of the Toffoli magic states prepared using a bottom-up approach as described in FIG. 22, according to some embodiments.

FIG. 23 illustrates high-level steps for distilling a low-error rate logical Toffoli gate using multiple ones of the logical Toffoli gates prepared using a bottom-up approach as described in FIG. 22, according to some embodiments.

For example, at 2302 physical Toffoli magic states are generated, which may have a probability of error of approximately $2.8 \times 10^{-4}$. This error probability may be improved by an order of magnitude or more by applying the STOP algorithm and error correction techniques described above for the bottom-up approach. For example, block 2304 illustrates the improvements in error-rate that are realized by utilizing the bottom-up approach. However, further improvements in error rate can be achieved by performing a top-down distillation process. For example, block 2306 illustrates that error probabilities may be reduced to approximately $8 \times 10^{-10}$ by performing a single round of distillation using Toffoli magic states prepared using the bottom up approach as inputs.

Figure 24:
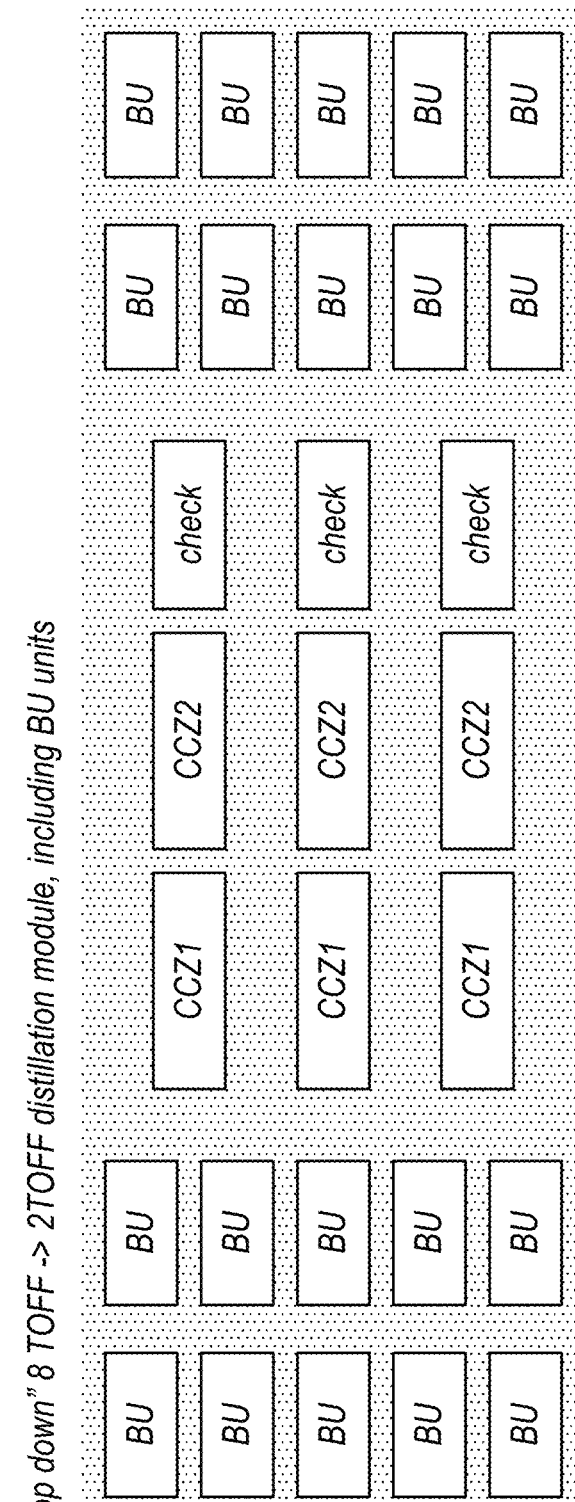
FIG. 24 illustrates a layout of multiple bottom up Toffoli magic states that are used to distill low-error rate logical Toffoli gates, according to some embodiments.

FIG. 24 illustrates a layout of multiple bottom up Toffoli gates that are used to distill low-error rate logical Toffoli gates, according to some embodiments.

To give a general view of the distillation process, FIG. 24 illustrates a circuit 2400 that includes qubits that have been prepared to implement bottom up (e.g. "BU") magic states. Also other qubits of the circuit have been prepared to implement CCZ magic states (or low-error rate Toffoli magic states/gates). Additionally, some of the qubits implement an error check for the CCZ magic states. For example each set of check qubits may be associated with a pair of CCZ magic states.

Synthesis

First, observe that a $CCZ_{i,j,k}$ gate on qubits i, j and k, will perform:

$$CCZ_{i,j,k}|x_1, x_2, x_3, \ldots, x_n\rangle = (-1)^{x_i x_j x_k}|x_1, x_2, x_3, \ldots, x_n\rangle$$

where $|x\rangle = |x_1, x_2, x_3, \ldots, x_n\rangle$ represents a computational basis state described as a binary string $x=(x_1, x_2, x_3, \ldots, x_n)$. More generally, consider conjugating these CCZ gates with a CNOT circuit. For any invertible matrix J, there exists a CNOT circuit V such that $$V = \Sigma_x |x\rangle \langle Jx|.$$

Composing these operations a generalized CCZ gate is given by:

$$CCZ_{(j_1, j_2, j_3)} := V^\dagger CCZ_{1,2,3} V |x\rangle = (-1)^{(J_1 X)(J_2 X)(J_3 X)} |x\rangle$$

where $J_k$ is the $k^{th}$ column vector of J and $J_k x = \Sigma_\alpha [J_k]_\alpha x_\alpha$ is the dot product between this vector and the bit string vector x. Because J is invertible, the $J_k$ must be linearly independent, but otherwise there are no constraints. Furthermore, only three column vectors are needed to describe the action of a single generalized CCZ gate.

Figure 25:
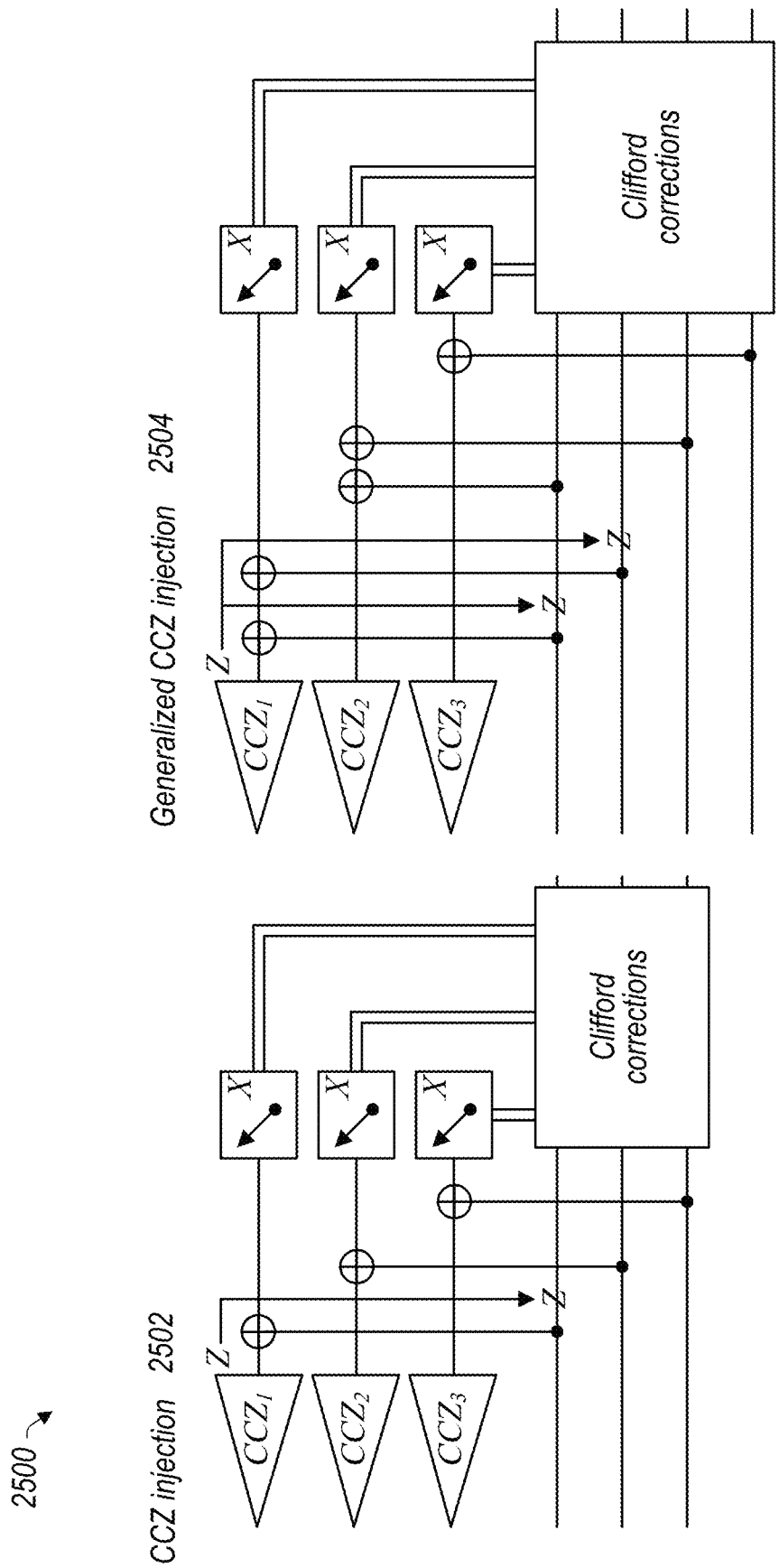
FIG. 25 illustrates a gadget for injection of CCZ gates using a $|CCZ\rangle$ magic state and a gadget for generalized CCZ injection for a unitary, according to some embodiments.

Alternatively, a generalized CCZ gate can be realized using a single CCZ magic state as shown in 2504 FIG. 25. The CCZ magic state is:

$$|CCZ\rangle = CCZ|+\rangle|+\rangle|+\rangle = \frac{1}{2\sqrt{2}} \sum_{y \in \mathbb{Z}_2^3} (-1)^{y_1 y_2 y_3} |y_1\rangle|y_2\rangle|y_3\rangle$$

and it can be used to inject a CCZ gate as illustrated in FIG. 25 and which can be extended to generalized CCZ gates by controlling the CNOT gates determined by the associated vectors $J_1$, $J_2$, and $J_3$. Furthermore, the CNOTs in the CCZ injection can be replaced with a sequence of multi-qubit Pauli measurements, which are the primitive operations in lattice surgery based architectures.

In some embodiments, a unitary as shown below can be composed using CCZ, CZ, Z and CNOT gates:

$$U = \Sigma_x (-1)^{f(x)} |Jx\rangle \langle z|$$

where J is invertible and $f: \mathbb{Z}_2^n \to \mathbb{Z}_2$ is some Boolean function expressible as a cubic polynomial. Formally, this can be expressed as shown below in Theorem 1:

Theorem 1: Let U be a unitary of the form of the equation above with a function $f$ such that there exists a cubic polynomial representation:

$$f(x) = \sum_{a \leq b \leq c} F_{a,b,c} x_a x_b x_c$$

with integers $F_{i,j,k}$. It follows that there are many different factorizations of the polynomial as follows:

$$f(x) = \sum_{j=1}^{\zeta} (J_1^j \cdot x)(J_2^j \cdot x)(J_3^j \cdot x) + x^T Q x$$

where $J_k^j$ are binary vectors (and therefore linear functions) and a Q is a lower-triangular binary matrix (representing a quadratic Boolean function). Then there exists a circuit composed of {CCZ, CZ, Z, CNOT} that implements U using at most $\zeta$ copies of the CCZ gates. We call the minimal such the cubic rank of the polynomial.

CCZ Magic State Distillation

In some embodiments, cubic polynomial formalism is used to develop routines for distillation of high-fidelity $|CCZ\rangle$ magic states. For example, given a supply noisy $|CCZ\rangle$ states with Z noise, the noisy $|CCZ\rangle$ states can be distilled using Clifford operations to obtain a smaller number of $|CCZ\rangle$ states with less noise. Note that given any noise model, $|CCZ\rangle$ magic states can be twirled so that the noise becomes pure Z noise. Accordingly, in some embodiments, a circuit is designed to realize a target unitary, say $U = |CCZ\rangle^{\otimes k}$ that acts on 3k qubits plus some number m of check qubits. However, instead of minimizing the number of CCZ gates in the circuit, the proposed design is such that Z errors on the $|CCZ\rangle$ magic state propagate onto the check qubits. Therefore, by measuring the check qubits at the end of the circuit, errors can be detected on the noisy $|CCZ\rangle$ states.

To be more precise about the error correction properties of a circuit, as an example, take the following definitions:

Definition 1: Given two Boolean functions $f$ and $g$ that can be expressed as cubic polynomials, it can be said they are Clifford-equivalent $f \sim g$ if and only if there exists a Boolean function q expressible as a quadratic function, such that $f(x) = g(x) + q(x)$ for all x.

If f∼g, then clearly they also have the same cubic rank, and the associated unitaries have the same minimal CCZ count.

Definition 2: Given a sequence of (generalized-CCZ gates described by the set of column vectors $\{J_1^j, J_2^j, J_3^j\}_{j=1,\ldots,\zeta}$ as used in the equation above in the Synthesis discussion a set of matrices $J_j$ is defined each with three columns as follows:

$$J^j = (J_1^j, J_2^j, J_3^j) = \begin{pmatrix} L^j \\ C^j \end{pmatrix}$$

If the last m qubits are considered as check qubits, then the matrices are partitioned into $C^j$ (the bottom m rows) and $L^j$ as shown.

It is noted that $C=(C^1, C^2, C^3, \ldots, C^\zeta)$ and $L=(L^1, L^2, \ldots, L^\zeta)$ play a role analogous to X-check and logical X operator matrices of quantum code. Also error notation for the error patterns on the initial magic states is needed.

Definition 3: Given a $|CCZ\rangle^{\otimes \zeta}$ magic state, it is said that it has error pattern $e=(e_1, e_2, e_3) \in \mathbb{Z}_2$ error if it is in the state $E|CCZ\rangle = (Z^{e_1} \otimes Z^{e_2} \otimes Z^{e_3})|CCZ\rangle$ Given a sequence of $\zeta$ generalized-CCZ gates, the notation used is $e^j=(e_1^j, e_2^j, e_3^j)$ to denote the error for the jth $|CCZ\rangle$ state, so that the joint state is:

$$E|CCZ\rangle^{\otimes k}{}_{j=1}^{\zeta} \otimes (Z^{e_1^j} \otimes Z^{e_2^j} \otimes Z^{e_3^j})|CCZ\rangle$$

It is said that an error has w fault-locations if $e^j$ is non-zero for w of the $|CCZ\rangle$ states.

The distinction between notion used above with regard to weight and the usual Hamming weight of the concatenated string $(e^1, \ldots, e^\zeta)$ is important because many methods of preparing a noisy $|CCZ\rangle$ state will lead to errors such as $Z \otimes Z \otimes \mathbb{1}$ that have a comparable probability to a single qubit error $Z \otimes Z \otimes \mathbb{1}$. Indeed, we will typically be interested in knowing how many $|CCZ\rangle$ states are affected by an arbitrary error, though it is assumed errors are uncorrelated between different $|CCZ\rangle$ states. Observations about error propagation in FIG. 25 can now be formalized as follows:

Given unitary U realized by a sequence of generalized CCZ gates represented by matrices as in Def. 2 with magic states suffering Pauli error $(e^1, \ldots, e^\zeta)$. Then the resulting unitary on the target qubits is UZ[w], where $Z[w]=_{j=1}^{n}\otimes Z^{w_n}$ and the vector $w \in \mathbb{Z}_2^n$ is $$w = \sum_j J^j e^j$$

Identifying the last m qubits as check qubits, w can be partitioned into two parts as follows:

$$u = \sum_j L^j e^j$$

$$v = \sum_j C^j e^j$$

Now knowing how errors propagate generally, this knowledge can be applied to a specific protocol, such as distillation of 2 low-error rate logical Toffoli gates from 8 noisy Toffoli magic states, or a distillation of 1 low-error rate logical Toffoli gate from 2 noisy Toffoli magic states.

Consider a unitary U realized by a sequence of generalized CCZ gates represented by matrices as in Def. 2 and with the last m qubits identified as check qubits and $U=U_C(U_L \otimes \mathbb{1}_m)$ where $U_C$ is Clifford and $\mathbb{1}_m$ acts on the check qubits. Consider the following protocol:

1.) Prepare all qubits in the state $|+\rangle$;
2.) Perform the Clifford inverse $U_C^{-1}$ and any Clifford corrections from gate injection;
3.) Measure the last m qubits in the X basis.

Then X basis measurements in step 4 will yield +1 outcomes provided the magic state error pattern satisfies:

$$(0, 0, \ldots, 0)^T = \sum_j C^j e^j$$

The protocol outputs the magic state $Z[u]U_L+\rangle^{\otimes n}$ with error $Z[u]$ that is trivial whenever $$(0, 0, \ldots, 0)^T = \sum_j L^j e^j$$

Example Protocols

Consider the 2CCZ→1CCZ protocol with $J^j$ matrices:

$$\begin{pmatrix} 1 & 0 & 0 \\ 0 & 1 & 0 \\ 0 & 0 & 1 \\ 1 & 0 & 0 \end{pmatrix}, \begin{pmatrix} 0 & 0 & 0 \\ 1 & 1 & 0 \\ 0 & 0 & 1 \\ 1 & 0 & 0 \end{pmatrix}$$

It is straightforward to verify that the corresponding cubic polynomial is:

$$f(x) = x_2 x_3 x_4 + x_2^2 x_3 = x_2 x_3 x_4 + x_2^2 x_3 \sim x_1 x_2 x_3$$

So the circuit realizes $U=CZ_{2,3}(CCZ_{1,2,3}) \otimes \mathbb{1}_4$, which is a single CCZ gate and (up to a Clifford) it acts trivially on the check qubit. There is only a single check qubit $v_1 = e_1^1 + e_1^2$. Therefore, it detects any error pattern where $1 = e_1^1 + e_1^2$, which includes a single $(Z \otimes \mathbb{1} \otimes \mathbb{1})$ error on either input magic state. However, it fails to detect other single fault error patterns such as $(\mathbb{1} \otimes Z \otimes \mathbb{1})$ on one magic state.

Figure 26:
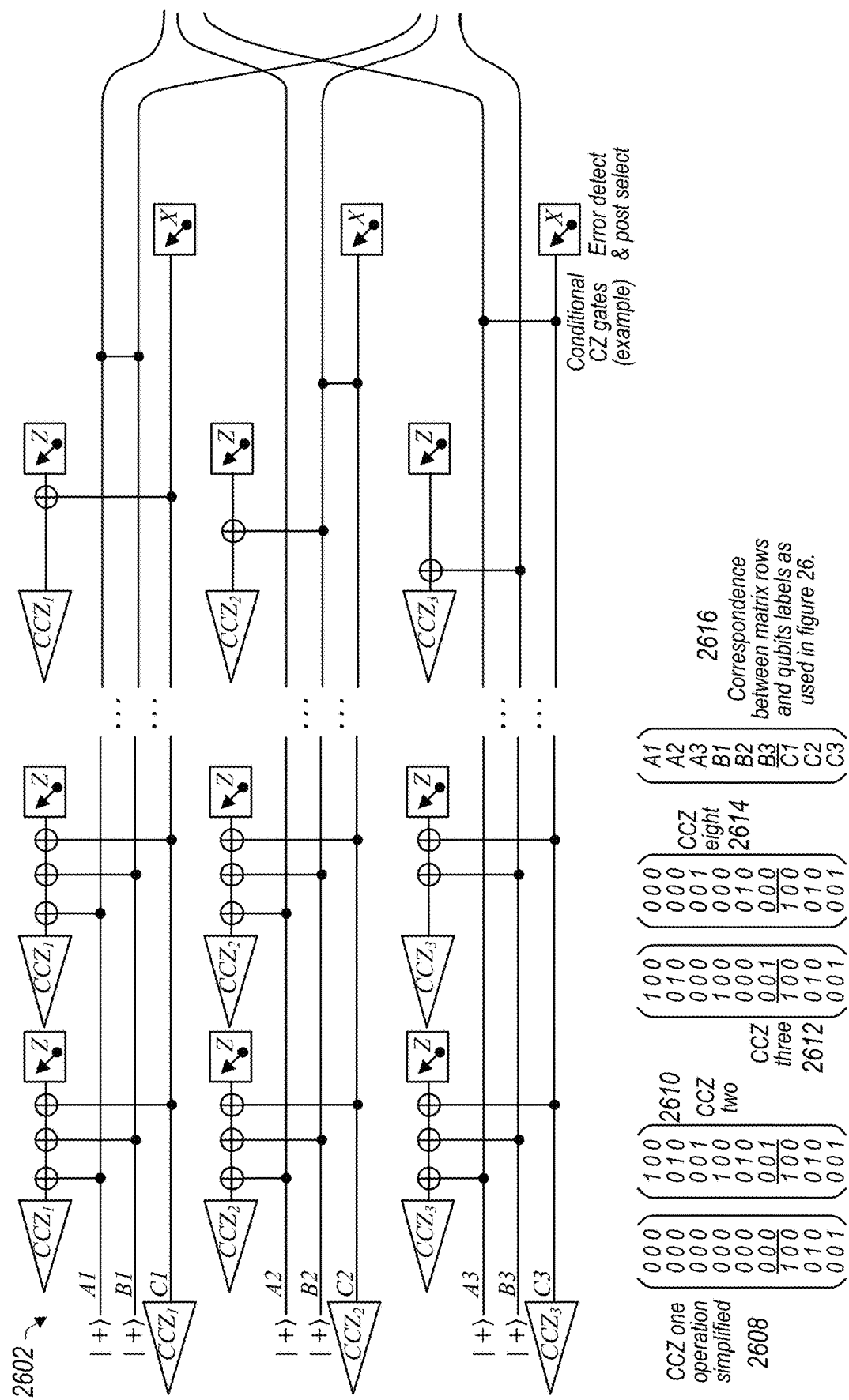
FIG. 26 illustrates a circuit for implementing distillation of two low-error rate logical Toffoli gates (CCZ gates) from eight magic state inputs, according to some embodiments.

Now consider the 8CCZ→2CCZ protocol that detects an arbitrary error on a single input CCZ state. A possible circuit 2602 implementation of this protocol is illustrated in FIG. 26. This protocol uses 3 check qubits and the associated Jj matrices are shown in FIG. 26, such as matrix 2608 corresponding to a first CCZ, matrix 2610 corresponding to a second CCZ, matrix 2612 corresponding to a third CZZ, and matrix 2614 corresponding to an eighth CCZ. Note that there would be eight total matrices with one corresponding to each of the eight CCZ's. However, for ease of illustration only matrices for CCZs 1-3 and 8 are shown. Computing the cubic polynomial, yields:

$$f(x) = x_1 x_2 x_3 + x_4 x_5 x_6$$

which represents two CCZ gates and has trivial action on the check qubits. Notice, there is no quadratic component to this polynomial, so no inverse Clifford is required. Regarding the error detection capabilities, notice that every check matrix is the identity and so the three bit error syndrome is $v=\Sigma_j e^j$. Given a fault on a single CCZ state, one of the $e^j$ vectors will be non-zero and so v will be non-zero and the error is detected. In contrast, if two CCZ states have an identical error pattern, so $e^j=e^{j'} \neq 0$, then the syndromes will cancel and this will be an undetected error. However, not all two fault errors go undetected. If magic states j and j' suffer faults, but $e^j \neq e^{j'}$, then this two fault pattern will be detected. The intuition for why the above matrices have the desired property is related to the fact that the matrices are built using a subset of the codewords from 3 copies of a Reed-Muller code.

Consider an error model where a single noisy magic state has error pattern $e^j$ with probability $\mathbb{P}(e^j)$ We will use the convention $\mathbb{P}(0,0,0)=1-\epsilon$. The success probability is:

$$P_{suc} = \sum_{0=\Sigma_j e^j} \prod_j \mathbb{P}(e^j)$$

where the sum is over all configurations with trivial syndrome. To determine the fidelity of the output magic state, we should sum over all configurations with trivial syndrome and no logical damage on the state. To leading order this is dominated by the "no error" case, and indeed this gives a firm lower bound on the fidelity, so $f \geq (1-E)^8/P_{suc}$ Now considering the depolarizing error distribution:

$$\mathbb{P}(e) = \begin{cases} 1-\epsilon & e = (0, 0, 0)^T \\ \epsilon/7 & e \neq (0, 0, 0)^T \end{cases}$$

Then the leading order contributions to the success probability can be counted as follows. The zero faults contribution adds to the success probability. We do not count any single fault events since they are all detected. Of the two fault events, we need a pair (j, j') of magic states (of which there are 8 choose 2=28 combinations) to suffer the same non-trivial error pattern $e^j$, of which there are 7 types of $e^j \neq 0$. This means there are 196 undetected two fault error patterns, which contributes $196(\epsilon/7)^2(1-\epsilon)^6 = (196/49)\epsilon^2(1-\epsilon)^6$ to the success probability. However, not all of the undetected two fault error patterns lead to a logical failure, with a contribution of $(184/49)\epsilon^2(1-\epsilon)^6$ to undetected logical failures. This leads to the approximate results of:

$$P_{suc} \approx 1 - 8\epsilon$$

$$\epsilon_{out} \approx \left(\frac{184}{49}\right)\epsilon^2 \approx 3.755\,\epsilon^2$$

Note that the constant factor 3.755 in front of $\epsilon^2$ is quite small for a distillation protocol. This is because this protocol detects the vast majority of all two fault events.

In some embodiments, the above protocol may be generalized to 3k+2CCZ→kCCZ.

Example Implementation of Lattice Surgery

Figure 27:
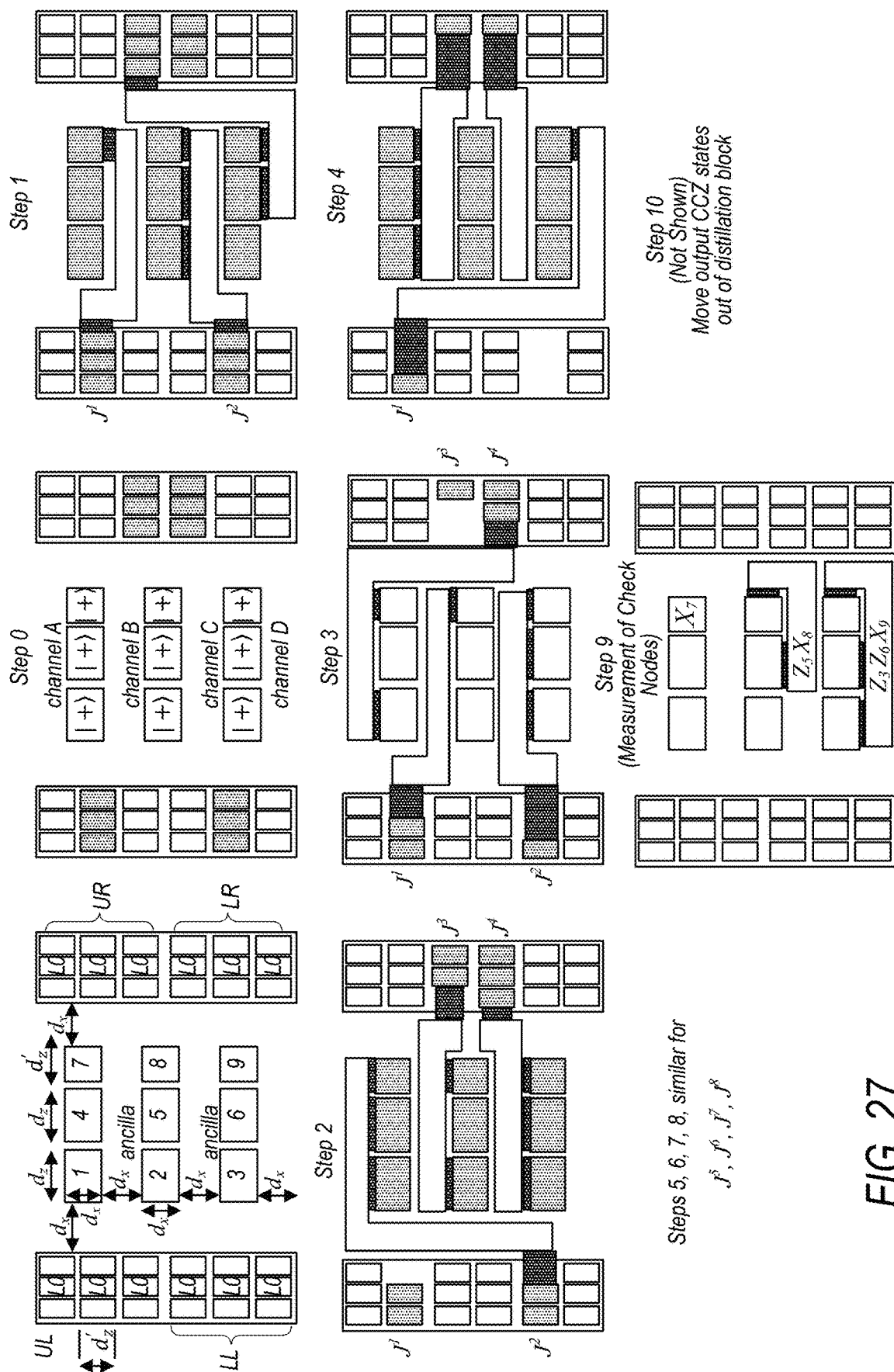
FIG. 27 illustrates a Litinski diagram for performing lattice surgery realization of a distillation of eight Toffoli magic states to yield two low-error rate logical Toffoli gates, according to some embodiments.

FIG. 27 illustrates an example implementation of the above described protocol using lattice surgery. Throughout, we refer to the input magic state error rate as $\epsilon$ and the output error rate is simply $\epsilon_{target} \sim O(\epsilon^2)$. As noted earlier, the generalized CCZ gates can be injected using only multi-Pauli measurements. For many error correction codes, such as topological codes and repetition codes, lattice surgery provides a natural way to measure multi-qubit Pauli operators. The following examples are concerning using thin surface codes with asymmetric distance for bit-flip and phase-flip noise. When there is an asymmetry we use the convention that the bit-flip distance is smaller. This also includes the repetition code as the limit where the bit-flip distance is one.

The lattice surgery approach dedicates some ancilla qubits to act as communication routes between logical qubits. When performing a multi-patch measurement, these qubits are temporarily brought into an error correction code for $d_m$ rounds of error correction. The value of $d_m$ must be sufficiently large that the probability of an error during the multi-patch measurement is small enough. The larger $d_m$, the more protection one has against measurement errors. However, an error during measurement is equivalent to a single-qubit Pauli error on the magic state. Therefore, $d_m$ has to be sufficiently large that the probability of measurement error is small than $O(\epsilon)$. However, the measurement error probability does not have to be smaller than the intended infidelity of the output magic state. However, the logical qubits labelled 1 through 6, need to be encoded in a code protecting with distance $d_x$ for bit-flips and $d_z$ for phase-flips, where these are sufficiently large that logical error rates are lower than $O(\epsilon^2)$.

The logical qubits labelled 7 through 9 are the check qubits for the protocol and are encoded in a code with distance $d_x$ for bit-flips and $d'_z$ for phase-flips. If there is a Z logical error on a check qubit at any point, this can be commuted to the end of the circuit and will be detected provided it is the only fault. Therefore, we can set $d'_z < d_z$, requiring only that $d_z$ is sufficiently large that a Z logical occurring is less likely than $O(\epsilon)$. In the surface code, the space/qubit cost is $2d_z d_x$, so the total space cost for qubits 1 through 9 and the routing ancilla space is:

$N_1 = 14d_x(2d_x + 2d_z + d'_z)$

In addition, there is a space cost No for the $L_0$ blocks responsible for preparing the input Toffoli or CCZ states. We will need 8 such CCZ states, though in FIG. 27 the injection process is divided into two batches of 4 CCZ states. Therefore, we need at least 4 L0 blocks, but due to the finite success probability pf of each L0 block, some redundancy is needed to ensure we succeed with high probability (otherwise there will be a slight time delay). Given a factor R redundancy, so we use 4R copies of the L0 blocks, the probability of all failing is approximately $4p_f^R$. The size of the L0 blocks will depends on the underlying protocol used, which in the case of the bottom protocol is $3d'_z$. If a factor R redundancy is require then the total L0 space requirement is:

$N_0 = 3Rd'_z$

In FIG. 27 a layout is shown where R=3. Note that if $2Rd'_z = 7d_x$, as in the FIG. 27, then the L0 blocks neatly line up with the ancilla routing region. If all the L0 blocks cannot fit adjacent to the routing region and a different placement (such as having two columns of LO blocks) will need to be used.

The time cost of the whole distillation protocol is 10 $d_m$ code cycles. Most of this cost is due to multi-patch measurements. Recall that in FIG. 27 the injection process is divided into two batches of 4 CCZ states. In each batch, there are several injection events interspersed with each other, which is possible because all the gates involved commute. Note also that the protocol uses multi-patch measurements and single-qubit measurements, but the single qubit measurements can be realized in 1 code-cycle and so are a negligible cost. Assuming a surface code architecture where each code cycle takes 4tCNOT where tCNOT is the CNOT gate time, gives a total 40 $d_m$ tCNOT time cost.

Figure 28:
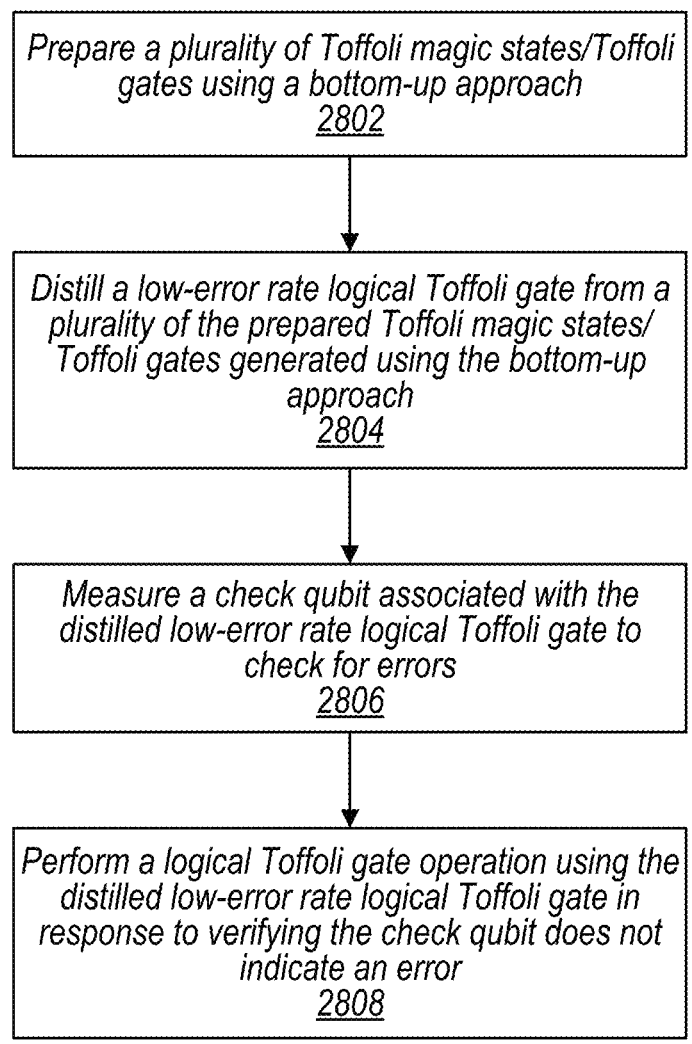
FIG. 28 illustrates a process for distilling low-error rate logical Toffoli gates from a plurality of noisy Toffoli magic states, according to some embodiments.

FIG. 28 illustrates a process for distilling low-error rate logical Toffoli gates from a plurality of noisy Toffoli magic states/Toffoli gates, according to some embodiments.

At block 2802 a plurality of Toffoli magic states/noisy Toffoli gates are prepared using a bottom-up approach or other suitable approach. At block 2804 a low-error rate logical Toffoli gate is distilled from a plurality of the Toffoli magic states/Toffoli gates prepared at block 2802. At block 2806 a check qubit is measured to check for errors, wherein the check qubit is associated with the distilled low-error rate logical Toffoli gate. At block 2808 a low-error rate logical Toffoli gate operation is performed using the distilled low-error rate logical Toffoli gate in response to a verifying the check qubit does not indicate an error.

Figures 29A, 29B:
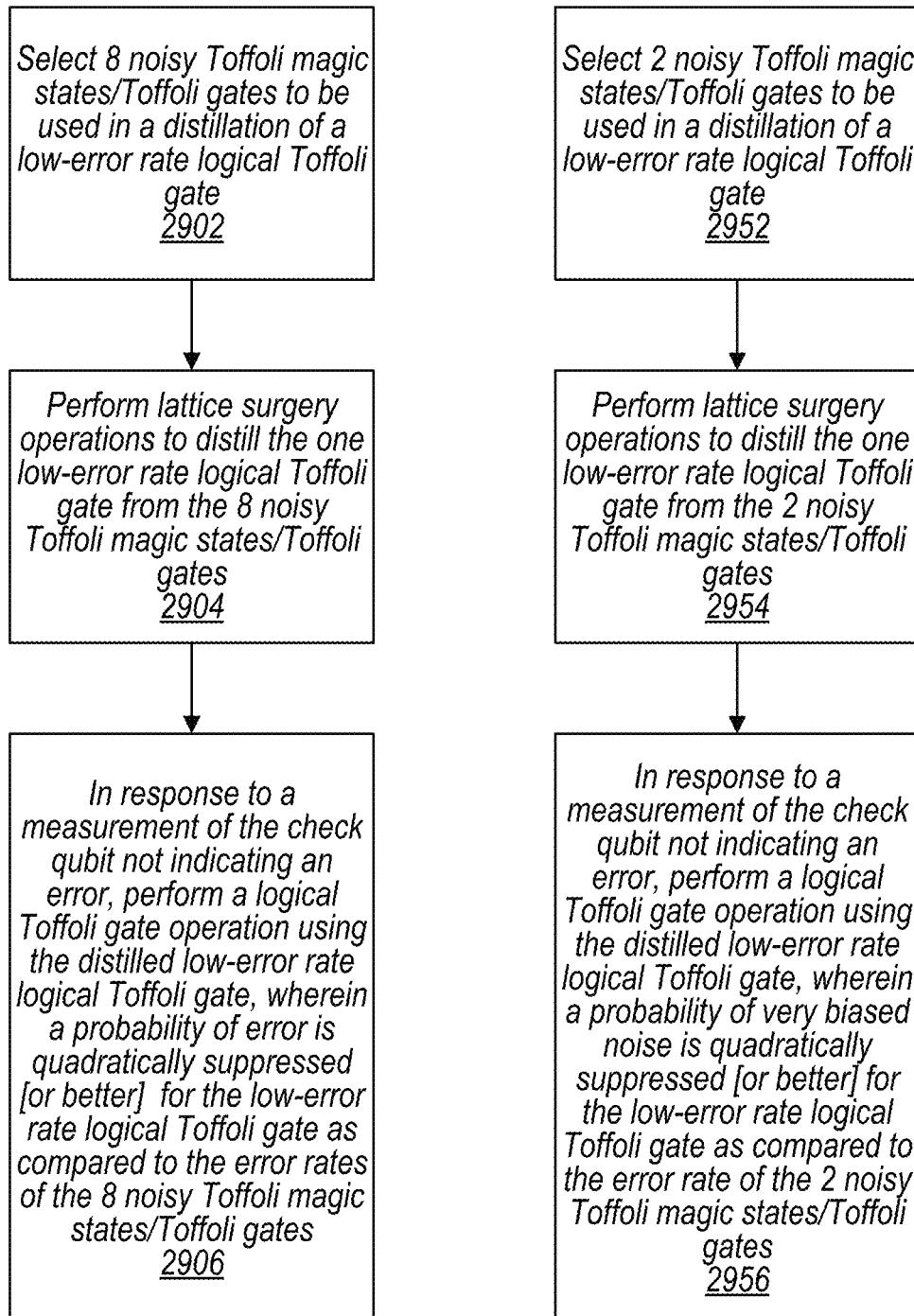
FIG. 29A illustrates a process of distilling two low-error rate logical Toffoli gates from eight noisy Toffoli magic states, according to some embodiments.
FIG. 29B illustrates a process of distilling a low-error rate logical Toffoli gate from two noisy Toffoli magic states, according to some embodiments.

FIG. 29A illustrates a process of distilling two low-error rate logical Toffoli gates from eight noisy Toffoli magic states/Toffoli gates, according to some embodiments.

At block 2902 8 noisy Toffoli magic states/Toffoli gates are selected to be used in a distillation of a low-error rate logical Toffoli gate. At block 2904 lattice surgery is performed to distil the one low-error rate logical Toffoli gate from the 8 noisy Toffoli magic states/Toffoli gates. At block 2906 a logical Toffoli gate operation is performed using the distilled low-error rate logical Toffoli gate, wherein a probability of error is quadratically suppressed for the low-error rate logical Toffoli gate as compared to the error rates of the 8 noisy Toffoli magic states/Toffoli gates.

FIG. 29B illustrates a process of distilling a low-error rate logical Toffoli gate from two noisy Toffoli magic states/Toffoli gates, according to some embodiments.

At block 2952, two noisy Toffoli magic states/Toffoli gates are selected to be used in a distillation of a low-error rate logical Toffoli gate. At block 2954 lattice surgery is performed to distil the one low-error rate logical Toffoli gate from the 2 noisy Toffoli magic states/Toffoli gates. At block 2956, a logical Toffoli gate operation is performed using the distilled low-error rate logical Toffoli gate, wherein a probability of very biased noise is quadratically suppressed for the low-error rate logical Toffoli gate as compared to the very biased noise of the 2 noisy Toffoli magic states/Toffoli gates.

FIG. 30 illustrates an example method of performing lattice surgery to distill a low-error rate logical Toffoli gate from a plurality of noisy Toffoli magic states/Toffoli gates, according to some embodiments.

At block 3002 multi-qubit Pauli operator measurements are performed during lattice surgery used to distil a low-error rate logical Toffoli gate from noisy Toffoli magic states/Toffoli gates, wherein for each $J_k$ with k=1, 2, 3, . . . the following steps are performed. For example, at block 3004, for each k value, a measurement of $Z_{k^*} \otimes Z[J_k]$ is measured where $Z_k$ denotes Pauli Z acting on the $k^{th}$ qubit of the magic state and $Z[J_k]$ is a string of Pauli operators acting on the algorithmic qubits indexed by the binary vector $J_k$. Also at block 3006, for each k, measure X on the $k^{th}$ qubit of the magic state. At block 3008 for each "−1" outcome measured in step 3006, update the Clifford correction frame by $Z[J_k]$. Then at block 3010 using the measurement outcome from step 3004, update the Clifford correction frame by the correction given in the figure.

High Fidelity Measurements

Figure 31:
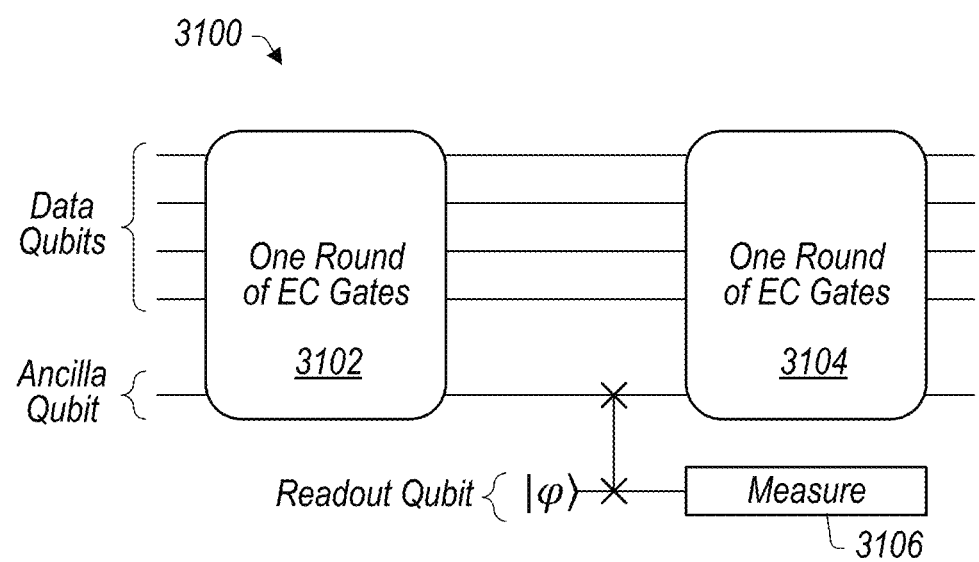
FIG. 31 illustrates a circuit for performing measurements of a readout qubit for a set of error correction gates in parallel with performing a next round of error correction gates, according to some embodiments.

In some embodiments, low measurement error and/or faster error correction can be achieved by using an additional readout mode that is interrogated as the next error correction cycle proceeds. For example, circuit 3100 shown in FIG. 31 includes a readout qubit that enables measurements 3106 to be performed for a first round of error correction gates 3106 while (e.g. concurrently) a second round of error correction gates 3104 are being performed.

Note that while some of the examples included herein are for hybrid acoustic-electrical qubits and the architecture described in FIGS. 1-30, in some embodiments such measurement techniques could be applied in other architectures.

Consider fault tolerant operation of a quantum computer where properties (like stabilizers) of data qubits are repeatedly measured. In a given cycle of the error correction this often involves two steps. First gates act between the data qubits and an ancilla qubit and then the ancilla qubit is measured. Subsequent to the measurement of the ancilla qubit another error correction cycle can proceed.

In some embodiments, faster error correction cycles and lower measurement error can be achieve by swapping an ancilla (that would normally be interrogated directly) to an additional readout qubit (could be some other gate that achieves same purpose as SWAP like iSWAP, decomposition of SWAP into CNOTS etc. Then perform readout on the readout qubit while the rest of the error correction proceeds.

Such an approach not only reduces error correction cycle time, but also reduces idling errors on the data qubits. This is because the data qubits only idle during the time of the swap is typically shorter duration that was is required to perform the measurements. Also, because idling is not a concern when measurements are performed on a readout qubit, more repeated measurement may be taken, which also increases measurement fidelity. For example, the full error correction cycle time may be used to collect as many measurements as permitted to increase measurement fidelity or perform a single measurement with a long integration time for the time of the next cycle.

For example, in a traditional surface code architecture with transmons measurement is often much slower than the gates. The error correction cycle time can be sped up by using this scheme. Additionally depending on the details, one may have more time to drive/integrate allowing for higher fidelity measurement without hurting the threshold because of large idling errors.

In some embodiments, the additional readout mode may be a bosonic mode. In such embodiments, for the measurement of the readout mode repeated individual parity measurements are performed which are then majority voted to determine the final outcome. Being able to take more of the repeated measurements increases the fidelity of the final outcome.

Figure 32:
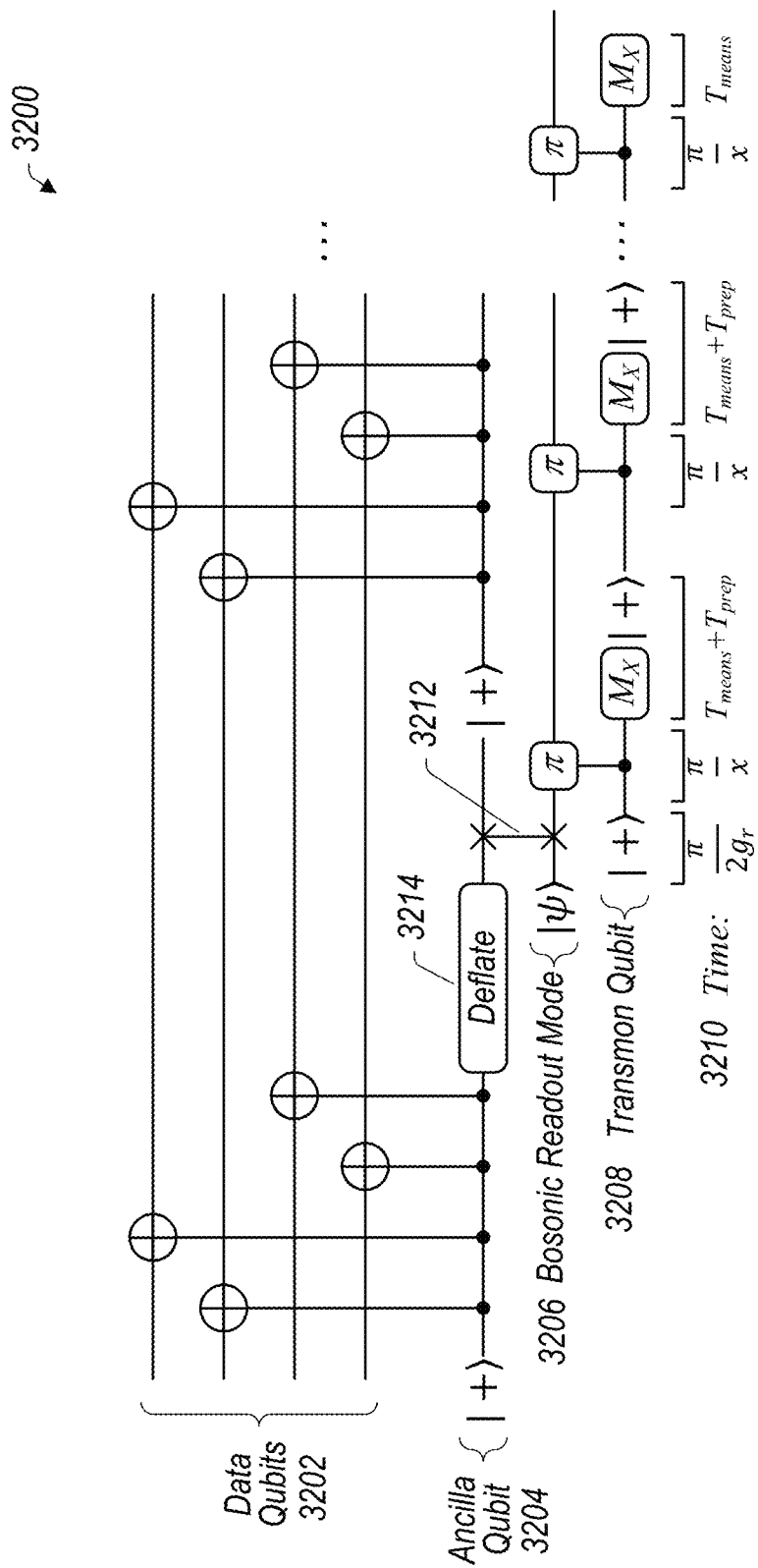
FIG. 32 illustrates a more detailed circuit for performing measurements of a readout qubit for a set of error correction gates in parallel with performing a next round of error correction gates, according to some embodiments.

FIG. 32 illustrates a more specific example, wherein deflation is further added. Following the CNOT gates to entangle the ancilla qubit 3204 with the data qubits 3202 the ancilla qubit is deflated. Deflation involves decreasing the steady state a for the dissipatively stabilized ancilla qubit from an initial $|\alpha_{initial}|$ to some $|\alpha_{final}|$. The deflation provides protection from single photon loss events which occur at a rate proportional to the average number of bosons in the readout mode. Once the mode has been deflated a SWAP 3212 is performed which transfers the excitation from the ancilla qubit 3204 to the bosonic readout mode 3206 (which may be a phononic mode). To achieve high fidelity readout, repeated QND parity measurements of the bosonic readout mode 3206 are employed. Each individual parity measurement is achieved by dispersively coupling the readout mode to a transmon qubit 3208.

In some embodiments, during a parity measurement of a bosonic mode the aim is to determine whether there is an even or odd number of photons in a resonator. A single photon loss even during the process of a measurement will change the parity potentially resulting in an incorrect readout. For dissipatively stabilized systems a simple way to improve the measurement fidelity is to perform a deflation operation 3214 before the measurement.

In the specific case of a system stabilized by two photon dissipation this involves taking the dissipator $D[a^2-\alpha_{initial}^2]$ to $D[a^2-\alpha_{final}^2]$, wherein $|\alpha_{final}|<|\alpha_{initial}|$. This is done by varying $\alpha(t)$ from the initial to final value. In most cases sufficient abrupt change is acceptable since there is no need to maintain phase coherence between the even and odd parity states.

As is clear in the case without the deflation there is a significant degradation in the infidelities as average photon number ($\alpha^2$) is increased because the measurements are more sensitive to single photon loss which changes parity. With the deflation added this problem is corrected.

Figure 33:
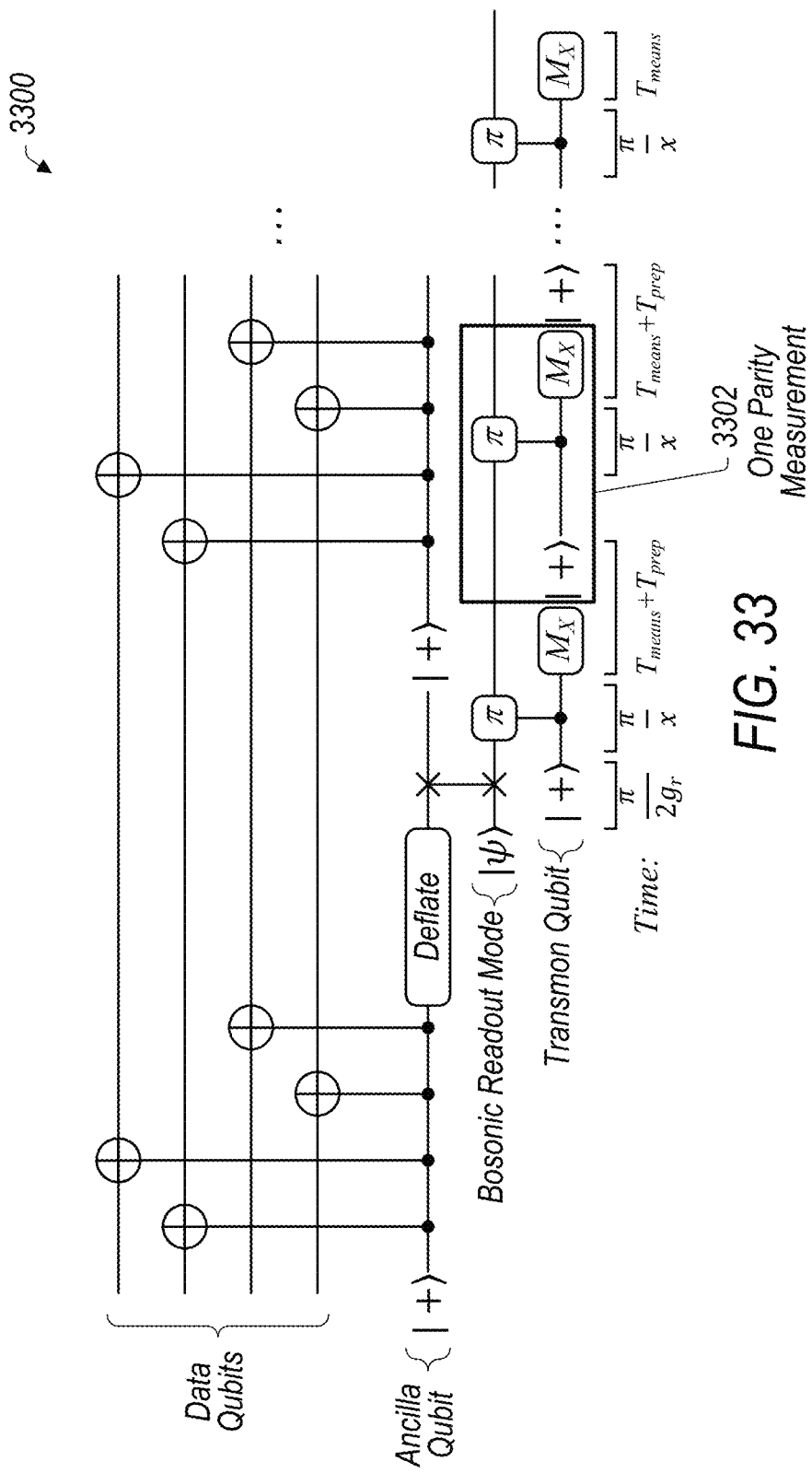
FIG. 33 illustrates the more detailed circuit for performing measurements of a readout qubit for a set of error correction gates in parallel with performing a next round of error correction gates, wherein the circuit includes a deflation of the ancilla qubit prior to a swap to the readout qubit and wherein the measurement comprises a parity measurement of the readout qubit, according to some embodiments.

As an example, FIG. 33 illustrates a parity measurement 3302 being taken subsequent to deflation.

In some embodiments, where a is the qubit mode and b is another mode used for readout, deflation can follow the following procedure.

1.) Deflate the qubit to $\alpha=0$ mapping the + cat state to $|0\rangle$ and the – cat state to $|1\rangle$.
2.) Evolve under a Hamiltonian $H=ig(b^\dagger-b)a^\dagger a$ and measure (homodyne/heterodyne) the b mode to determine whether the qubit was in a + or – cat state. If the qubit was in the – cat state then there is a drive on the b mode implemented by the Hamiltonian whereas if the qubit was in the + cat state there is no drive on the b mode. Hamiltonians of this form can be derived resonantly and non-resonantly from a three wave mixing Hamiltonian of the form:

$$H \sim \epsilon(t)(\varphi_a(a+a^\dagger)+\varphi_b(b+b^\dagger))^3$$

In some embodiments, other Hamiltonians may be used, such as $H=g(b^\dagger+b)a^\dagger a$ or $H=ig(b^\dagger-b)a^\dagger a$.

In some embodiments, bosonic modes may be readout in $\pm|\alpha\rangle$ basis using a three or higher wave mixing Hamiltonian. In some embodiments a procedure for such readouts may comprise evolving under a Hamiltonian $H=g(a^\dagger b+b^\dagger a)$ and measuring (homodyne/heterodyne) the b mode to measure the bosonic mode in $\pm|\alpha\rangle$ basis. Hamiltonians of this form can be derived resonantly and non-resonantly from a three wave mixing Hamiltonian of the form:

$$H \sim \epsilon(t)(\varphi_a(a+a^\dagger)+\varphi_b(b+ab^\dagger))^3$$

In some embodiments, other Hamiltonians may be used, such as $H=g(a+a^\dagger)(b+b^\dagger)$ or $H=g(a+a^\dagger)(b-b^\dagger)$, etc.

Figure 34:
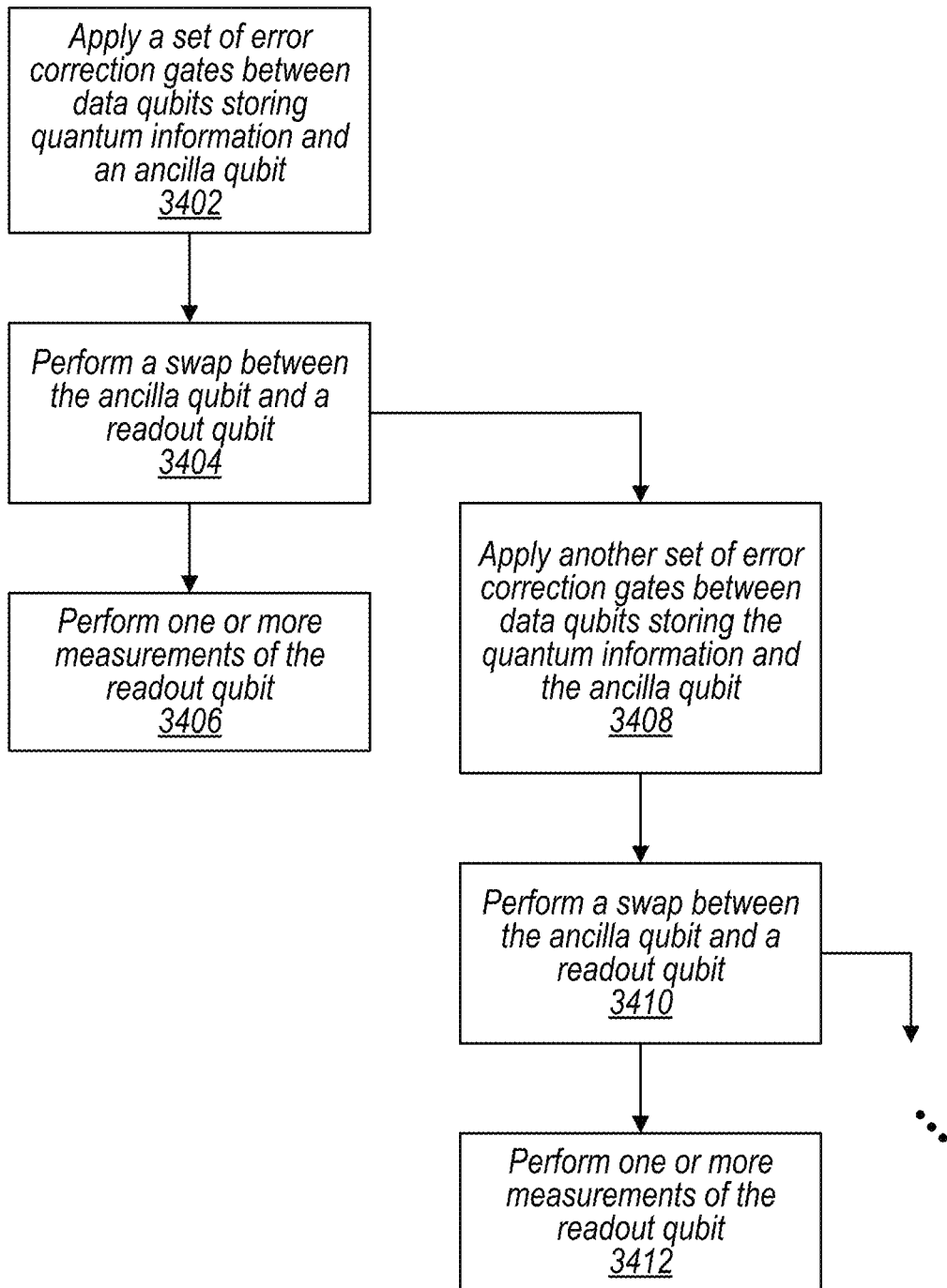
FIG. 34 is a process flow diagram illustrating using a switch operator to excite a readout qubit such that a subsequent round of error correction gates can be applied in parallel with performing measurements of the readout qubit, according to some embodiments.

FIG. 34 is a process flow diagram illustrating using a switch operator to excite a readout qubit such that a subsequent round of error correction gates can be applied in parallel with performing measurements of the readout qubit, according to some embodiments.

At block 3402, a set of error correction gates is applied between data qubits storing quantum information and an ancilla qubit. At block 3404, a swap is performed between the ancilla qubit and a readout qubit. At block 3406, one or more measurements are performed on the readout qubit. While this is taking place or without waiting for the measurements at block 3406 to complete, at block 3408 another set of error correction gates are applied between data qubits storing the quantum information and the ancilla qubit. At block 3410, another swap is performed between the ancilla qubit and the readout qubit, subsequent to the measurement at block 3406 completing. And, at block 412 one or more measurement are performed on the readout qubit. Note that this process can be repeated for multiple additional rounds of error correction.

Figure 35:
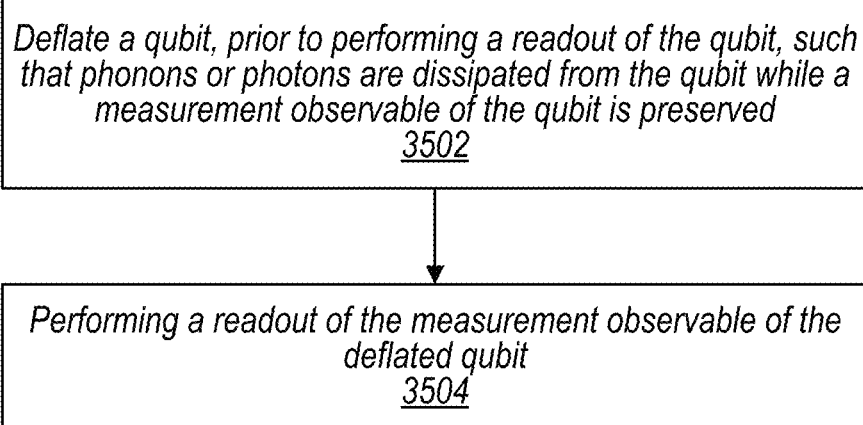
FIG. 35 is a process flow diagram illustrating a process for using deflation to perform measurements of a qubit, according to some embodiments.

FIG. 35 is a process flow diagram illustrating a process for using deflation or evolution using a three or higher wave mixing Hamiltonian to perform measurements of an ancilla qubit without requiring a transmon qubit, according to some embodiments.

As an example, one or more data qubits storing quantum information may be entangled with an ancilla qubit. At block 3502 a qubit, such as the ancilla qubit, is deflated prior to performing a readout of the qubit, such that phonons or photons are dissipated from the qubit while a measurement observable of the qubit is preserved. Then at block 3504, a readout of the measurement observable of the deflated qubit is performed.

Figure 36A:
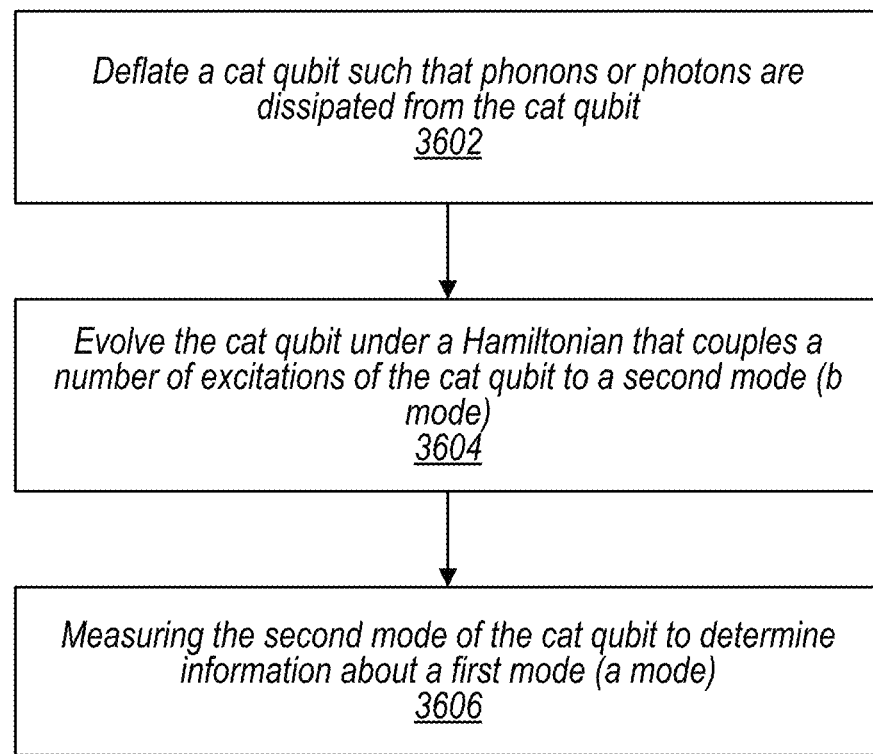
FIG. 36A is a process flow diagram illustrating a process for deflating a cat qubit and measuring a "b" mode of the deflated cat qubit to determine information about a first mode of the deflated cat qubit, according to some embodiments.

FIG. 36A is a process flow diagram illustrating a process for deflating a cat qubit and measuring a b mode of the deflated cat qubit to determine information about a first mode of the deflated cat qubit, according to some embodiments.

At block 3602 cat qubit is deflated such that phonons or photons are dissipated from the cat qubit. For example, this may be achieved by adjusting a steady state dissipation rate, for example as may be driven by an ATS. At block 3604, the cat qubit is evolved under Hamiltonian that couples a number of excitations of the cat qubit to a second mode (b mode) of the cat qubit. Then, at block 3606, the second mode (e.g. b mode) of the cat qubit is measured to determine information about the first mode (e.g. a mode) of the cat qubit.

Figure 36B:
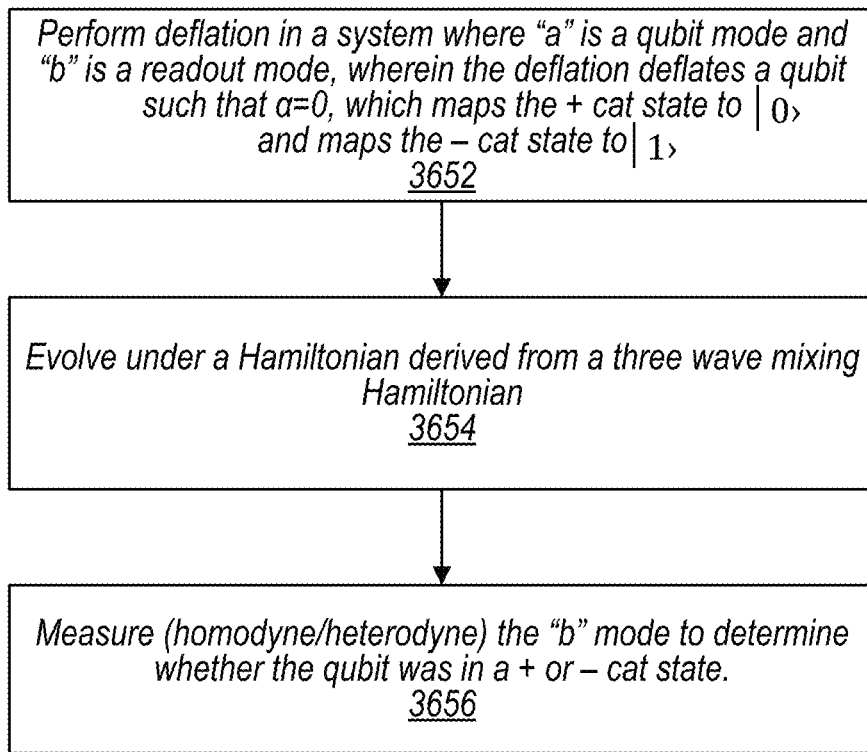
FIG. 36B is a process flow diagram illustrating another process for deflating a cat qubit and measuring a "b" mode of the deflated cat qubit to determine information about a first mode of the deflated cat qubit, according to some embodiments.

FIG. 36B is a process flow diagram illustrating another process for deflating a qubit and measuring a "b" mode of the deflated cat qubit to determine information about a first mode of the deflated cat qubit, according to some embodiments.

At block 3652 deflation is performed in a system wherein an "a" mode is a qubit mode and a "b" mode is a readout mode. The deflation includes deflating a qubit to $\alpha=0$ such that the + cat state is mapped to $|0\rangle$ and the – cat state is mapped to $|1\rangle$. At block 3654, the system is evolved under a Hamiltonian derived from a three wave or higher mixing Hamiltonian. For example, a Hamiltonian $H=ig(b^\dagger-b)a^\dagger a$. At block 3656 measurements of the "b" mode are performed to determine whether the qubit is in the + or – cat state. For example, (homodyne/heterodyne) measurements of the b mode are performed to determine whether the qubit was in a + or – cat state. If the qubit was in the – cat state then there is a drive on the "b" mode implemented by the Hamiltonian whereas if the qubit was in the + cat state there is no drive on the "b" mode.

Figure 37:
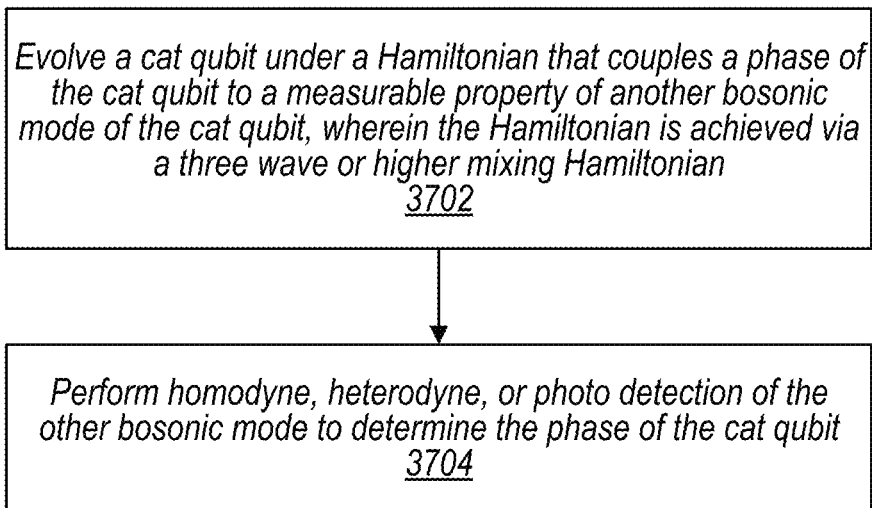
FIG. 37 is a process flow diagram illustrating a process for evolving a cat qubit via three wave or higher mixing Hamiltonian and performing a homodyne, heterodyne, or photo detection of the evolved cat qubit to measure a measured property of another bosonic mode of the cat qubit, according to some embodiments.

FIG. 37 is a process flow diagram illustrating a process for evolving a cat qubit via three wave or higher mixing Hamiltonian and performing a homodyne, heterodyne, or photo detection of the evolved cat qubit to measure a measure property of another bosonic mode of the cat qubit, according to some embodiments.

At block 3702, a cat qubit is evolved under a Hamiltonian that couples a phase of the cat qubit to a measurable property of another bosonic mode of the cat qubit, wherein the Hamiltonian is selected from a three wave or higher mixing Hamiltonian. At block 3704, a homodyne, heterodyne, or photo detection of the other bosonic mode is performed to determine the phase of the cat qubit.

Simulation of Cat Qubits Using a Shifted Fock Basis

A Fock basis is an algebraic construction used to construct quantum state space for a variable or unknown number of identical particles based on a single particle in Hilbert space. For example, a Fock basis could be used to simulate a cavity or the behavior of a phononic resonator using an n-dimensional ladder of states. For example, Fock basis may be used to simulate photon number states, wherein a base state represents a vacuum condition without any photons present. However, by shifting the Fock basis, the Hilbert space can be truncated to include a finite (as opposed to infinite) number of photon number states. Thus, simulations can be simplified such that the truncated Hilbert space is simulated as opposed to the infinite Hilbert space, which cannot be effectively simulated. As an example, a shifted Fock basis simulation may replace a vacuum state with one or more coherent states. For example, a shift operator may be applied to the vacuum state condition such that the lowest shifted Fock states correspond to the lowest operators for the lowest states of a cat qubit.

For example, simulating a large cat qubit (with large $|\alpha|^2 \gg 1$) using a traditional (e.g. non-shifted) Fock basis may be ineffective due to the large (or even infinite) number of states that would need to be simulated. Instead, in some embodiments, the simulation may be performed using a shifted Fock basis, which can be used to describe large cat states in a more compact way than is the case for a usual Fock basis. More specifically, the annihilation operator a may be constructed in a shifted Fock basis.

Recall that a cat state is composed of two coherent state components $|\pm\alpha\rangle$ which can be understood as displaced vacuum states $\hat{D}(\pm\alpha)|\hat{n}=0\rangle$. In the shifted Fock basis, 2d displaced Fock states $\hat{D}(\pm\alpha)|\hat{n}=n\rangle$ are used as basis states where $n \in \{0, \ldots, d-1\}$. Note that while displaced Fock states in each $\pm\alpha$ branch are orthonormalized, displaced Fock states in different branches are not necessarily orthogonal to each other. Thus the displaced Fock states need to be orthonormalized.

The non-orthonormalized basis states may be defined as follows:

$$|\phi_n, \pm\rangle \equiv \frac{1}{\sqrt{2}}[\hat{D}(\alpha) \pm (-1)^n \hat{D}(-\alpha)]|\hat{n}=n\rangle$$

where $|\phi_n, +\rangle$ and $|\phi_n, -\rangle$ have even and odd excitation number parity, respectively. Note that the non-orthonormalized states are grouped into the even and odd branches instead of the $\pm\alpha$ branches. As a result, in the ground state manifold (n=0), the normalized basis states $|\phi_0, \pm\rangle$ are equivalent to the complementary basis states of the cat qubit $|\pm\rangle$, not the computational basis states $|0/1\rangle$. For example:

$$|\pm\rangle \propto |\phi_0, \pm\rangle = \frac{1}{\sqrt{2}}(|\alpha\rangle + |-\alpha\rangle)$$

The even/odd branching convention is used so that any two basis states in different branches are orthogonal to each other and hence the orthonormalization can be done separately in each parity sector. Note that:

$$\Phi_{m,n}^{\pm} \equiv \langle \phi_{m,\pm}|\phi_{n,\pm}\rangle = \delta_{m,n} \pm (-1)^m D_{m,n}(2\alpha),$$

where $D_{m,n}(\alpha) \equiv \langle \hat{n}=m|\hat{D}(\alpha)|\hat{n}=n\rangle$ are the matrix elements of the displacement operator $\hat{D}(\alpha)$ in the usual Fock basis:

$$D_{m,n}(\alpha) = e^{-\frac{|\alpha|^2}{2}} \sqrt{\frac{\min(m,n)!}{\max(m,n)!}} L_{\min(m,n)}^{(|m-n|)}(|\alpha|^2) \times \begin{cases} \alpha^{m-n} & m \geq n \\ (-\alpha^*)^{n-m} & m < n \end{cases}$$

Here, $L_n^{(\alpha)}(x)$ is the generalized Laguerre polynomial. Since $|D_{m,n}(2\alpha)| = O(|\alpha|^{m+n} e^{-2|\alpha|^2})$, $D_{m,n}(2\alpha)$ is negligible if $m+n \ll |\alpha|^2$. In this regime, the basis states $|\phi_n, \pm\rangle$ are almost orthonormal. For the purpose of estimating the phase-flip (or Z) error rates within a small multiplicative error, it is often permissible to neglect the non-orthogonality of the states $|\phi_n, \pm\rangle$. However, this is generally not the case if the Z error rates are to be evaluated with a very high precision or if it is desired to estimate the bit-flip (or X) error rates. In these cases, taking into account the non-orthogonality of the states $|\phi_n, \pm\rangle$ may be necessary.

In such embodiments, the basis states $|\phi_n, \pm\rangle$ are orthonormalized by applying the Gram-Schmidt orthonormalization procedure. More specifically, given the non-orthonormalized basis states $|\phi_{n,\pm}\rangle$, d orthonormalized basis states are constructed in each parity sector starting from the ground state $|\phi_{0,\pm}\rangle$:

$$|\psi_{n,\pm}\rangle = \sum_{m=0}^{d-1} c_{m,n}^{\pm}|\phi_{m,\pm}\rangle$$

The coefficients of $c_{m,n}^{\pm}$ ($0 \leq m, n \leq d-1$) are determined inductively. In the base case (k=0), $$c_{0,0}^{\pm} = \frac{1}{\sqrt{\Phi_{0,0}^{\pm}}}, \quad c_{m,0}^{\pm} = 0 \text{ for all } 1 \leq m \leq d-1,$$

and thus the logical $|\pm\rangle$ states of the cat qubit are given by:

$$|\pm\rangle \equiv |\psi_{0,\pm}\rangle = \frac{1}{\sqrt{\Phi_{0,0}^{\pm}}}|\phi_{0,\pm}\rangle = \frac{|\alpha\rangle \pm |-\alpha\rangle}{\sqrt{2(1 \pm e^{-2|\alpha|^2})}}$$

In general, the case with $1 \leq k \leq d-1$, we are given with $c_{m,n}^{\pm}$ for all $0 \leq m \leq d-1$ and $0 \leq n \leq k-1$. Thus, at this point, the first k columns of $c^{\pm}$ are known. Let $c_{:,0:k-1}^{\pm}$ be the d×k matrix which is obtained by taking the first k columns of the matrix $c^{\pm}$. Given $c_{:,0:k-1}^{\pm}$, we assign the k+1 column of $c^{\pm}$ as follows:

$$c_{m,k}^{\pm} = -\frac{\left(c_{:,0:k-1}^{\pm}\left(c_{:,0:k-1}^{\pm}\right)^{\dagger} \Phi^{\pm}\right)_{m,k}}{\sqrt{\Phi_{k,k}^{\pm} - \left(\left(\Phi^{\pm}\right)^{\dagger} c_{:,0:k-1}^{\pm}\left(c_{:,0:k-1}^{\pm}\right)^{\dagger} \Phi^{\pm}\right)_{k,k}}}$$

for $0 \leq m \leq k-1$, $$c_{k,k}^{\pm} = -\frac{1}{\sqrt{\Phi_{k,k}^{\pm} - \left((\Phi^{\pm})^{\dagger} c_{:,0:k-1}^{\pm} (c_{:,0:k-1}^{\pm})^{\dagger} \Phi^{\pm}\right)_{k,k}}}$$

and $c_{m,k}^{\pm} = 0$ for all $m > k$.

Having constructed the 2d orthonormalized shifted Fock basis states $|\psi_{n,\pm}\rangle$ the matrix elements for an operator $\hat{O}$ (e.g. $\hat{O}=\hat{a}$) in the orthonormalized basis need to be determined. To do this, let $|\phi_n\rangle = |\phi_n, +\rangle$ and $|\phi_{n+d}\rangle = |\phi_{n,-}\rangle$ for $\in \{0, \ldots, d-1\}$ and also define $|\psi_n\rangle$ and $|\psi_{n+d}\rangle$ similarly. Suppose the operator $\hat{O}$ transforms the non-orthonormalized basis states $|\phi_n\rangle$ as follows:

$$\hat{O}|\phi_n\rangle = \sum_{m=0}^{2d-1} O_{m,n}|\phi_m\rangle$$

$O_{m,n}$ are the matrix elements of the operator $\hat{O}$ in the non-orthonormalized basis $|\phi_n\rangle$. Then, in the orthonormalized basis, the matrix elements of the operator $\hat{O}$ are given by:

$$O'_{m,n} = \langle \psi_m | \hat{O} | \psi_n \rangle = (c^\dagger \Phi O c)_{m,n}$$

where $\Phi$ and $c$ are 2d×2d matrices which are defined as:

$$\Phi = \begin{bmatrix} \Phi^+ & 0 \\ 0 & \Phi^- \end{bmatrix}, c = \begin{bmatrix} c^+ & 0 \\ 0 & c^- \end{bmatrix}$$

The matrix elements of the d×d matrices $\Phi^{\pm}$ and $c^{\pm}$ are given above.

Consider the annihilation operator $\hat{O}=\hat{a}$ and note that it transforms the non-orthonormalized basis states $|\phi_{n,\pm}\rangle$ as follows:

$$\hat{a}|\phi_{n,\pm}\rangle = \sqrt{n}|\phi_{n-1,\mp}\rangle + \alpha|\phi_{n,\mp}\rangle$$

Here, the $\pm$ parity is flipped to the $\mp$ parity. Thus, in the non-orthonormalized basis, the matrix elements of the annihilation operator are given by:

$$\begin{bmatrix} 0 & \hat{b}+\alpha \\ \hat{b}+\alpha & 0 \end{bmatrix} = \hat{X} \otimes (\hat{b}+\alpha)$$

where $\hat{X}$ is the Pauli X operator and $\hat{b}$ is the truncated annihilation operator of size d×d. Then, the matrix elements of the annihilation operator in the orthonormalized basis $|\psi_{n,\pm}\rangle$ can be obtained via the transformation given above with regard to $O'_{m,n}$.

Recall that $|\omega_{n,\pm}\rangle$ are complementary basis states. To find the matrix elements of an operator in the computational basis states, the matrix may be conjugated by the Hadamard operator $\hat{H}$. Thus, in the orthonormalized computational basis, the annihilation operator is given by:

$$\hat{a}_{SF} \equiv (\hat{H} \otimes \hat{I}) \cdot c^\dagger \Phi (\hat{X} \otimes (\hat{b}+\alpha)) c \cdot (\hat{H} \otimes \hat{I}) \xrightarrow{|\alpha|^2 >> d} \tilde{Z} \otimes (\hat{b}+\alpha)$$

Here the subscript SF indicates the action of the annihilation operator in the shifted Fock basis. The approximate expression $\hat{a}_{SF} \approx \tilde{Z} \otimes (\hat{b}+\alpha)$ is useful for analyzing the Z error rates of large cat qubits (with $|\alpha|^2 >> 1$) in the perturbative regime where the cat qubit states may sometimes be excited to the first excited state manifold (n=1) but quickly decay back to the ground state manifold (n=0). Lastly, it is noted that the parity operator $e^{i\pi \hat{a}^\dagger \hat{a}}$ is exactly given by $\hat{X} \otimes \hat{I}$ in the shifted Fock basis because of the way the basis states are defined, e.g., $|\omega_{n,+}\rangle$ ($|\phi_{n,-}\rangle$) has an even (odd) excitation number parity.

Figure 38:
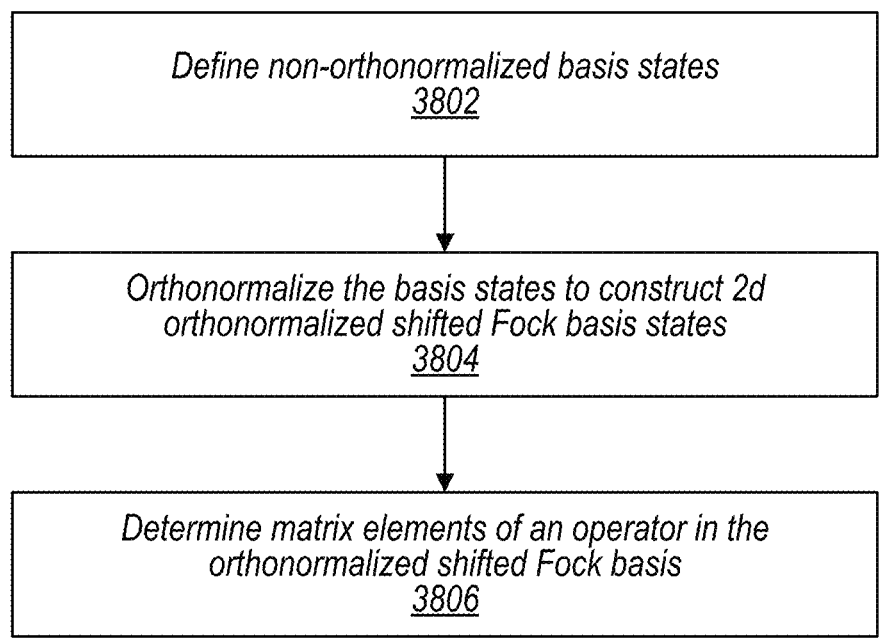
FIG. 38 is a process flow diagram illustrating a process of utilizing a shifted Fock basis to simulate a cat qubit with ($|\alpha|^2 \gg 1$), according to some embodiments.

FIG. 38 is a process flow diagram illustrating a process of utilizing a shifted Fock basis to simulate a cat qubit (with $|\alpha|^2 >> 1$), according to some embodiments.

At block 3802, non-orthonormalized basis states are defined as described above. At block 3804 the basis states are orthonormalized to construct 2d orthonormalized shifted Fock basis states as described above. At block 3806 matrix elements are determined for an operator in the orthonormalized basis as described above.

Embodiments of the present disclosure can be described in view of the following clauses:

Clause 1. A system, comprising:
a mechanical linear resonator; and
a control circuit coupled with the mechanical linear resonator,
wherein the control circuit is configured to stabilize an arbitrary coherent state superposition (cat state) of the mechanical linear resonator to store quantum information, wherein to stabilize the arbitrary cat-state, the control circuit is configured to:
excite phonons in the mechanical linear resonator by driving a storage mode of the mechanical linear resonator; and
dissipate phonons from the mechanical linear resonator via an open transmission line coupled to the control circuit configured to absorb photons from a dump mode of the control circuit.

Clause 2. The system of clause 1, wherein the control circuit comprises:
an asymmetrically-threaded superconducting quantum interference device (ATS) coupled with the mechanical resonator.

Clause 3. The system of clause 2, further comprising:
one or more additional mechanical linear resonators coupled to the control circuit, wherein the control circuit is configured to stabilize respective cat states of the mechanical resonator and the one or more additional mechanical linear resonators via the single ATS and the single open transmission line.

Clause 4. The system of clause 3, wherein the storage modes of the respective mechanical linear resonators are detuned, such that the phonons supplied to the respective mechanical linear resonators are supplied in an incoherent manner.

Clause 5. The system of clause 4, wherein pumps of the respective mechanical linear resonators are separated by a frequency bandwidth greater than a two-phonon dissipation rate of the respective mechanical linear resonators.

Clause 6. The system of clause 5, wherein the control circuit further comprises:
one or more microwave filters configured to filter out correlated decay terms that if not filtered out cause simultaneous phase flips of storage modes of two or more of the mechanical linear resonators.

Clause 7. The system of clause 2, wherein the control circuit further comprises:
a high-impedance inductor used as part of the ATS coupled to the mechanical linear resonator.

Clause 8. The system of clause 7, wherein the high-impedance inductor comprises:
- a planar meander or double-spiral inductor;
- a spiral inductor with one or more air bridges;
- an array of Josephson junctions; or
- a thin-film superconductor with a high kinetic inductance.

Clause 9. The system of clause 2, wherein at least some of the mechanical linear resonators comprise three or more terminals, the system further comprising:
- two or more additional asymmetrically-threaded superconducting quantum interference devices (ATS),
- wherein a given one of the mechanical linear resonators comprising three or more terminals is coupled with three or more ATSs via the respective three or more terminals.

Clause 10. A method of stabilizing coherent state superpositions (cat states) of a mechanical resonator, the method comprising:
- exciting phonons in the mechanical resonator by driving a storage mode of the mechanical resonator; and
- dissipating phonons from the mechanical resonator via an open transmission line coupled to the control circuit configured to absorb photons from a dump mode of the control circuit.

Clause 11. The method of clause 10, wherein the phonons are excited in the mechanical resonator and dissipated from the mechanical resonator in pairs comprising two phonons.

Clause 12. The method of clause 11, wherein the excitation and dissipation of the phonon pairs is induced via a non-linear interaction between the storage mode of the mechanical resonator and the dump mode of the control circuit, wherein a square of the storage mode of the mechanical resonator is coupled to the dump mode of the control circuit via a two-phonon coupling rate ($g_2$), and wherein a decay rate at which photons are absorbed via the open transmission line is approximately ten times or greater than the coupling rate ($g_2$).

Clause 13. The method of clause 11, wherein the control circuit comprises an asymmetrically-threaded superconducting quantum interference device (ATS) coupled with the mechanical resonator, wherein the ATS is configured to cause the two-phonon pairs to be excited in the mechanical resonator.

Clause 14. The method of clause 13, further comprising:
- causing phonons to be excited in one or more additional mechanical resonator by driving respective storage modes of the one or more additional mechanical resonators; and
- dissipating phonons from the one or more additional mechanical resonators via the open transmission line configured to absorb the photons from the dump mode of the control circuit,
- wherein the single ATS is used to cause the phonons to be excited in the mechanical resonator and the one or more additional mechanical resonators.

Clause 15. The method of clause 14, wherein the storage modes of the respective mechanical resonators are detuned.

Clause 16. The method of clause 15, wherein the storage modes of the respective mechanical resonators are separated by a frequency bandwidth greater than a two-phonon dissipation rate of the dump mode of the control circuit.

Clause 17. The method of clause 16, further comprising:
- filtering out, via one or more microwave filters, correlated decay terms of storage modes of two or more of the mechanical resonators.

Clause 18. A method of stabilizing coherent state superpositions (cat states) of a plurality of resonators storing quantum information, the method comprising:
- causing, via a single asymmetrically-threaded superconducting quantum interference device (ATS), pairs of two phonons or pairs of two photons to be excited in respective ones of the respective resonators by driving respective storage modes of the respective resonators; and
- dissipating pairs of two photons from a dump mode of a control circuit comprising the ATS, wherein the control circuit is coupled with the respective resonators, and wherein an open transmission line is coupled to the dump mode of the control circuit.

Clause 19. The method of clause 18, wherein the resonators are mechanical resonators.

Clause 20. The method of clause 18, wherein the resonators are electromagnetic resonators.

Clause 21. A method, comprising:
- implementing a multi-qubit gate among control and target qubits in a system comprising resonators and an asymmetrically-threaded superconducting quantum interference device (ATS), wherein implementing the multi-qubit gate comprises:
  - implementing a linear drive for a phononic mode of a cat qubit for the gate, wherein the cat qubit is implemented via one of the resonators of the system;
  - orchestrating Hamiltonian interactions, wherein the Hamiltonian interactions comprise a compensating Hamiltonian for the multi-qubit gate, and wherein the compensating Hamiltonian includes a frequency shift of a target mode and a control mode at the mechanical resonator being driven, wherein the control mode and the target mode are coupled via an optomechanical coupling.

Clause 22. The method of clause 21, wherein a setting for the multi-qubit gate comprises multiple ones of the resonators coupled to the ATS, wherein the ATS is shared by the multiple ones of the resonators.

Clause 23. The method of clause 21, wherein the optomechanical coupling is realized by off-resonantly driving the resonators and the ATS.

Clause 24. The method of 23, wherein said off-resonantly driving the resonators and the ATS avoids frequency collisions.

Clause 25. The method of clause 21, wherein the multi-qubit gate is a CNOT gate.

Clause 26. The method of clause 21, wherein the multi-qubit gate is a Toffoli gate.

Clause 27. The method of clause 21, wherein the resonators are mechanical resonators.

Clause 28. The method of clause 21, wherein the resonators are electromagnetic resonators.

Clause 29. A method for simulating a Toffoli gate encoded in arbitrary Calderbank-Shor-Steane codes, the method comprising:
- preparing computational basis states in a fault-tolerant manner by applying a STOP algorithm to determine when syndrome measurements of stabilizers of a repetition code for the computational basis states can be stopped such that a probability of faults for the computational basis states are below a threshold level;
- transversally applying a CNOT gate to the prepared computational basis states to prepare a $|\psi_1\rangle$ state;
- measuring a Clifford stabilizer $g_A$ for the $|\omega_1\rangle$ state, and applying a logical Z correction if the measurement outcome for the Clifford stabilizer $g_A$ is −1, wherein measuring the Clifford stabilizer $g_A$ and applying the logical Z correction based on a measurement outcome of the Clifford stabilizer $g_A$ prepares a state $|\psi_{out}\rangle$;

repeating the Clifford stabilizer $g_A$ measurement for the $|\psi\rangle$ state a threshold number of times;

preparing a Toffoli magic state in response to determining the Clifford stabilizer $g_A$ measurements are trivial; and applying a sequence of Clifford gates to a logical input state $|\psi\rangle_L$ and the prepared Toffoli magic state to simulate the logical Toffoli gate, wherein Clifford error corrections are applied to the outputs of the sequence of Clifford gates applied to the logical inputs.

Clause 30. The method of clause 29, wherein applying the STOP algorithm comprises: tracking consecutive syndrome outcomes;

computing a minimum number of faults capable of causing a tracked sequence of consecutive syndrome outcomes;

stopping the STOP algorithm if either of the following conditions is met:
1) a same syndrome outcome is repeated a threshold number of times in a row, wherein the threshold is equal to one plus a difference between:
   a code distance of one of the computational basis states being prepared minus one wherein the result of the subtraction is divided by two; and
   a currently computed minimum number of faults capable of causing the tracked sequence of consecutive syndrome outcomes; or
2) the currently computed minimum number of faults capable of causing the tracked sequence of consecutive syndromes is equal to the code distance of the one of the computational basis states being prepared minus one wherein the result of the subtraction is divided by two, and wherein one additional round of syndrome measurements is performed subsequently; and utilizing the repeated syndrome if condition 1 is met or utilizing the syndrome for the subsequently performed syndrome measurement if condition 2 is met, wherein the utilized syndrome it utilized to error correct the one of the computational basis states being prepared.

Clause 31. The method of clause 30, wherein:
repeating the measurement of the Clifford stabilizer $g_A$ for the $|\psi_1\rangle$ state the threshold number of times comprises repeating the measurement such that the Clifford stabilizer $g_A$ is measured a number of times equal to (d−1)/2, wherein d is a code distance of the one of the fault tolerant computational basis states.

Clause 32. The method of clause 31, wherein error detection is performed between respective measurements of the Clifford stabilizer $g_A$.

Clause 33. The method of clause 29, further comprising:
growing the Toffoli magic state from a first code distance to a second code distance, wherein the STOP algorithm is used to measure stabilizers and minimum weight perfect matching (MWPM) is applied to a measured syndrome history generated from measuring the stabilizers to correct for errors.

Clause 34. A method, comprising:
measuring syndrome outcomes of an ancilla qubit for an arbitrary Calderbank-Shor Steane code;
tracking consecutive ones of the measured syndrome outcomes;
computing a minimum number of faults capable of causing a tracked sequence of consecutive syndrome outcomes;
stopping the measuring of the syndrome outcomes if either of the following conditions is met:
1) a same syndrome outcome is repeated a threshold number of times in a row, wherein the threshold is equal to one plus a difference between:
   a code distance of the arbitrary Calderbank-Shor-Steane code minus one wherein the result of the subtraction is divided by two; and
   a currently computed minimum number of faults capable of causing the tracked sequence of consecutive syndrome outcomes; or
2) the currently computed minimum number of faults capable of causing the tracked sequence of consecutive syndromes is equal to the code distance minus one wherein the result of the subtraction is divided by two, and wherein one additional round of syndrome measurements is performed subsequently; and utilizing the repeated syndrome outcome if condition 1 is met or utilizing the syndrome outcome for the subsequently performed syndrome measurement if condition 2 is met, wherein the utilized syndrome outcome is utilized to error correct the arbitrary Calderbank-Shor-Steane code.

Clause 35. The method of clause 34, wherein:
the arbitrary Calderbank-Shor-Steane code is a n-qubit repetition code;
measuring the syndrome outcomes comprises measuring $Z_L$ at the ancilla for the n-qubit repetition code; and
performing the error correction for the n-qubit arbitrary Calderbank-Shor-Steane code further comprises applying an $X_L$ correction based on the measured $Z_L$ at the ancilla for the n-qubit repetition code,
wherein performing the error correction prepares computational basis state to be used in implementing a Clifford gate.

Clause 36. The method of clause 34, further comprising:
growing the arbitrary Calderbank-Shor-Steane code from a first code distance to a second code distance, wherein a STOP algorithm is used to measure stabilizers and minimum weight perfect matching (MWPM) is applied to a measured syndrome history generated from measuring the stabilizers to correct for errors, wherein the STOP algorithm comprises said measuring syndrome outcomes, said tracking consecutive ones of the measured outcomes, said computing a minimum number of faults, said stopping the measuring if condition 1 or condition 2 is met, and said error correction.

Clause 37. The method of clause 36, wherein said growing the arbitrary Calderbank-Shor-Steane code from the first code distance to the second code distance comprises:
performing lattice surgery to merge together two code blocks, wherein the measuring comprises measuring a boundary operator between the two code blocks being merged.

Clause 38. The method of clause 34, further comprising:
preparing computational basis states in a fault tolerant manner by applying a STOP algorithm to determine when syndrome measurements of stabilizers of a repetition code for the computational basis states can be stopped such that a probability of faults for the computational basis states are below a threshold level, wherein:
the computational basis states are encoded using the arbitrary Calderbank-Shor-Steane code; and
applying the STOP algorithm comprises performing said measuring syndrome outcomes, said tracking consecutive ones of the measured outcomes, said computing a minimum number of faults, said stopping the measuring if condition 1 or condition 2 is met, and said error correction.

Clause 39. The method of clause 38, further comprising:
transversally applying a CNOT gate to the prepared computational basis states to prepare a $|\psi_1\rangle$ state;
measuring a Clifford stabilizer $g_A$ for the $|\psi_1\rangle$ state, and applying a logical Z correction if the measurement outcome for the Clifford stabilizer $g_A$ is −1, wherein measuring the Clifford stabilizer $g_A$ and applying the logical Z correction based on a measurement outcome of the Clifford stabilizer $g_A$ prepares a state $|\psi_{out}\rangle$;
repeating the Clifford stabilizer $g_A$ measurement for the $|\psi_1\rangle$ state a threshold number of times; )
preparing a Toffoli magic state in response to determining the Clifford stabilizer $g_A$ measurements are trivial; and
applying a sequence of Clifford gates to the $|\psi_1\rangle$ state and the prepared Toffoli magic state to simulate a Toffoli gate, wherein Clifford error corrections are applied to the outputs of the sequence of Clifford gates applied to a logical input.

Clause 40. The method of clause 39, wherein:
repeating the measurement of the Clifford stabilizer $g_A$ for the $|\psi_1\rangle$ state the threshold number of times comprises repeating the measurement such that the Clifford stabilizer $g_A$ is measured a number of times equal to (d−1)/2, wherein d is a code distance of the one of the fault tolerant computational basis states.

Clause 41. The method of clause 40, wherein error detection is performed between respective measurements of the Clifford stabilizer $g_A$.

Clause 42. The method of clause 41, further comprising:
growing the Toffoli magic state from a first code distance to a second code distance, wherein the STOP algorithm is used to measure stabilizers and minimum weight perfect matching (MWPM) is applied to a measured syndrome history generated from measuring the stabilizers to correct for errors.

Clause 43. The method of clause 34, wherein the arbitrary Calderbank-Shor-Steane code and the ancilla are implemented using a system comprising:
mechanical linear resonators; and
a control circuit coupled with the mechanical linear resonators,
wherein the control circuit is configured to stabilize an arbitrary coherent state superposition (cat state) of the mechanical linear resonators to store quantum information of the Calderbank-Shor-Steane code, wherein to stabilize the arbitrary cat-state, the control circuit is configured to:
excited phonons in the mechanical linear resonators by driving respective storage modes of the mechanical linear resonators; and
dissipate phonons from the mechanical linear resonators via an open transmission line coupled to the control circuit configured to absorb photons from a dump mode of the control circuit.

Clause 44. The method of clause 43, wherein the control circuit comprises:
an asymmetrically-threaded superconducting quantum interference device (ATS) coupled with the mechanical linear resonators.

Clause 45. A system comprising:
mechanical resonators; and
a control circuit coupled with the mechanical resonators, wherein the control circuit is configured to stabilize arbitrary coherent state superpositions (cat states) of the mechanical resonators to store quantum information; and
one or more computing devices storing program instructions, that when executed cause the control circuit to perform:
measuring syndrome outcomes of an ancilla qubit for one or more qubits storing the quantum information, wherein the ancilla qubit and the one or more qubits storing the quantum information are implemented via one or more of the mechanical resonators;
tracking consecutive ones of the measured syndrome outcomes;
computing a minimum number of faults capable of causing a tracked sequence of consecutive syndrome outcomes;
stopping the measuring of the syndrome outcomes if either of the following conditions is met:
1) a same syndrome outcome is repeated a threshold number of times in a row, wherein the threshold is equal to one plus a difference between:
a code distance of the one or more qubits storing quantum information minus one wherein the result of the subtraction is divided by two; and
a currently computed minimum number of faults capable of causing the tracked sequence of consecutive syndrome outcomes; or
2) the currently computed minimum number of faults capable of causing the tracked sequence of consecutive syndromes is equal to the code distance minus one wherein the result of the subtraction is divided by two, and wherein one additional round of syndrome measurements is performed subsequently; and
utilizing the repeated syndrome if condition 1 is met or utilizing the syndrome outcome for the subsequently performed syndrome measurement if condition 2 is met, wherein the utilized syndrome outcome is utilized to error correct the stored quantum information.

Clause 46. The system of clause 45, wherein the one or more computing devices are further configured to implement:
preparing computational basis states in a fault tolerant manner by applying a STOP algorithm to the fault-tolerant computational basis states to determine when syndrome measurements of stabilizers of a repetition code for the computational basis states can be stopped such that a probability of faults for the computational basis states are below a threshold level,
wherein:
applying the STOP algorithm comprises performing said measuring syndrome outcomes, said tracking consecutive ones of the measure outcomes, said computing a minimum number of faults, said stopping the measuring if condition 1 or condition 2 is met, and said error correction.

Clause 47. The system of clause 45, wherein the one or more computing devices are further configured to implement:
transversally applying a CNOT gate to the prepared computational basis states to prepare a $|\psi_1\rangle$ state;

measuring a Clifford stabilizer $g_A$ for the $|\psi_1\rangle$ state, and applying a logical Z correction if the measurement outcome for the Clifford stabilizer $g_A$ is −1, wherein measuring the Clifford stabilizer $g_A$ and applying the logical Z correction based on a measurement outcome of the Clifford stabilizer $g_A$ prepares a state $|\psi_{out}\rangle$;

repeating the Clifford stabilizer $g_A$ measurement for the $|\psi_1\rangle$ state a threshold number of times;

preparing a Toffoli magic state in response to determining the Clifford stabilizer $g_A$ measurements are trivial; and applying a sequence of Clifford gates to a logical input state $|\psi\rangle_L$ and the prepared Toffoli magic state to simulate the Toffoli gate, wherein Clifford error corrections are applied to the outputs of the sequence of Clifford gates applied to the logical inputs.

Clause 48. The system of clause 47, wherein the one or more computing devices are further configured to implement:

growing the Toffoli magic state from a first code distance to a second code distance, wherein the STOP algorithm is used to measure stabilizers and minimum weight perfect matching (MWPM) is applied to a measured syndrome history generated from measuring the stabilizers to correct for errors.

Clause 49. A method of simulating a cat qubit, the method comprising:

defining basis states for the cat qubit;

orthonormalizing the defined basis states to construct 2d orthonormalized shifted Fock basis states for the cat qubit; and determining matrix elements of an operator in the orthonormalized shifted Fock basis states.

Clause 50. The method of clause 49, wherein the defined basis states, before performing the orthonormalization, are defined such that the defined basis states are grouped into even and odd branches.

Clause 51. The method of clause 50, wherein, in a ground state, normalized versions of the defined basis states are equivalent to complementary basis states of the cat qubit expressed as $|+\rangle$ or $|-\rangle$ instead of computational basis states expressed as $|0\rangle$ or $|1\rangle$.

Clause 52. The method of clause 51, wherein the defined basis states in different parity sectors are orthogonal to one another such that the orthonormalization is performed separately in the respective parity sectors.

Clause 53. The method of clause 49, further comprising:

applying the determined matrix elements of the operator to simulate the cat-qubit in the 2d orthonormalized shifted Fock basis states.

Clause 54. The method of clause 49, wherein the cat qubit being simulated is a hybrid acoustic-electrical qubit implemented using a linear mechanical resonator.

Clause 55. The method of clause 49, wherein the cat qubit being simulated is implemented using an electromagnetic resonator.

Clause 56. One or more non-transitory computer-readable media storing program instructions, that when executed on or across one or more processors, cause the one or more processors to:

define basis states for a cat qubit to be simulated;

orthonormalize the defined basis states to construct 2d orthonormalized shifted Fock basis states for the cat qubit; and determine matrix elements of an operator in the orthonormalized basis states.

Clause 57. The one or more non-transitory computer-readable media of clause 56, wherein the program instructions, when executed on or across the one or more processors, further cause the one or more processors to:

apply the determined matrix elements of the operator to simulate the cat-qubit in the 2d orthonormalized shifted Fock basis states.

Clause 58. The one or more non-transitory computer-readable media of clause 56, wherein the defined basis states, before performing the orthonormalization, are defined such that the defined basis states are grouped into even and odd branches.

Clause 59. The one or more non-transitory computer-readable media of clause 56, wherein, in a ground state, normalized versions of the defined basis states are equivalent to complementary basis states of the cat qubit expressed as $|+\rangle$ or $|-\rangle$ instead of computational basis states expressed as $|0\rangle$ or $|1\rangle$.

Clause 60. The one or more non-transitory computer-readable media of clause 56, wherein the defined basis states are orthogonal to one another such that the orthonormalization is performed separately in respective parity sectors.

Clause 61. A system, comprising:

a memory storing program instructions; and one or more processors, wherein the program instructions, when executed on or across the one or more processors cause the one or more processors to:

define basis states for a cat qubit to be simulated;

orthonormalize the defined basis states to construct 2d orthonormalized shifted Fock basis states for the cat qubit; and determine matrix elements of an operator in the orthonormalized basis states.

Clause 62. The system of clause 61, wherein the program instructions, when executed on or across the one or more processors, further cause the one or more processors to: apply the determined matrix elements of the operator to simulate the cat-qubit in the 2d orthonormalized shifted Fock basis states.

Clause 63. The system of clause 61, wherein the defined basis states, before performing the orthonormalization, are defined such that the defined basis states are grouped into even and odd branches.

Clause 64. The system of clause 61, wherein, in a ground state, normalized versions of the defined basis states are equivalent to complementary basis states of the cat qubit expressed as $|+\rangle$ or $|-\rangle$ instead of computational basis states expressed as $|0\rangle$ or $|1\rangle$.

Clause 65. The system of clause 61, wherein the defined basis states are orthogonal to one another such that the orthonormalization is performed separately in respective parity sectors.

Clause 66. The system of clause 61, wherein the cat qubit to be simulated is implemented using mechanical resonators.

Clause 67. The system of clause 61, wherein the cat qubit to be simulated is implemented using electromagnetic resonators.

Clause 68. The system of clause 61, wherein the cat qubit to be simulated is implemented in as system comprising one or more mechanical resonators and one or more electromagnetic resonators.

Clause 69. A method of measuring an ancilla qubit in a context of error correction of stored quantum information, wherein a set of one or more error correction gates are applied between one or more data qubits storing the quantum information and the ancilla qubit to entangle the ancilla qubit with the one or more data qubits, the method comprising:
  transferring an excitation of the ancilla qubit to an additional readout qubit using a SWAP gate or other sequence of one or more gates that perform a swap function;
  performing one or more measurements of the readout qubit; and
  applying another set of one or more error correction gates between the one or more data qubits storing the quantum information and the ancilla qubit concurrently with performing at least some of the one or more measurements of the readout qubit.

Clause 70. The method of clause 69, wherein the data qubits, the ancilla qubit, and the readout qubit are implemented using mechanical resonators.

Clause 71. The method of clause 70, wherein the swap gate is mediated by an asymmetrically threaded superconducting quantum interference device (ATS).

Clause 72. The method of clause 69, wherein the data qubits, the ancilla qubit, and the readout qubit are implemented using bosonic modes.

Clause 73. The method of clause 69, wherein an amount of time during which the one or more data qubits idle while performing the swap gate is less than an amount of time required to perform the one or more measurements of the readout qubit.

Clause 74. The method of clause 73, wherein the one or more measurements of the readout qubit:
  comprise a plurality of repeated measurements taken subsequent to performing the swap gate or other gates that perform the swap function; and
  are repeated up until an approximate time when a swap gate operation is performed for a next round of error correction, wherein the swap gate operation of the next round of error correction is performed subsequent to applying the other set of one or more error correction gates.

Clause 75. The method of clause 74, wherein the plurality of repeated measurements of the readout qubit comprise repeated QND (quantum non demolition) parity measurements of the readout qubit.

Clause 76 The method of clause 73, wherein the readout qubit is a higher mode of an ancilla oscillator for the ancilla qubit.

Clause 77. The method of clause 76, wherein the ancilla oscillator is a $\lambda/2$ oscillator, and wherein the readout qubit has a mode that is twice a base mode of the ancilla oscillator.

Clause 78. A method of measuring a bosonic qubit wherein a measurement outcome is affected by a single photon loss event, the method comprising:
  deflating the bosonic qubit, prior to performing a readout of the bosonic qubit, such that phonons or photons are dissipated from the bosonic qubit while a measurement observable of the bosonic qubit is preserved; and
  performing, subsequent to the deflating, a readout of the measurement observable of the deflated bosonic qubit.

Clause 79. The method of clause 78, wherein deflating the bosonic qubit comprises: changing a dissipater parameter such that an average photon number or average phonon number of the bosonic qubit ($\alpha$) is reduced from an $\alpha_{initial}$ value to an $\alpha_{final}$ value, wherein $|\alpha_{final}|<|\alpha_{initial}|$.

Clause 80. The method of clause 78, wherein:
  deflating the bosonic qubit comprises varying a steady state of a two-photon dissipation process for the bosonic qubit; and
  performing the readout of the measurement observable of the deflated bosonic qubit comprises performing a parity readout of the deflated bosonic qubit.

Clause 81. The method of clause 78, wherein the bosonic qubit is implemented using a system comprising:
  mechanical resonators; and
  a control circuit coupled with the mechanical resonators, wherein the control circuit is configured to stabilize an arbitrary coherent state superposition (cat state) of the mechanical resonators to store quantum information, wherein to stabilize the arbitrary cat-state, the control circuit is configured to:
    excite phonons in the mechanical resonators by driving respective storage modes of the mechanical resonators; and
    dissipate phonons via an open transmission line coupled to the control circuit configured to absorb photons from a dump mode of the control circuit.

Clause 82. The method of clause 81, wherein the control circuit comprises:
  an asymmetrically-threaded superconducting quantum interference device (ATS) coupled with the mechanical resonators, and
  wherein deflating the bosonic qubit comprises changing a steady state of a two photon dissipation controlled by the ATS.

Clause 83. A method of performing a measurement of a first mode (a) representing quantum information stored in a cat qubit, the method comprising:
  deflating the cat qubit such that an even number of phonons or photons are dissipated from the cat qubit;
  evolving the cat qubit under a Hamiltonian that couples a number of excitations of the cat qubit to a change in a measurable property of another mode (b); and
  measuring the other mode (b).

Clause 84. The method of clause 83, wherein:
  the measurement is a determination of a parity of the cat qubit;
  deflating the cat qubit comprises deflating the cat qubit such that an average photon number or average phonon number of the cat qubit ($\alpha$) is reduced to zero, wherein an even cat state is mapped to $|0\rangle$ and an odd cat state is mapped to $|1\rangle$;
  the Hamiltonian is selected from a three or higher wave mixing Hamiltonian that correlates phonon number or photon number to a change of the other mode (b); and
  measuring the other mode (b) using homodyne, heterodyne, or photo detection.

Clause 85. The method of clause 83, wherein the Hamiltonian selected from the three or higher wave mixing Hamiltonian comprises $ig(b^{\dagger}-b)a^{\dagger}a$.

Clause 86. The method of clause 83, wherein the Hamiltonian selected from the three or higher wave mixing Hamiltonian comprises $g(b^{\dagger}+b)a^{\dagger}a$.

Clause 87. The method of clause 83, wherein the Hamiltonian selected from the three or higher wave mixing Hamiltonian comprises a product of $a^{\dagger}a$ with a term that affects the other mode (b) in a measureable way.

Clause 88. The method of clause 83, wherein:
  the cat qubit is implemented via a mechanical resonator;
  the other mode (b) is a dump mode; and
  the Hamiltonian is selected from a three or higher wave mixing Hamiltonian that correlates the average phonon number or the average photon number to a change of the other mode (b), wherein the three wave mixing is mediated by an ATS.

Clause 89. A method of performing a measurement of quantum information in a cat qubit, the method comprising:
  evolving under a Hamiltonian which couples the phase of a of the cat qubit (an "a" mode) to a measurable property of another bosonic mode (a "b" mode) wherein the Hamiltonian is achieved via a three wave or higher mixing Hamiltonian; and
  performing homodyne, heterodyne, or photo detection of the "b" mode to determine a state of the "a" mode,
wherein the cat qubit is implemented using a system comprising:
  mechanical resonators; and
  a control circuit comprising an asymmetrically-threaded superconducting quantum interference device (ATS) coupled with the mechanical resonators,
  wherein the control circuit is configured to stabilize an arbitrary coherent state superposition (cat state) of the mechanical resonators to store quantum information, wherein to stabilize the arbitrary cat-state, the control circuit is configured to:
    excite phonons in the mechanical resonators by driving respective storage modes of the mechanical resonators; and
    dissipate phonons via an open transmission line coupled to the control circuit configured to absorb photons from a dump mode of the control circuit.

Clause 90. The method of clause 81, wherein:
  the Hamiltonian is derived from a three wave mixing Hamiltonian mediated by an ATS;
  the "a" mode is implemented via a mechanical storage resonator; and
  the "b" mode is implemented via an electromagnetic resonator.

Figure 39:
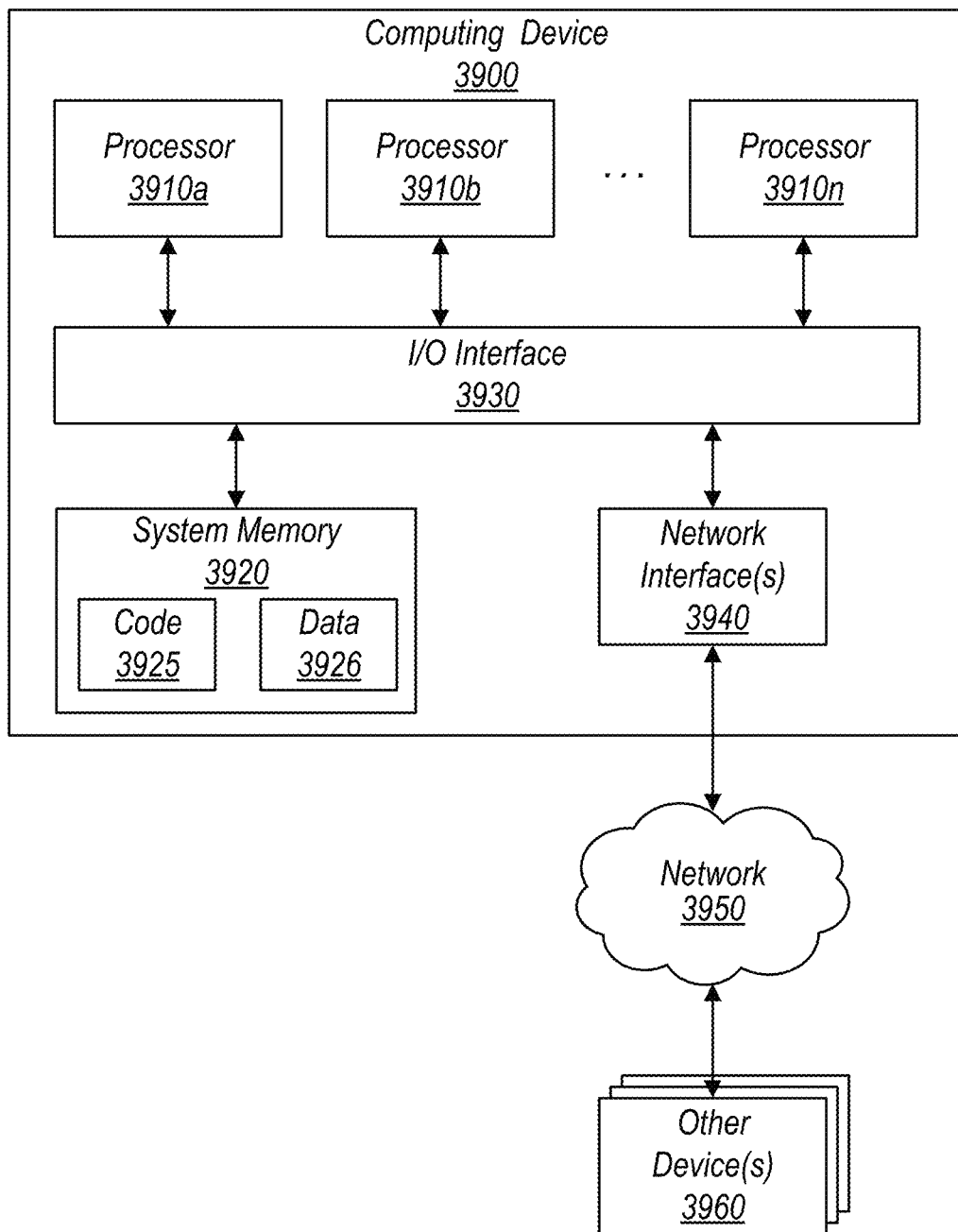
FIG. 39 is a block diagram illustrating an example computing device that may be used in at least some embodiments.

Clause 91. The method of clause 82, wherein a Hamiltonian for the readout comprises:

$g(a+a^\dagger)(b+b^\dagger);$ $ig(a+a^\dagger)(b-b^\dagger);$ or $g(ab^\dagger+a^\dagger b).$ Illustrative Computer System FIG. 39 is a block diagram illustrating an example computing device that may be used in at least some embodiments.

FIG. 39 illustrates such a general-purpose computing device 3900 as may be used in any of the embodiments described herein. In the illustrated embodiment, computing device 3900 includes one or more processors 3910 coupled to a system memory 3920 (which may comprise both non-volatile and volatile memory modules) via an input/output (I/O) interface 3930. Computing device 3900 further includes a network interface 3940 coupled to I/O interface 3930.

In various embodiments, computing device 3900 may be a uniprocessor system including one processor 3910, or a multiprocessor system including several processors 3910 (e.g., two, four, eight, or another suitable number). Processors 3910 may be any suitable processors capable of executing instructions. For example, in various embodiments, processors 3910 may be general-purpose or embedded processors implementing any of a variety of instruction set architectures (ISAs), such as the x86, PowerPC, SPARC, or MIPS ISAs, or any other suitable ISA. In multiprocessor systems, each of processors 3910 may commonly, but not necessarily, implement the same ISA. In some implementations, graphics processing units (GPUs) may be used instead of, or in addition to, conventional processors.

System memory 3920 may be configured to store instructions and data accessible by processor(s) 3910. In at least some embodiments, the system memory 3920 may comprise both volatile and non-volatile portions; in other embodiments, only volatile memory may be used. In various embodiments, the volatile portion of system memory 3920 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 3920 as code 3925 and data 3926.

In some embodiments, I/O interface 3930 may be configured to coordinate I/O traffic between processor 3910, system memory 3920, and any peripheral devices in the device, including network interface 3940 or other peripheral interfaces such as various types of persistent and/or volatile storage devices. In some embodiments, I/O interface 3930 may perform any necessary protocol, timing or other data transformations to convert data signals from one component (e.g., system memory 3920) into a format suitable for use by another component (e.g., processor 3910). In some embodiments, I/O interface 3930 may include support for devices attached through various types of peripheral buses, such as a variant of the Peripheral Component Interconnect (PCI) bus standard or the Universal Serial Bus (USB) standard, for example. In some embodiments, the function of I/O interface 3930 may be split into two or more separate components, such as a north bridge and a south bridge, for example. Also, in some embodiments some or all of the functionality of I/O interface 3930, such as an interface to system memory 3920, may be incorporated directly into processor 3910.

Network interface 3940 may be configured to allow data to be exchanged between computing device 3900 and other devices 3960 attached to a network or networks 3950, such as other computer systems or devices. In various embodiments, network interface 3940 may support communication via any suitable wired or wireless general data networks, such as types of Ethernet network, for example. Additionally, network interface 3940 may support communication via telecommunications/telephony networks such as analog voice networks or digital fiber communications networks, via storage area networks such as Fibre Channel SANs, or via any other suitable type of network and/or protocol.

In some embodiments, system memory 3920 may represent one embodiment of a computer-accessible medium configured to store at least a subset of program instructions and data used for implementing the methods and apparatus discussed in the context of FIG. 1 through FIG. 38. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 3900 via I/O interface 3930. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 3900 as system memory 3920 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 3940. Portions or all of multiple computing devices such as that illustrated in FIG. 39 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A method of preparing a Toffoli gate, implemented in a quantum computer, for use in quantum computing, the method comprising:
    preparing a plurality of Toffoli magic states, wherein computational basis states used in preparing the Toffoli magic states are encoded using a repetition code;
    distilling the Toffoli gate from two or more of the prepared Toffoli magic states, wherein distilling the Toffoli gate comprises preparing a check qubit associated with the Toffoli gate, wherein the check qubit indicates whether an error is present in the distilled Toffoli gate; and
    in response to verifying the check qubit does not indicate an error, utilizing the distilled Toffoli gate to perform a logical Toffoli gate operation.

2. The method of claim 1, wherein distilling the Toffoli gate from the two or more of the prepared Toffoli magic states, comprises:
    performing a plurality of rounds of lattice surgery operations between qubits of a selected set of the plurality of Toffoli magic states and qubits of the distilled Toffoli gate; and
    wherein each of the rounds of lattice surgery acts on at least one of the check qubits associated with the distilled Toffoli gate.

3. The method of claim 1, wherein the distilled Toffoli gate has a fault rate of less than $1 \times 10^{-6}$.

4. The method of claim 1, wherein the distilled Toffoli gate is distilled using 8 of the Toffoli magic states.

5. The method of claim 4, wherein the distilled Toffoli gate and another distilled Toffoli gate have a probability of error that is less than a highest probability of error of the respective ones of the 8 Toffoli magic states reduced by a power of two.

6. The method of claim 1, wherein the distilled Toffoli gate is distilled using 2 of the Toffoli magic states.

7. The method of claim 6, wherein the distilled Toffoli gate has an error probability that is reduced by a power of two as compared to respective error rates of the 2 Toffoli magic states, when the 2 Toffoli magic states have highly biased noise.

8. The method of claim 1, wherein the distilled Toffoli gate is distilled using 8 of the Toffoli magic states, and
    wherein the distilled Toffoli gate has an error probability that is reduced by a power of three as compared to error rates of respective ones of the 8 Toffoli magic states, when the 8 Toffoli magic states have highly biased noise.

9. The method of claim 1, wherein a single round of distillation is performed to distill the Toffoli magic state, and wherein the single round of distillation comprises performing a plurality of lattice surgery operations.

10. The method of claim 1, wherein the Toffoli magic states and the distilled Toffoli gate are implemented in the quantum computer, the quantum computer comprising:
    mechanical linear resonators; and
    one or more control circuits coupled with the mechanical linear resonators,
    wherein the one or more control circuits are configured to stabilize an arbitrary coherent state superposition (cat state) of the mechanical resonators to store quantum information of the Toffoli magic states and the distilled Toffoli gate, wherein to stabilize the arbitrary cat-state, the one or more control circuits are configured to:
        excite phonons in the mechanical resonators by driving respective storage modes of the mechanical resonators; and
        dissipate phonons from the mechanical resonators via one or more respective open transmission lines of the one or more control circuits coupled to the mechanical resonators, wherein the open transmission line is configured to absorb photons from the respective one or more control circuits.

11. A system comprising:
    mechanical resonators; and
    one or more control circuits coupled with the mechanical resonators, wherein the one or more control circuits are configured to stabilize arbitrary coherent state superpositions (cat states) of the mechanical resonators to store quantum information; and one or more computing devices storing program instructions, that when executed cause the one or more control circuits to perform:

preparing a plurality of Toffoli magic states;

distilling a Toffoli gate from two or more of the prepared Toffoli magic states, wherein distilling the Toffoli gate comprises preparing a check qubit associated with the Toffoli gate, wherein the check qubit indicates whether an error is present in the distilled Toffoli gate; and in response to verifying the check qubit does not indicate an error, utilizing the distilled Toffoli gate to perform a logical Toffoli gate operation.

12. The system of claim 11, wherein the distilled Toffoli gate and another distilled Toffoli gate comprise two distilled Toffoli gates that are distilled using 8 of the Toffoli magic states.

13. The system of claim 12, wherein the distilled Toffoli gate and the other distilled Toffoli gate have a probability of error that is less than a highest probability of error of the respective ones of the 8 Toffoli magic states reduced by a power of two.

14. The system of claim 11, wherein the distilled Toffoli gate is distilled using 2 of the Toffoli magic states.

15. The system of claim 14, wherein the distilled Toffoli gate has an error probability that is reduced by a power of two as compared to respective error rates of the 2 Toffoli magic states, when the 2 Toffoli magic states have highly biased noise.

16. The system of claim 11, wherein the distilled Toffoli gate is distilled using 8 of the Toffoli magic states, and wherein the distilled Toffoli gate has an error probability that is reduced by a power of three as compared to error rates of respective ones of the 8 Toffoli magic states, when the 8 Toffoli magic states have highly biased noise.

17. The system of claim 11, wherein the plurality of Toffoli magic states used as inputs are stabilized using a STOP algorithm wherein to apply the STOP algorithm, the one or more computing devices are configured to implement:

tracking consecutive syndrome outcomes;

computing a minimum number of faults capable of causing a tracked sequence of consecutive syndrome outcomes;

stopping the STOP algorithm if either of the following conditions is met:
1. A same syndrome outcome is repeated a threshold number of times in a row, wherein the threshold is equal to one plus a difference between:
   a code distance of one fault-tolerant computational basis states of a set of fault-tolerant computational basis states used in preparing the Toffoli magic states minus one wherein the result of the subtraction is divided by two; and
   a currently computed minimum number of faults capable of causing the tracked sequence of consecutive syndrome outcomes; or
2) the currently computed minimum number of faults capable of causing the tracked sequence of consecutive syndromes is equal to the code distance of the one of the fault-tolerant computational basis states minus one wherein the result of the subtraction is divided by two, and wherein one additional round of syndrome measurements is performed subsequently; and utilizing the repeated syndrome if condition 1 is met or utilizing the syndrome for the subsequently performed syndrome measurement if condition 2 is met, wherein the utilized syndrome is utilized to error correct the one of the fault-tolerant computational basis states.

18. The system of claim 11, wherein respective ones of the one or more control circuits comprise:

an asymmetrically-threaded superconducting quantum interference device (ATS) coupled with respective ones of the mechanical resonators.

19. A method of distilling a logical Toffoli gate, implemented in a quantum computer, from a plurality of Toffoli magic states, the method comprising:

performing a plurality of rounds of lattice surgery operations between qubits of a selected set of the plurality of Toffoli magic states and qubits for a distilled Toffoli gate; and wherein each of the rounds of lattice surgery acts on at least one of the check qubits associated with the distilled Toffoli gate.

20. The method of claim 19, wherein the distilled Toffoli gate is distilled using 8 of the Toffoli magic states; and the distilled Toffoli gate has a probability of error that is less than a highest probability of error of the respective ones of the 8 Toffoli magic states reduced by a power of two.

* * * * *